United States Patent
Yamazaki et al.

(10) Patent No.: US 9,859,444 B2
(45) Date of Patent: *Jan. 2, 2018

(54) SEMICONDUCTOR DEVICE, DISPLAY DEVICE, INPUT/OUTPUT DEVICE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Hideomi Suzawa, Kanagawa (JP); Masami Jintyou, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,433

(22) Filed: Apr. 18, 2017

(65) Prior Publication Data

US 2017/0222057 A1    Aug. 3, 2017

Related U.S. Application Data

(63) Continuation of application No. 14/639,427, filed on Mar. 5, 2015, now Pat. No. 9,634,150.

(30) Foreign Application Priority Data

Mar. 7, 2014    (JP) .................................. 2014-045365

(51) Int. Cl.
    *H01L 29/10*     (2006.01)
    *H01L 29/786*    (2006.01)
    (Continued)

(52) U.S. Cl.
    CPC ...... *H01L 29/7869* (2013.01); *H01L 27/1225* (2013.01); *H01L 29/42364* (2013.01);
    (Continued)

(58) Field of Classification Search
    CPC ........... H01L 29/7869; H01L 29/78606; H01L 29/42384; H01L 29/24; H01L 27/1225
    (Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1 737 044 A1    12/2006
EP    2 226 847 A2     9/2010
(Continued)

OTHER PUBLICATIONS

Yang, J-Y. et al., "A New Process and Structure for Oxide Semiconductor LCDs," SID Digest '14: SID International Symposium Digest of Technical Papers, Jun. 3, 2014, pp. 469-472.
(Continued)

*Primary Examiner* — Brook Kebede
(74) *Attorney, Agent, or Firm* — Husch Blackwell LLP

(57) ABSTRACT

A self-aligned transistor including an oxide semiconductor film, which has excellent and stable electrical characteristics, is provided. A semiconductor device is provided with a transistor that includes an oxide semiconductor film, a gate electrode overlapping with part of the oxide semiconductor film, and a gate insulating film between the oxide semiconductor film and the gate electrode. The oxide semiconductor film includes a first region and second regions between which the first region is positioned. The second regions include an impurity element. A side of the gate insulating film has a depressed region. Part of the gate electrode overlaps with parts of the second regions in the oxide semiconductor film.

29 Claims, 37 Drawing Sheets

(51) Int. Cl.
  *H01L 29/49* (2006.01)
  *H01L 29/423* (2006.01)
  *H01L 27/12* (2006.01)
  *H01L 29/66* (2006.01)

(52) U.S. Cl.
  CPC .... *H01L 29/4908* (2013.01); *H01L 29/66969* (2013.01); *H01L 29/78696* (2013.01)

(58) Field of Classification Search
  USPC .................. 257/43, 57, 66; 438/149–159
  See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,003,981 B2 | 8/2011 | Iwasaki et al. |
| 8,164,090 B2 | 4/2012 | Iwasaki et al. |
| 8,344,374 B2 | 1/2013 | Yamazaki et al. |
| 8,384,076 B2 | 2/2013 | Park et al. |
| 8,624,240 B2 | 1/2014 | Sato et al. |
| 8,796,681 B2 | 8/2014 | Yamade et al. |
| 8,835,918 B2 | 9/2014 | Yamazaki et al. |
| 8,883,556 B2 | 11/2014 | Yamazaki |
| 8,941,113 B2 * | 1/2015 | Takeuchi ................ H01L 29/04 257/213 |
| 9,634,150 B2 * | 4/2017 | Yamazaki ........... H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0079778 A1 | 4/2011 | Yamazaki et al. |
| 2011/0084267 A1 | 4/2011 | Yamazaki et al. |
| 2011/0240998 A1 | 10/2011 | Morosawa et al. |
| 2012/0315730 A1 * | 12/2012 | Koezuka ............. H01L 29/7869 438/158 |
| 2012/0315735 A1 | 12/2012 | Koezuka et al. |
| 2013/0069054 A1 | 3/2013 | Isobe et al. |
| 2013/0069055 A1 | 3/2013 | Yamazaki et al. |
| 2014/0001468 A1 | 1/2014 | Yamazaki et al. |
| 2015/0162452 A1 | 6/2015 | Koezuka et al. |

FOREIGN PATENT DOCUMENTS

| | | | |
|---|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220817 A | 8/2007 |

(56) References Cited

FOREIGN PATENT DOCUMENTS

| JP | 2007-220818 A | 8/2007 |
|---|---|---|
| JP | 2007-250983 A | 9/2007 |
| JP | 2009-278115 A | 11/2009 |
| JP | 2011-228622 A | 11/2011 |
| JP | 2012-033836 A | 2/2012 |
| WO | WO 2004/114391 A1 | 12/2004 |

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al,, "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AMOLED Driven by PEALD Grown ZNO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 ; Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka,N et al., "SPINEL, YbFe2O4, and Yb2Fe3O7 Types of Structures for Compounds in the In2O3 and Sc2O3—A2O2—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A) , May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No, 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner initial state($V_oH$)

$V_oH$ final state($V_o$, H-O)

$V_o$ — bonded to O initial state($V_oH$)

final state($V_o$, H–O)

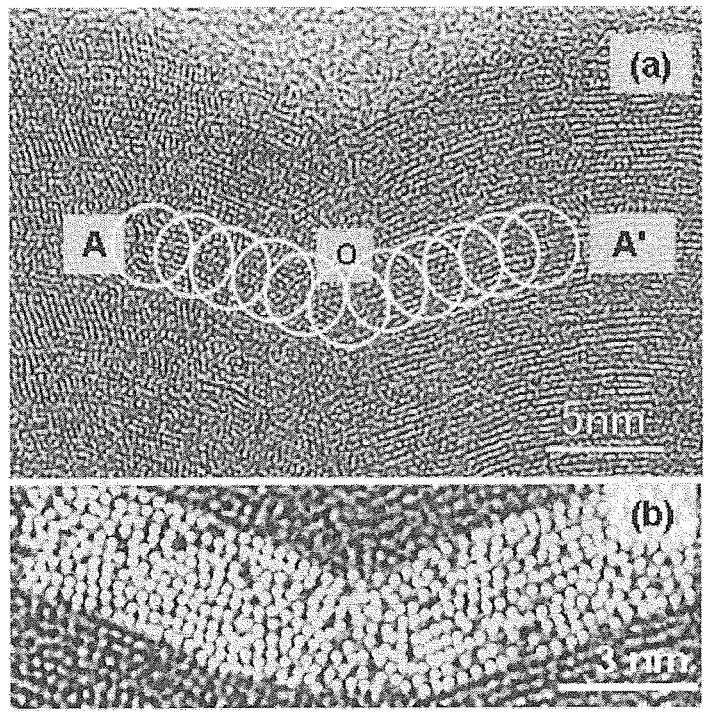
FIG. 19A
FIG. 19B
FIG. 19C
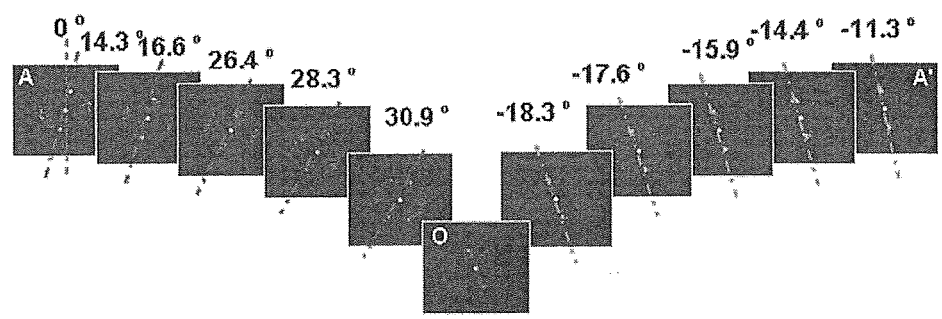

CAAC-OS nc-OS as-sputtered heat treatment at 450°C

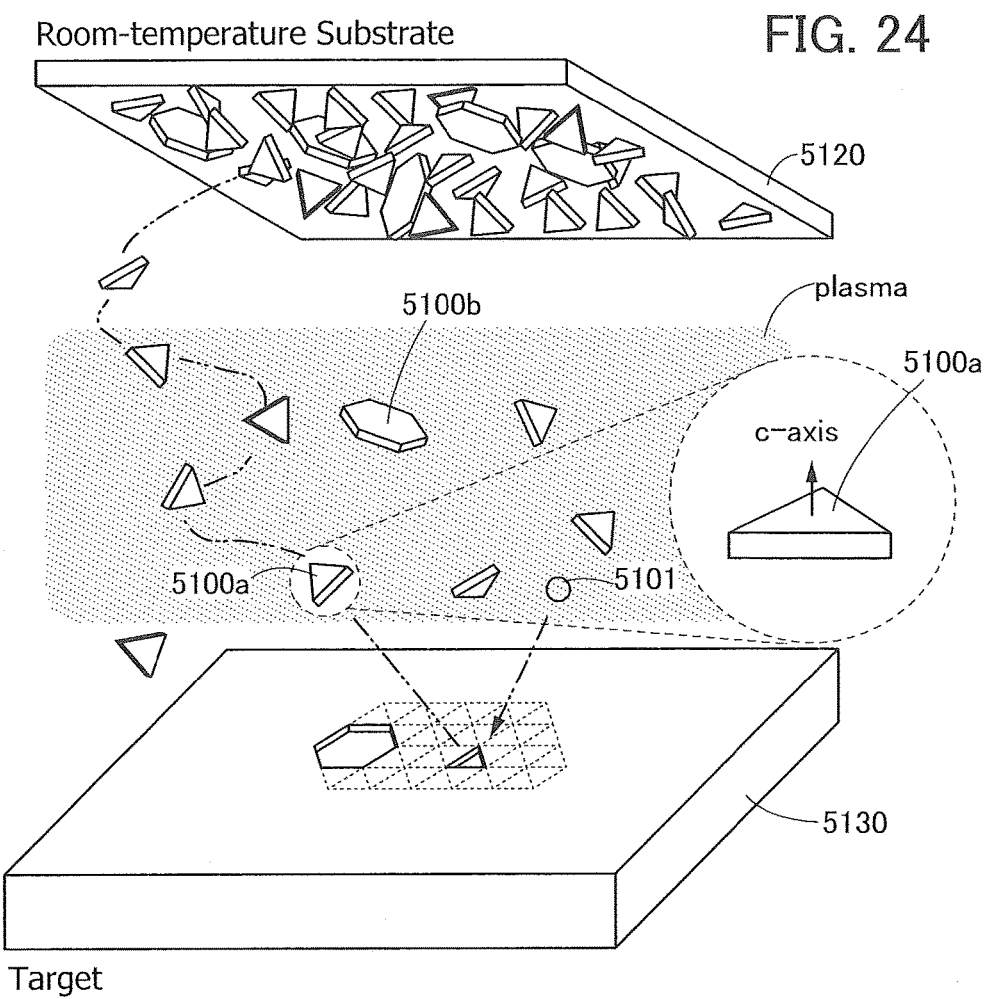

InGaZnO₄

FIG. 30A
FIG. 30B
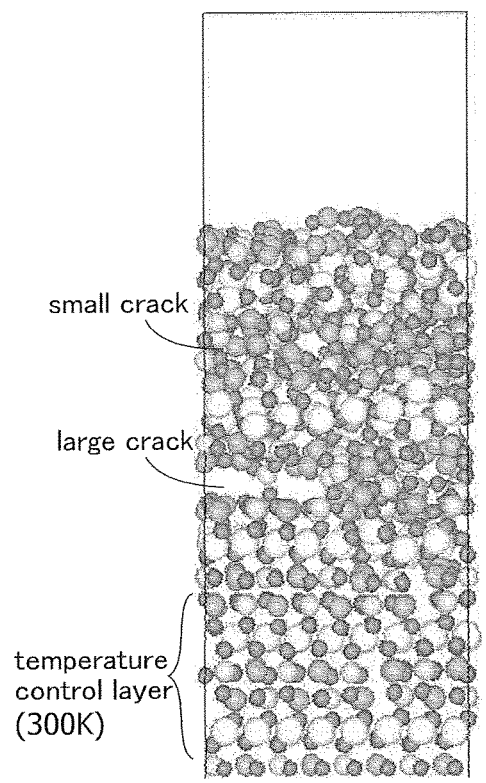
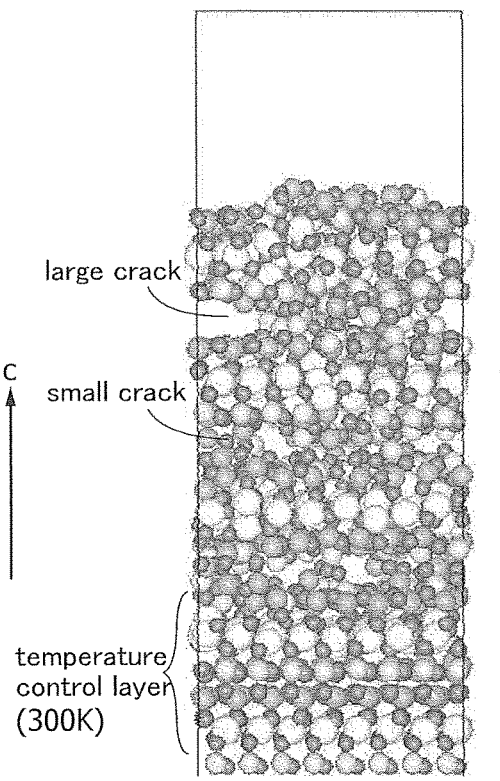
100 psec passed after entry of argon
100 psec passed after entry of oxygen
In : ○  Ga : ○  Zn : ○  O : ●

Zn in third layer (Zn-O layer) reaching vicinity of sixth layer (Zn-O layer)

Zn in third layer (Zn-O layer) not reaching fifth layer (In-O layer)

1 nm 1 nm

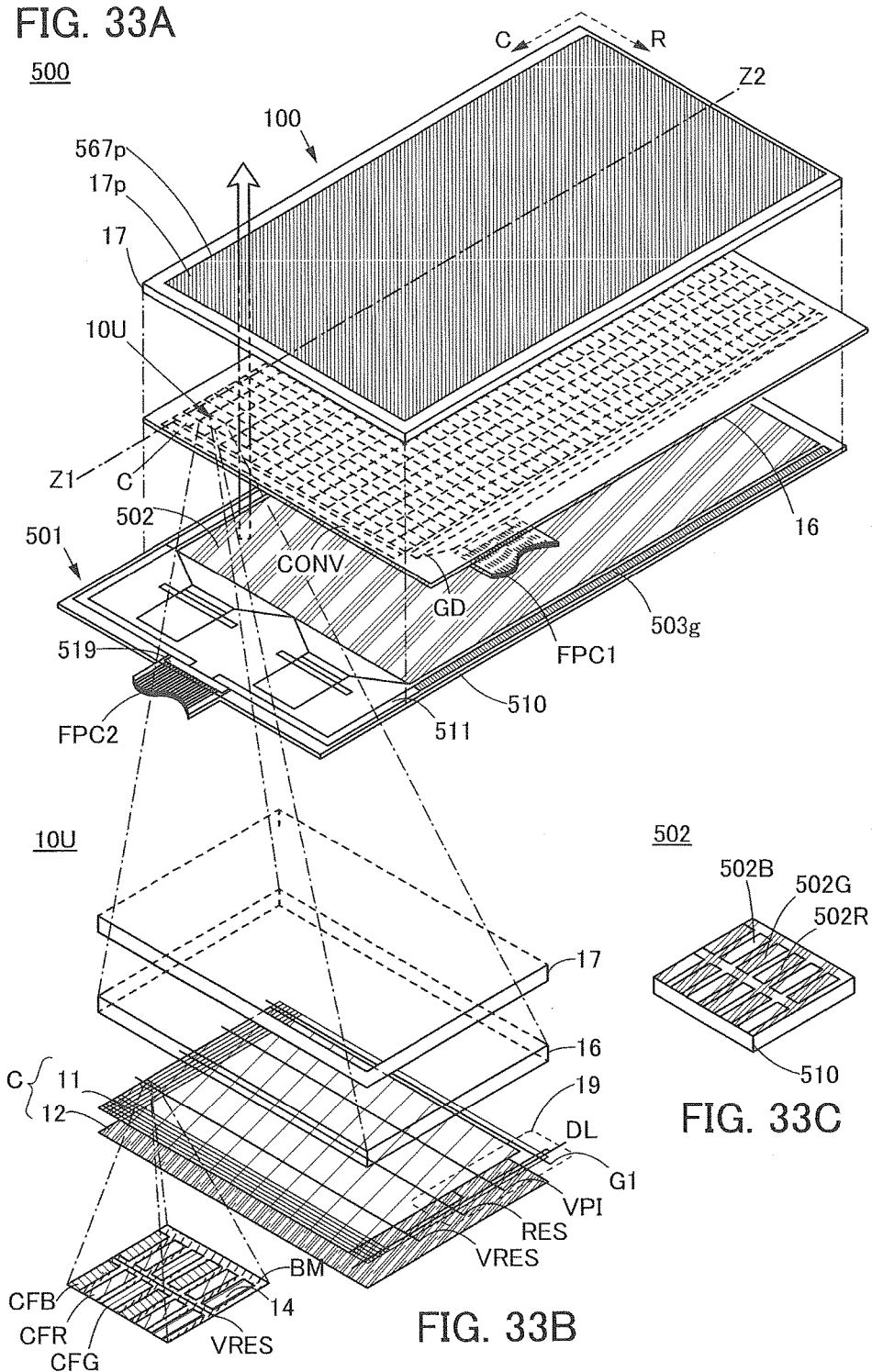

FIG. 35A
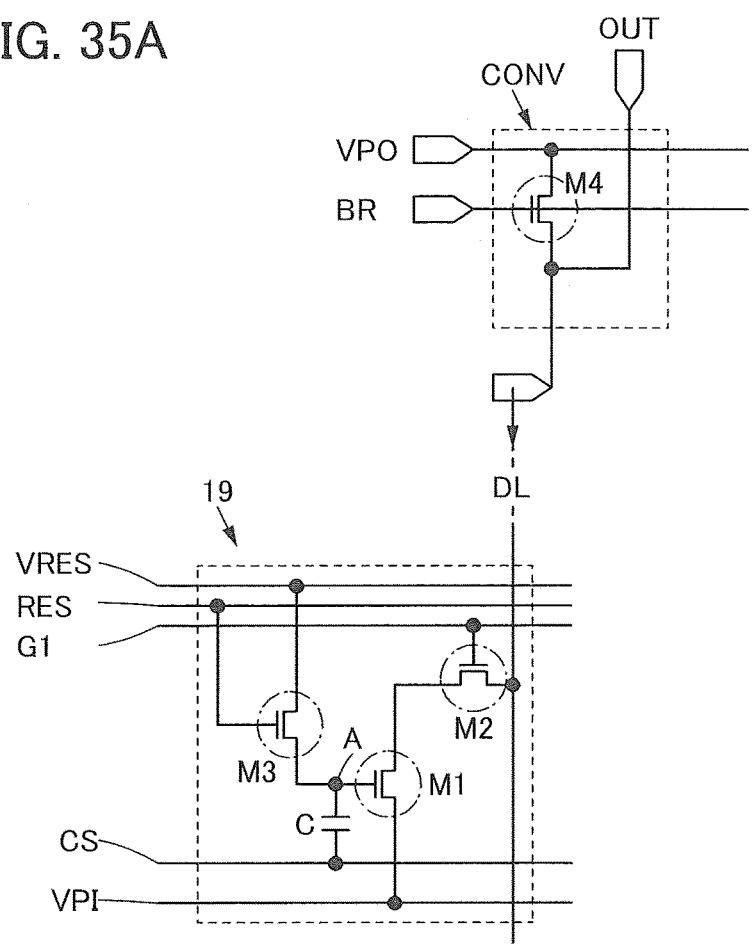
FIG. 35B1
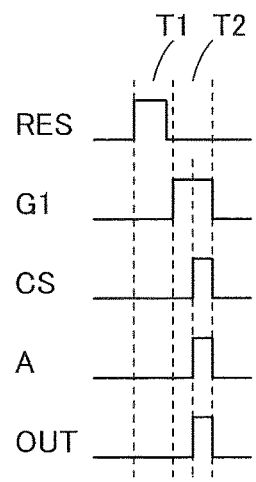
FIG. 35B2
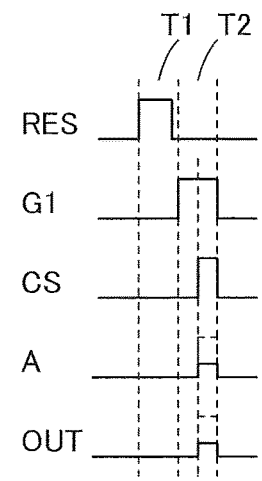

SEMICONDUCTOR DEVICE, DISPLAY DEVICE, INPUT/OUTPUT DEVICE, AND ELECTRONIC DEVICE

This application is a continuation of copending U.S. application Ser. No. 14/639,427, filed on Mar. 5, 2015 which is incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. Specifically, one embodiment of the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), an input/output device, and an electronic device may each include a semiconductor device.

2. Description of the Related Art

Attention has been focused on a technique for forming a transistor using a semiconductor thin film formed over a substrate having an insulating surface (also referred to as thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

A transistor including an oxide semiconductor is required to have excellent electrical characteristics for application to semiconductor devices with higher performance. For example, a transistor having a self-aligned structure, in which a gate electrode and a gate insulating film are formed over a region of an oxide semiconductor film including a channel region, and a source region and a drain region are formed in such a manner that the resistance of a region of the oxide semiconductor film that is covered with neither the gate electrode nor the gate insulating film is reduced, is reported (see, for example, Patent Document 1).

REFERENCE

Patent Document

[Patent Document 1] Japanese Published Patent Application No. 2007-220817
[Patent Document 2] Japanese Published Patent Application No. 2011-228622

SUMMARY OF THE INVENTION

In Patent Document 1, in order to form the low-resistance source region and drain region in a self-aligned manner, a silicon nitride film is formed as an interlayer insulating film by a plasma CVD method over the region of the oxide semiconductor film that is covered with neither the gate electrode nor the gate insulating film, and hydrogen contained in the silicon nitride film is introduced into the oxide semiconductor film; thus, the low-resistance regions are formed. However, in this method, hydrogen might diffuse into the channel region and it is difficult to obtain stable semiconductor characteristics.

In view of the above, an object of one embodiment of the present invention is to provide a self-aligned transistor including an oxide semiconductor film that has excellent electrical characteristics. Another object of one embodiment of the present invention is to provide a transistor having high on-state current. Another object of one embodiment of the present invention is to provide a method for manufacturing a transistor with small variations in electrical characteristics. Another object of one embodiment of the present invention is to provide a method for manufacturing a display device consuming less power. Another object of one embodiment of the present invention is to provide a novel method for manufacturing a display device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a semiconductor device provided with a transistor that includes an oxide semiconductor film, a gate electrode overlapping with part of the oxide semiconductor film, and a gate insulating film between the oxide semiconductor film and the gate electrode. The oxide semiconductor film includes a first region and second regions between which the first region is positioned. The second regions include an impurity element. A side of the gate insulating film has a depressed region. Part of the gate electrode overlaps with part of the second regions in the oxide semiconductor film.

One embodiment of the present invention is a semiconductor device provided with a transistor that includes an oxide semiconductor film, a gate electrode overlapping with part of the oxide semiconductor film, and a gate insulating film between the oxide semiconductor film and the gate electrode. The oxide semiconductor film includes a first region and second regions between which the first region is positioned. The second regions include an impurity element. In the gate insulating film, an oxide insulating film and a nitride insulating film are stacked in this order from the oxide semiconductor film side. A side of the nitride insulating film has a depressed region. Part of the gate electrode overlaps with part of the second regions in the oxide semiconductor film.

One embodiment of the present invention is a semiconductor device including a transistor. The transistor includes an oxide semiconductor film, a gate insulating film, and a gate electrode. The oxide semiconductor film includes a first region and second regions between which the first region is positioned. The second regions include an impurity element. The gate insulating film is provided between the oxide semiconductor film and the gate electrode, and has a side region that is more on the inside than at least part of a side of the gate electrode. The gate electrode has regions overlapping with the second regions in the oxide semiconductor film.

One embodiment of the present invention is a semiconductor device including a transistor. The transistor includes an oxide semiconductor film, a first insulating film, a second insulating film, and a gate electrode. The oxide semiconductor film includes a first region and second regions between which the first region is positioned. The second regions include an impurity element. The first insulating film is in contact with the oxide semiconductor film, and includes oxygen. The second insulating film is in contact with the first insulating film and the gate electrode. The second insulating film includes nitrogen, and has a side region that is more on the inside than at least part of a side of the gate electrode. The gate electrode has regions overlapping with the second regions in the oxide semiconductor film.

The first region in the oxide semiconductor film may include an impurity element. The second regions may each have a region including the impurity element at a higher concentration than that in the first region.

The impurity element is one or more selected from hydrogen, boron, nitrogen, fluorine, aluminum, phosphorus, and a rare gas. Alternatively, the impurity element is hydrogen and one or more selected from boron, nitrogen, fluorine, aluminum, phosphorus, and a rare gas.

The second regions in the oxide semiconductor film may be in contact with a film containing hydrogen. A typical example of the film containing hydrogen is a nitride insulating film, typified by a silicon nitride film.

The gate electrode may include the same metal element as that in the oxide semiconductor film In that case, the gate electrode is formed of a conductive oxide semiconductor film.

One embodiment of the present invention can provide a self-aligned transistor including an oxide semiconductor film, which has excellent electrical characteristics. One embodiment of the present invention can provide a transistor having high on-state current. One embodiment of the present invention can provide a method for manufacturing a transistor with small variations in electrical characteristics. One embodiment of the present invention can provide a method for manufacturing a display device with low power consumption. One embodiment of the present invention can provide a novel method for manufacturing a display device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 19A and 19B are high-resolution cross-sectional TEM images and FIG. 19C is a local Fourier transform image of an oxide semiconductor;

FIG. 24 schematically illustrates a deposition model of an nc-OS and pellets;

FIGS. 29A and 29B show a structure of $InGaZnO_4$ before collision of an atom, and the like;

FIGS. 30A and 30B show the structure of $InGaZnO_4$ after collision of an atom, and the like;

FIGS. 33A to 33C are projection views illustrating a structure of an input/output device of one embodiment;

FIGS. 35A, 35B1, and 35B2 illustrate configurations and driving methods of a sensor circuit 19 and a converter CONV according to one embodiment;

DETAILED DESCRIPTION OF THE INVENTION

Figure 1A:
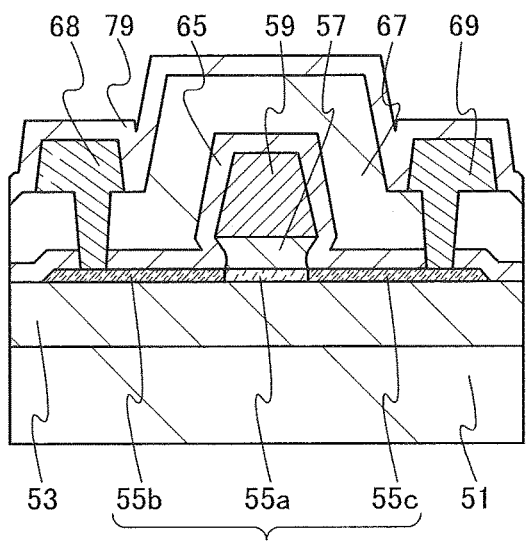
FIGS. 1A to 1D are cross-sectional views illustrating embodiments of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Note that the term such as "over" or "below" in this specification and the like does not necessarily mean that a component is placed "directly on" or "directly under" another component. For example, the expression "a gate electrode over a gate insulating film" does not preclude the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, one embodiment of a semiconductor device and a method for manufacturing the semiconductor device will be described with reference to FIGS. 1A to 1D, FIGS. 2A to 2D, and FIGS. 3A to 3C.

<Structure of Semiconductor Device>

FIGS. 1A to 1D are each a cross-sectional view of a top-gate self-aligned transistor that is an example of a transistor in a semiconductor device.

The transistor illustrated in FIG. 1A includes an oxide semiconductor film 55, a gate insulating film 57 in contact with the oxide semiconductor film 55, and a gate electrode 59 in contact with the gate insulating film 57 and overlapping with the oxide semiconductor film 55.

The oxide semiconductor film 55 in the transistor is formed over an insulating film 53 that is formed over a substrate 51. In addition, an insulating film 65 containing hydrogen that is in contact with second regions 55b and 55c in the oxide semiconductor film 55 is provided.

Furthermore, an insulating film 67 in contact with the insulating film 65 containing hydrogen may be provided. Furthermore, a pair of conductive films 68 and 69 in contact with the second regions 55b and 55c in the oxide semiconductor film 55, respectively, may be provided in openings formed in the insulating film 65 containing hydrogen and the insulating film 67. Furthermore, an insulating film 79 may be provided over the insulating film 67 and the pair of conductive films 68 and 69.

The oxide semiconductor film 55 includes a first region 55a and the second regions 55b and 55c between which the first region 55a is positioned. The first region 55a has a function as a channel region. The second regions 55b and 55c have a function as a source region and a drain region. Since the resistivity of the second regions 55b and 55c is lower than that of the first region 55a, the second regions 55b and 55c may be referred to as low-resistance regions.

In the transistor described in this embodiment, a side of the gate insulating film 57 has a depressed portion. Specifically, the gate insulating film 57 has a region with a smaller width than that of a region in contact with the gate electrode 59. In other words, the side of the gate insulating film 57 has a region that is more on the inside than part of a side of the gate electrode 59.

In addition, in the transistor described in this embodiment, the second regions 55b and 55c in the oxide semiconductor film 55 each have a region overlapping with part of the gate electrode 59.

Figure 1B:
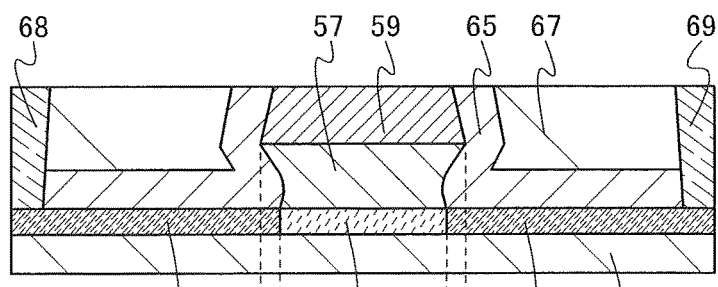
Figure 1C:
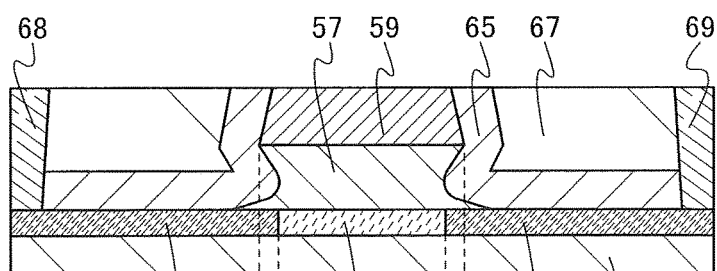
Figure 1D:
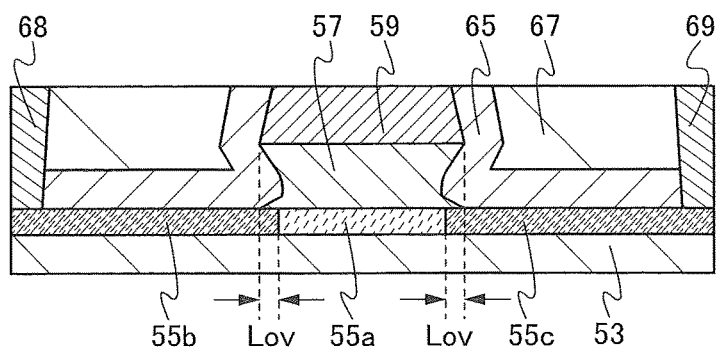

FIGS. 1B to 1D are enlarged cross-sectional views of the oxide semiconductor film 55 and its surroundings in the transistor shown in FIG. 1A.

As shown in FIG. 1B, part of the side of the gate insulating film 57 is positioned more on the inside than the side of the gate electrode 59. In addition, in the gate insulating film 57, the width of a region in contact with the oxide semiconductor film 55 is smaller than the width of a region in contact with the gate electrode 59. Furthermore, the second regions 55b and 55c in the oxide semiconductor film 55 each have a region overlapping with part of the gate electrode 59. Such a region can be referred to as an overlap region Lov.

Alternatively, a structure in FIG. 1C can be employed. In FIG. 1C, part of the side of the gate insulating film 57 is positioned more on the inside than the side of the gate electrode 59. Furthermore, in the gate insulating film 57, the width of a region in contact with the oxide semiconductor film 55 is larger than the width of a region in contact with the gate electrode 59. In that case, in the gate insulating film 57, a region that protrudes outward from the region with the smallest width and is at the oxide semiconductor film 55 side is preferably thin; typically, greater than or equal to 5 nm and less than or equal to 100 nm thick, and more preferably greater than or equal to 10 nm and less than or equal to 30 nm thick. When the region that protrudes outward from the region with the smallest width and is at the oxide semiconductor film 55 side is thin, it is possible to add an impurity element also to part of the oxide semiconductor film that overlaps with the gate electrode 59 with the gate insulating film 57 positioned therebetween, and to form oxygen vacancies in the part of the oxide semiconductor film. Therefore, the second regions 55b and 55c in the oxide semiconductor film 55 each include an overlap region Lov that overlaps with part of the gate electrode 59. Hereinafter, elements which form oxygen vacancies in an oxide semiconductor film by being added thereto are referred to as impurity elements.

Alternatively, a structure shown in FIG. 1D can be employed. In FIG. 1D, part of the side of the gate insulating film 57 is positioned more on the inside than the side of the gate electrode 59. Furthermore, in the gate insulating film 57, the width of a region in contact with the oxide semiconductor film 55 is substantially the same as the width of a region in contact with the gate electrode 59. In that case, in the gate insulating film 57, a region that protrudes outward from the region with the smallest width and is at the oxide semiconductor film 55 side is preferably thin; typically, greater than or equal to 5 nm and less than or equal to 100 nm thick, and more preferably greater than or equal to 10 nm and less than or equal to 30 nm thick. When the region that protrudes outward from the region with the smallest width and is at the oxide semiconductor film 55 side is thin, it is possible to add an impurity element also to part of the oxide semiconductor film that overlaps with the gate electrode 59 with the gate insulating film 57 positioned therebetween, and to form oxygen vacancies in the part of the oxide semiconductor film. The second regions 55b and 55c in the oxide semiconductor film 55 each include an overlap region Lov that overlaps with part of the gate electrode 59.

The length of the overlap region Lov is preferably smaller than 20%, 10%, 5%, or 2% of a channel length L. Note that the channel length L refers to the length of the first region 55a in the channel length direction of the transistor.

In the oxide semiconductor film 55, the second regions 55b and 55c each include a region containing an impurity element.

In addition, in the case where a source gas for the oxide semiconductor film contains an impurity element, the first region 55a and the second regions 55b and 55c contain the impurity element. In that case, the second regions 55b and 55c each include a region with a different impurity concentration from that of the first region 55a. Typically, the second regions 55b and 55c each include a region with a higher impurity concentration than that of the first region 55a. For example, in the case where the oxide semiconductor film 55 is formed by a sputtering method using a rare gas as a sputtering gas, the oxide semiconductor film 55 contains the rare gas. Meanwhile, the rare gas is intentionally added to the second regions 55b and 55c to form oxygen vacancies, whereby a region with a high concentration of the rare gas is formed in each of the second regions 55b and 55c. As a result, a region with a higher concentration of the rare gas than that in the first region 55a is formed in each of the second regions 55b and 55c. Note that an impurity element different from that added to the first region 55a may be added to the second regions 55b and 55c.

Typical examples of the impurity element are one or more of a rare gas, hydrogen, boron, nitrogen, fluorine, aluminum, and phosphorus. Typical examples of the rare gas are helium, neon, argon, krypton, and xenon.

In the case where boron, nitrogen, fluorine, aluminum, or phosphorus is contained as the impurity element in the second regions 55b and 55c, the impurity concentration in each of the second regions 55b and 55c is higher than that in the first region 55a.

Furthermore, the second regions 55b and 55c of the oxide semiconductor film 55 contain hydrogen and one or more of a rare gas, boron, nitrogen, fluorine, aluminum, and phosphorus. In addition, the second regions 55b and 55c each include a region with a different hydrogen concentration from that of the first region 55a. Specifically, the second regions 55b and 55c each include a region with a higher hydrogen concentration than that of the first region 55a. That is because hydrogen contained in the insulating film 65 diffuses into the second regions 55b and 55c in the oxide semiconductor film 55 directly at where the oxide semiconductor film 55 is in contact with the insulating film 65 containing hydrogen, or through the gate insulating film 57 at where the gate insulating film 57 is present between the oxide semiconductor film 55 and the insulating film 65 containing hydrogen.

The hydrogen concentration in each of the second regions 55b and 55c, which is measured by secondary ion mass spectrometry (SIMS), is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The hydrogen concentration in the first region 55a, which is measured by SIMS, is lower than or equal to $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, still further preferably lower than or equal to $5 \times 10^{17}$ atoms/cm$^3$, still further preferably lower than or equal to $1 \times 10^{16}$ atoms/cm$^3$.

When the hydrogen concentration in the first region 55a is set in the range described above, generation of electrons serving as carriers in the first region 55a can be suppressed, and the transistor has positive threshold voltage (normally-off characteristics).

When hydrogen is contained in an oxide semiconductor in which an oxygen vacancy is generated by addition of the impurity element, hydrogen enters an oxygen vacant site and forms a donor level in the vicinity of the conduction band. As a result, the conductivity of the oxide semiconductor film is increased, so that the oxide semiconductor film becomes a conductor. An oxide semiconductor film having become a conductor can be referred to as an oxide conductor film. That is, it can be said that, in the oxide semiconductor film 55, the first region 55a is formed of an oxide semiconductor, and the second regions 55b and 55c are formed of oxide conductors. In the oxide semiconductor film 55, the second regions 55b and 55c have higher hydrogen concentrations than the first region 55a and have more oxygen vacancies than the first region 55a because of addition of impurity elements. Thus, the resistivity of the second regions 55b and 55c is preferably greater than or equal to $1 \times 10^{-3}$ Ωcm and less than $1 \times 10^4$ Ωcm, more preferably greater than or equal to $1 \times 10^{-3}$ Ωcm and less than $1 \times 10^{-1}$ Ωcm.

Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

In the transistors illustrated in FIGS. 1A to 1D, the gate insulating film 57 has a depressed portion at the side. That is, there is a region where the gate insulating film 57 is not formed between the oxide semiconductor film 55 and the gate electrode 59. Thus, when an impurity element is added to the oxide semiconductor film 55 to form oxygen vacancies, the impurity element also enters the depressed portion at the side of the gate insulating film. Furthermore, the impurity element is added to the oxide semiconductor film 55 through a thin region of the gate insulating film. As a result, the impurity element is added to and oxygen vacancies are formed in a region of the oxide semiconductor film 55 that overlaps with part of the gate electrode 59.

In addition, hydrogen contained in the insulating film 65 diffuses into a region to which the impurity element is added, directly at where the region is in contact with the insulating film 65 containing hydrogen, or through the gate insulating film 57 at where the gate insulating film 57 is present between the region and the insulating film 65 containing hydrogen.

As a result, in regions of the oxide semiconductor film 55 that overlap with part of the gate electrode 59, the second regions 55b and 55c containing oxygen vacancies and hydrogen are formed.

That is, according to this embodiment, the second regions 55b and 55c containing oxygen vacancies and hydrogen are selectively formed in the oxide semiconductor film by selectively adding an impurity element to the oxide semiconductor film through utilizing the shape of the gate insulating film 57, and by selectively diffusing hydrogen into the oxide semiconductor film through utilizing the shape of the gate insulating film 57. As described later in Embodiment 3, hydrogen is stable in an oxygen vacancy and thus is unlikely to be released from the oxygen vacancy. Therefore, hydrogen contained in the second regions 55b and 55c is unlikely to diffuse into the first region 55a serving as a channel region, whereby deterioration in electrical characteristics of the transistor can be reduced.

In addition, hydrogen enters the oxygen vacancies and a donor level is formed in the vicinity of the conduction band, which increases the conductivity. Therefore, the second regions 55b and 55c has a function as a source region and a drain region. A region in each of the second regions 55b and 55c, which overlaps with part of the gate electrode 59, corresponds to the overlap region Lov. Since the transistor described in this embodiment has overlap regions, a high resistance region is not formed between the channel region and the source and drain regions. As a result, the transistor described in this embodiment has high on-state current. Furthermore, although a transistor having high resistance regions between the channel region and the source and drain regions is likely to have deteriorated electrical characteristics, the transistor described in this embodiment having overlap regions is highly reliable, with less deterioration in electrical characteristics.

Furthermore, in the transistor described in this embodiment, the second regions 55b and 55c contain hydrogen, as well as oxygen vacancies formed by addition of the impurity element. This enables the resistivity of the second regions 55b and 55c to be reduced and variations in the resistivity of the second regions 55b and 55c among transistors to be reduced. In other words, by adding the impurity element to the oxide semiconductor film and forming oxygen vacancies, the resistivity of the second regions 55b and 55c can be controlled.

The structure illustrated in FIGS. 1A to 1D will be described in detail below.

A variety of substrates can be used as the substrate 51 without limitation to a particular type of substrate. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like and with high current supply capability and a small size. By fruiting a circuit with the use of such a transistor, power consumption of the circuit can be reduced or the circuit can be highly integrated.

Alternatively, a flexible substrate may be used as the substrate 51, and the transistor may be provided directly on the flexible substrate. Alternatively, a separation layer may be provided between the substrate 51 and the transistor. The separation layer can be used when part or the whole of a semiconductor device formed over the separation layer is completed and separated from the substrate 51 and transferred to another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating film 53 can be formed to have a single-layer structure or a stacked-layer structure using an insulating film containing oxygen or an insulating film containing nitrogen. A typical example of the insulating film containing oxygen is an oxide insulating film. A typical example of the insulating film containing nitrogen is a nitride insulating film. Note that an insulating film containing oxygen is preferably used for at least a region of the insulating film 53 that is in contact with the oxide semiconductor film 55, in order to improve characteristics of the interface with the oxide semiconductor film 55. An oxide insulating film that releases oxygen by being heated is preferably used as the insulating film 53, in which case oxygen contained in the insulating film 53 can be moved to the oxide semiconductor film 55 by heat treatment.

The insulating film 53 may be formed to have a single-layer structure or a stacked-layer structure using, for example, silicon oxide, silicon oxynitride, silicon nitride oxide, silicon nitride, aluminum oxide, hafnium oxide, gallium oxide, or Ga—Zn oxide.

The oxide semiconductor film 55 is typically formed of a metal oxide film such as an In—Ga oxide film, an In—Zn oxide film, or an In-M-Zn oxide film (M is Al, Ga, Y, Zr, Sn, La, Ce, or Nd).

Note that in the case where the oxide semiconductor film 55 is an In-M-Zn oxide film, the proportions of In and M when the summation of In and M is assumed to be 100 atomic % are preferably as follows: the proportion of In is greater than or equal to 25 atomic % and the proportion of M is less than 75 atomic %, further preferably, the proportion of In is greater than or equal to 34 atomic % and the proportion of M is less than 66 atomic %.

The energy gap of the oxide semiconductor film 55 is 2 eV or more, preferably 2.5 eV or more, further preferably 3 eV or more.

The thickness of the oxide semiconductor film 55 is greater than or equal to 3 nm and less than or equal to 200 nm, preferably greater than or equal to 3 nm and less than or equal to 100 nm, further preferably greater than or equal to 3 nm and less than or equal to 50 mm.

In the case where the oxide semiconductor film 55 is an In-M-Zn oxide film (M is Al, Ga, Y, Zr, Sn, La, Ce, or Nd), it is preferable that the atomic ratio of metal elements of a sputtering target used for forming the In-M-Zn oxide film satisfy the following: the number of In atoms is greater than or equal to the number of M atoms, and the number of Zn atoms is greater than or equal to the number of M atoms. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the proportion of each metal element in the atomic ratio of the oxide semiconductor film 55 to be formed varies within a range of ±40% of that in the above atomic ratio of the sputtering target as an error.

When silicon or carbon that is an element belonging to Group 14 is contained in the oxide semiconductor film 55, oxygen vacancies are increased in the oxide semiconductor film 55, and the oxide semiconductor film 55 becomes an n-type film. Thus, the concentration of silicon or carbon in the oxide semiconductor film 55, which is measured by SIMS, is lower than or equal to $2\times10^{18}$ atoms/cm$^3$, preferably lower than or equal to $2\times10^{17}$ atoms/cm$^3$. As a result, the transistor has positive threshold voltage (normally-off characteristics).

The concentration of alkali metal or alkaline earth metal in the oxide semiconductor film 55, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Thus, it is preferable to reduce the concentration of alkali metal or alkaline earth metal in the oxide semiconductor film 55. As a result, the transistor has positive threshold voltage (normally-off characteristics).

In addition, when nitrogen is contained in the oxide semiconductor film 55, electrons serving as carriers are generated to increase the carrier density, so that the oxide semiconductor film 55 easily becomes an n-type film. Thus, a transistor including an oxide semiconductor that contains nitrogen is likely to be normally on. For this reason, nitrogen in the first region 55a in the oxide semiconductor film 55 is preferably reduced as much as possible. The concentration of nitrogen measured by SIMS can be set to be, for example, less than or equal to $5\times10^{18}$ atoms/cm$^3$.

When impurities in the first region 55a in the oxide semiconductor film 55 are reduced, the carrier density of the first region 55a in the oxide semiconductor film 55 can be lowered. The first region 55a in the oxide semiconductor film 55 preferably has a carrier density of $1\times10^{17}$/cm$^3$ or less, more preferably $1\times10^{15}$/cm$^3$ or less, still more preferably $1\times10^{13}$/cm$^3$ or less, yet more preferably $1\times10^{11}$/cm$^3$ or less.

An oxide semiconductor film having a low impurity concentration and a low density of defect states can be used for the first region 55a in the oxide semiconductor film 55, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the first region 55a in the oxide semiconductor film 55 in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the first region 55a in the oxide semiconductor film 55 has a small variation in electrical characteristics and high reliability in some cases.

The oxide semiconductor film 55 may have, for example, a non-single-crystal structure. The non-single crystal structure includes a c-axis aligned crystalline oxide semiconductor (CAAC-OS) which will be described later, a polycrystalline structure, a microcrystalline structure which will be described later, or an amorphous structure, for example. Among the non-single crystal structure, the amorphous structure has the highest density of defect states, whereas CAAC-OS has the lowest density of defect states.

Note that the oxide semiconductor film 55 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

The gate insulating film 57 preferably has a single-layer structure or a stacked-layer structure using an insulating film containing oxygen or an insulating film containing nitrogen. Typically, an oxide insulating film can be used as the insulating film containing oxygen, and a nitride insulating film can be used as the insulating film containing nitrogen. Note that an insulating film containing oxygen, typically, an oxide insulating film is preferably used for at least a region of the gate insulating film 57 that is in contact with the oxide semiconductor film 55, in order to improve characteristics of the interface with the oxide semiconductor film 55.

For the oxide insulating film, silicon oxide, silicon oxynitride, aluminum oxide, hafnium oxide, gallium oxide, or Ga—Zn oxide can be used, for example. For the nitride insulating film, silicon nitride oxide, or silicon nitride can be used, for example.

Furthermore, it is possible to prevent outward diffusion of oxygen from the first region 55a in the oxide semiconductor film 55 and entry of hydrogen, water, or the like into the first region 55a in the oxide semiconductor film 55 from the outside by providing an insulating film having a blocking effect against oxygen, hydrogen, water, and the like as the gate insulating film 57. The insulating film having a blocking effect against oxygen, hydrogen, water, and the like can be formed using aluminum oxide, aluminum oxynitride, gallium oxide, gallium oxynitride, yttrium oxide, yttrium oxynitride, hafnium oxide, hafnium oxynitride, or the like.

The gate insulating film 57 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The gate electrode 59 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The gate electrode 59 may have a single-layer structure or a stacked structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film in which aluminum and one or more elements selected from titanium, tantalum, tungsten, molybdenum, chromium, neodymium, and scandium are combined may be used.

The gate electrode 59 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a stacked-layered structure formed using the above light-transmitting conductive, material and the above metal element.

Figure 22:
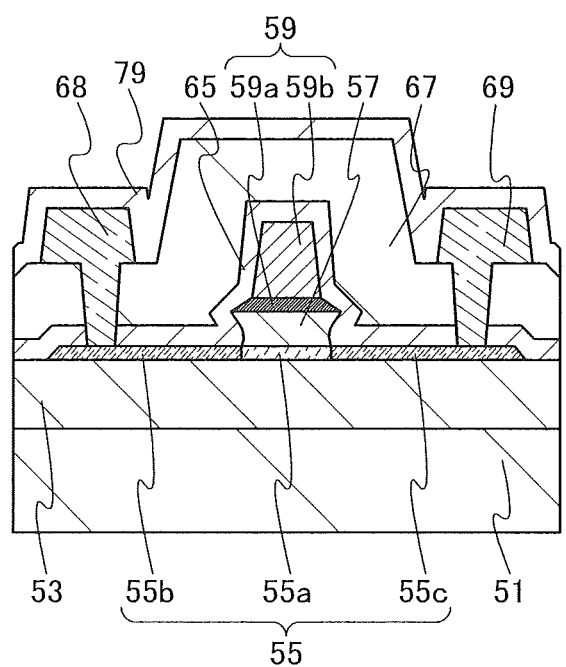
FIG. 22 is a cross-sectional view illustrating one embodiment of a semiconductor device.

Alternatively, as shown in FIG. 22, the gate electrode 59 may have a stacked-layer structure including a conductive film 59a that is in contact with the gate insulating film 57 and a conductive film 59b that is in contact with the conductive film 59a. An end portion of the conductive film 59a is placed more outside than an end portion of the conductive film 59b in the cross section. That is, the gate electrode 59 may have a shape in which the conductive film 59a extends beyond the conductive film 59b.

The insulating film 65 containing hydrogen is preferably formed using a nitride insulating film. As the nitride insulating film, silicon nitride, silicon nitride oxide, aluminum nitride, aluminum nitride oxide, or the like can be used. The hydrogen concentration in the insulating film 65 containing hydrogen is preferably greater than or equal to $1 \times 10^{22}$ atoms/cm$^3$, in which case hydrogen can diffuse into the oxide semiconductor film.

The pair of conductive films 68 and 69 is formed to have a single-layer structure or a stacked-layer structure using any of metals such as aluminum, titanium, chromium, nickel, copper, yttrium, zirconium, molybdenum, iron, cobalt, silver, tantalum, and tungsten and an alloy containing any of these metals as a main component. For example, a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a copper film containing manganese, a copper film, and a copper film containing manganese are stacked in this order; and the like can be given. Note that a transparent conductive material containing indium oxide, tin oxide, or zinc oxide may be used.

The insulating films 67 and 79 can be formed using the same material as the insulating film 53 or the gate insulating film 57 as appropriate.

Note that when the pair of conductive films 68 and 69 contains copper, the insulating film 79 is preferably formed using an insulating film containing nitrogen, in which case diffusion of copper can be prevented. A typical example of the insulating film containing nitrogen is a nitride insulating film. A nitride insulating film can be formed using silicon nitride, silicon nitride oxide, aluminum nitride, aluminum nitride oxide, or the like.

<Manufacturing Method of Semiconductor Device>

Next, a method for manufacturing the transistor shown in FIGS. 1A to 1D will be described with reference to FIGS. 2A to 2D, and FIGS. 3A to 3C.

Films of the transistor (e.g., an insulating film, an oxide semiconductor film, a metal oxide film, and a conductive film) can be formed by a sputtering method, a chemical vapor deposition (CVD) method, a vacuum vapor deposition method, or a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example. Furthermore, it is preferable to form the films continuously with use of a multi-chamber deposition apparatus including a load lock chamber, without being exposed to air, in which case the amount of impurities at the interfaces between the films can be reduced.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at a time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

Figure 2A:
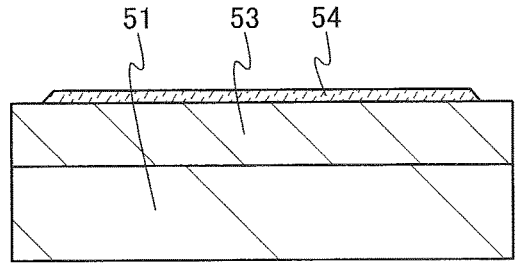
FIGS. 2A to 2D are cross-sectional views illustrating one embodiment of a manufacturing process of a semiconductor device.

As illustrated in FIG. 2A, the insulating film 53 and an oxide semiconductor film 54 are formed over the substrate 51.

The insulating film 53 can be formed by a sputtering method, a CVD method, an evaporation method, a pulsed laser deposition (PLD) method, a printing method, a coating method, or the like as appropriate. The insulating film 53 can be formed in the following manner: an insulating film is formed over the substrate 51, and then oxygen is added to the insulating film. Examples of the oxygen that is added to the insulating film include an oxygen radical, an oxygen atom, an oxygen atomic ion, an oxygen molecular ion, and the like. As a method for adding the oxygen, an ion doping method, an ion implantation method, plasma treatment, or the like can be given.

A formation method of the oxide semiconductor film 54 will be described below. An oxide semiconductor film is formed over the insulating film 53 by a sputtering method, a coating method, a pulsed laser deposition method, a laser ablation method, a thermal CVD method, or the like. Then, after a mask is formed over the oxide semiconductor film by lithography, the oxide semiconductor film is partly etched using the mask. Thus, the oxide semiconductor film 54 shown in FIG. 2A can be formed. After that, the mask is removed.

Alternatively, by using a printing method for forming the oxide semiconductor film 54, the oxide semiconductor film 54 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film to be described later, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Furthermore, the heat treatment may be performed under an inert gas atmosphere first, and then under an oxygen atmosphere. It is preferable that the above inert gas atmosphere and the above oxygen atmosphere not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film can be lower than or equal to $5\times10^{19}$ atoms/cm$^3$, preferably lower than or equal to $1\times10^{19}$ atoms/cm$^3$, further preferably lower than $5\times10^{18}$ atoms/cm$^3$, still further preferably lower than or equal to $1\times10^{18}$ atoms/$cm^3$, still further preferably lower than or equal to $5\times10^{17}$ atoms/$cm^3$, still further preferably lower than or equal to $1\times10^{16}$ atoms/$cm^3$.

For example, in the case where an oxide semiconductor film, e.g., an In—Ga—Zn—$O_x$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Instead of a $Zn(CH_3)_2$ gas, a $Zn(C_2H_5)_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen. Thus, the oxide semiconductor film 54 is formed.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which will be described later, is greater than or equal to 60% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

Figure 2B:
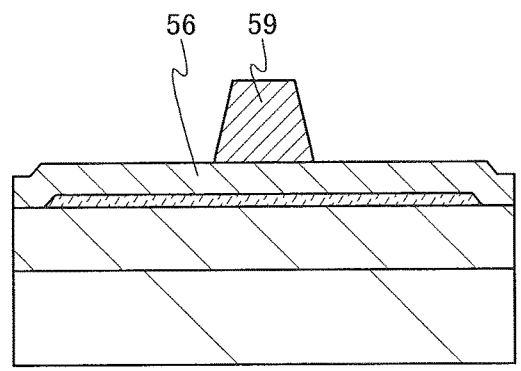

Next, as illustrated in FIG. 2B, an insulating film 56 is formed, and then the gate electrode 59 is formed.

The insulating film 56 becomes a gate insulating film in a later step. The insulating film 56 is formed by a sputtering method, a CVD method, a vacuum evaporation method, a pulsed laser deposition (PLD) method, a thermal CVD method, or the like.

In the case where the insulating film 56 is formed using a silicon oxide film or a silicon oxynitride film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case where a gallium oxide film is formed as the insulating film 56, an MOCVD method can be used.

In the case where a hafnium oxide film is formed as the insulating film 56 by a thermal CVD method such as an MOCVD method or an ALD method, two kinds of gases, i.e., ozone ($O_3$) as an oxidizer and a source material gas that is obtained by vaporizing a liquid containing a solvent and a hafnium precursor compound (hafnium alkoxide or hafnium amide such as tetrakis(dimethylamide)hafnium (TDMAH)), are used. Note that the chemical formula of tetrakis (dimethylamide)hafnium is $Hf[N(CH_3)_2]_4$. Examples of another material liquid include tetrakis(ethylmethylamide) hafnium.

In the case where an aluminum oxide film is formed as the insulating film 56 by a thermal CVD method such as an MOCVD method or an ALD method, two kinds of gases, i.e., $H_2O$ as an oxidizer and a source material gas that is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate). Note that the ALD method enables the insulating film 56 to have excellent coverage and small thickness.

In the case where a silicon oxide film is formed as the insulating film 56 by a thermal CVD method such as an MOCVD method or an ALD method, hexachlorodisilane is adsorbed on a deposition surface, chlorine contained in adsorbate is removed, and radicals of an oxidizing gas (e.g., $O_2$ or dinitrogen monoxide) are supplied to react with the adsorbate.

Here, as the insulating film 56, a silicon oxynitride film is formed by a plasma CVD method.

A formation method of the gate electrode 59 will be described below. First, a conductive film is formed by a sputtering method, a vacuum evaporation method, a pulsed laser deposition (PLD) method, a thermal CVD method, or the like, and then a mask is formed over the conductive film by lithography. Then, part of the conductive film is etched using the mask to form the gate electrode 59. After that, the mask is removed.

Note that the gate electrode 59 may be formed by an electrolytic plating method, a printing method, an inkjet method, or the like instead of the above formation method.

Alternatively, a tungsten film can be formed as the conductive film with the use of a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 2C:
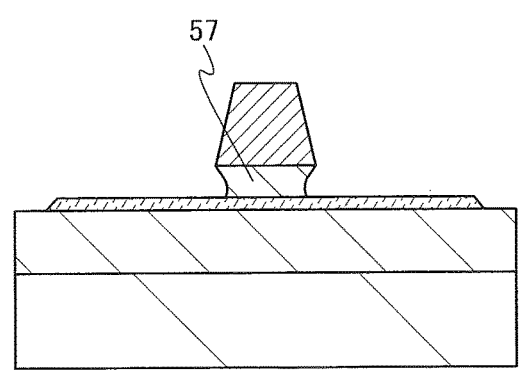

Next, as illustrated in FIG. 2C, the insulating film 56 is etched using the gate electrode 59 as a mask to form the gate insulating film 57. By etching the insulating film 56 isotropically, it is possible to etch part of a region overlapping with the gate electrode 59. As a result, the gate insulating film 57, part of the side of which is positioned more on the inside than the side of the gate electrode 59, can be formed.

Figure 2D:
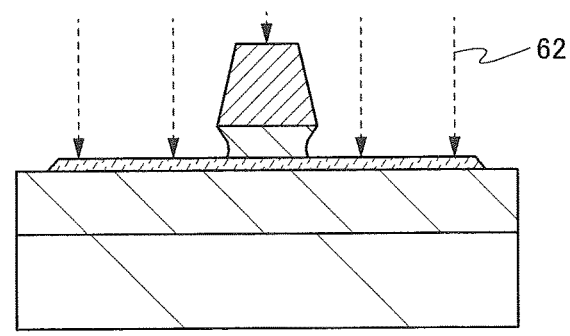

Next, as shown in FIG. 2D, an impurity element 62 is added to the oxide semiconductor film 54, using the gate electrode 59 as a mask. As a result, the impurity element is added to an exposed portion of the oxide semiconductor film 54. In addition, the impurity element is added to the oxide semiconductor film through a thin region of the gate insulating film 57. Because of damages due to the addition of the impurity element 62, defects, typically, oxygen vacancies, are formed in the oxide semiconductor film 54. Note that depending on the impurity element used, the impurity element is released without remaining in the oxide semiconductor film 54, or part of the impurity element forms oxygen vacancies in the oxide semiconductor film 54 while part of the impurity element is released without remaining in the oxide semiconductor film 54. Here, including such phenomena, the expression "adding an impurity element to an oxide semiconductor film" is used for explanation.

The impurity element 62 is added by, for example, an ion doping method, an ion implantation method, or a plasma treatment method. For the plasma treatment method, plasma is generated in a gas atmosphere containing the impurity element to be added, and ions of the impurity element accelerated by plasma treatment are made to collide with the oxide semiconductor film 54, whereby oxygen vacancies can be formed in the oxide semiconductor film 54. A dry etching apparatus, a plasma CVD apparatus, a high-density plasma CVD apparatus using microwaves, or the like can be used to generate the plasma. For performing plasma treatment, the substrate 51 may be set to a parallel plate on the cathode side and an RF power may be supplied so that a bias is applied to the substrate 51 side. As the RF power, for example, power density can be greater than or equal to 0.1 W/cm$^2$ and less than or equal to 2 W/cm$^2$. Consequently, the amount of impurity elements added to the oxide semiconductor film 54 can be increased and more oxygen vacancies can be formed in the oxide semiconductor film 54.

Note that, as a source gas of the impurity element 62, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By adding the impurity element 62 to the oxide semiconductor film 54 using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, aluminum, silicon, phosphorus, and chlorine can be added at a time to the oxide semiconductor film 54.

Alternatively, after a rare gas is added to the oxide semiconductor film 54, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor film 55.

Alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the oxide semiconductor film 54, a rare gas may be added to the oxide semiconductor film 55.

In the case where an ion doping method or an ion implantation method is used, implantation conditions such as acceleration voltage and a dose may be appropriately set, or the thickness of the gate insulating film 57 through which the impurity element passes may be appropriately adjusted. For example, in the case where argon is added by an ion implantation method, the acceleration voltage is set to 10 kV and the dose is set to greater than or equal to $1\times10^{13}$ ions/cm$^2$ and less than or equal to $1\times10^{16}$ ions/cm$^2$, e.g., $1\times10^{14}$ ions/cm$^2$. In the case where a phosphorus ion is added by an ion implantation method, the acceleration voltage is set to 30 kV and the dose is set to greater than or equal to $1\times10^{13}$ ions/cm$^2$ and less than or equal to $5\times10^{16}$ ions/cm$^2$, e.g., $1\times10^{15}$ ions/cm$^2$.

Note that oxygen vacancies may be formed in the oxide semiconductor film 54 by, instead of the addition of the impurity element 62, irradiating the oxide semiconductor film 54 with ultraviolet light or the like. Alternatively, oxygen vacancies may be formed in the oxide semiconductor film 54 by irradiating the oxide semiconductor film 54 with laser.

Note that if the impurity element 62 is added with the gate electrode 59 being exposed, part of the gate electrode 59 is peeled off and attached to the side of the gate insulating film 57 in some cases. This results in an increase in the leakage current of the transistors. Accordingly, the top surface of the gate electrode 59 may be covered with a mask when the impurity element 62 is added to the oxide semiconductor film 54, in which case attachment of part of the gate electrode 59 to the side of the gate insulating film 57 can be prevented.

Figure 3A:
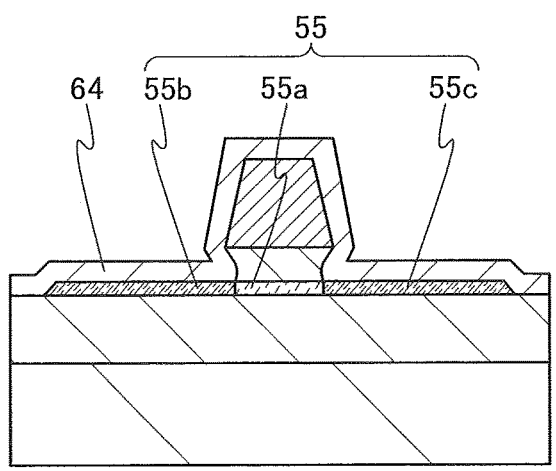
FIGS. 3A to 3C are cross-sectional views illustrating one embodiment of a manufacturing process of a semiconductor device.

Next, as illustrated in FIG. 3A, an insulating film 64 containing hydrogen is formed over the oxide semiconductor film 54, the gate insulating film 57, and the gate electrode 59. The insulating film 64 containing hydrogen is formed by a sputtering method, a CVD method, a vacuum evaporation method, a pulsed laser deposition (PLD) method, or the like. When an atomic layer deposition (ALD) method is used for depositing the insulating film 64 containing hydrogen, the insulating film 64 containing hydrogen excellent in step coverage can be obtained.

The insulating film 64 contains hydrogen. Therefore, when a region of the oxide semiconductor film 54 where the impurity element is added and the insulating film 64 containing hydrogen are in contact with each other, the hydrogen contained in the insulating film 64 moves to the region of the oxide semiconductor film 54 where the impurity element is added. As a result, the oxide semiconductor film 55 that includes the first region 55a to which the impurity element is not added and the second regions 55b and 55c containing the impurity element and hydrogen is formed. Note that hydrogen contained in the insulating film 64 diffuses into part of the oxide semiconductor film 55 through a thin region of the gate insulating film 57. Thus, part of the second regions 55b and 55c may overlap with the gate insulating film 57. Through the above steps, the second regions 55b and 55c that overlap with part of the gate electrode 59 can be formed.

The second regions 55b and 55c contain hydrogen and oxygen vacancies formed by the addition of the impurity element. The second regions 55b and 55c have high conductivity because of the interaction between the oxygen vacancies and hydrogen. That is, the second regions 55b and 55c are low-resistance regions.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. The heat treatment further increases the conductivity of the second regions 55b and 55c.

Figure 3B:
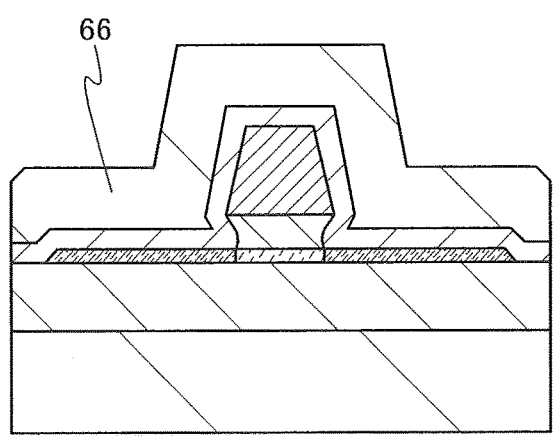
Figure 3C:
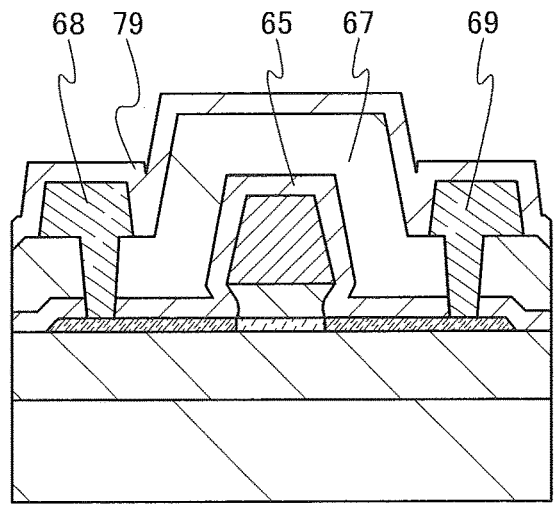

Next, an insulating film 66 may be formed as shown in FIG. 3B. The insulating film 66 can reduce the parasitic capacitance between the gate electrode 59 and a pair of conductive films formed later.

Next, openings are formed in the insulating film 64 containing hydrogen and the insulating film 66 to expose parts of the second regions 55b and 55c, and then the pair of conductive films 68 and 69 are formed. Subsequently, the insulating film 79 is formed over the insulating film 67 and the pair of conductive films 68 and 69 (see FIG. 3C).

The pair of conductive films 68 and 69 can be formed by a method similar to that of the gate electrode 59 as appropriate. The insulating film 79 can be formed in a manner similar to those of the insulating film 53 and the insulating film 56.

Through the above-described steps, the transistor can be manufactured.

The transistor described in this embodiment has high on-state current because part of the gate electrode 59 and part of the highly conductive second regions 55b and 55c in the oxide semiconductor film 55 overlap with each other. In addition, since the transistor described in this embodiment does not include a region where the gate electrode 59 overlaps with the pair of conductive films 68 and 69, the parasitic capacitance can be reduced and the on-state current is high. Furthermore, since a region with small variation in resistivity can be formed in the transistor described in this embodiment, the on-state current of the transistor can be higher than a conventional transistor, and variations among transistors can be reduced.

The structures, the methods, and the like described in this embodiment can be combined as appropriate with any of the structures, the methods, and the like described in the other embodiments.

Embodiment 2

In this embodiment, embodiments of a semiconductor device and a method for manufacturing the semiconductor device will be described with reference to FIGS. 4A to 4D, FIGS. 5A to 5D, and FIGS. 6A to 6C.

<Structure of Semiconductor Device>

FIGS. 4A to 4D are cross-sectional views of top-gate self-aligned transistors that are examples of a transistor in a semiconductor device. Transistors described in this embodiment are different from those described in Embodiment 1 in that the gate insulating film has a stacked-layer structure.

Figure 4A:
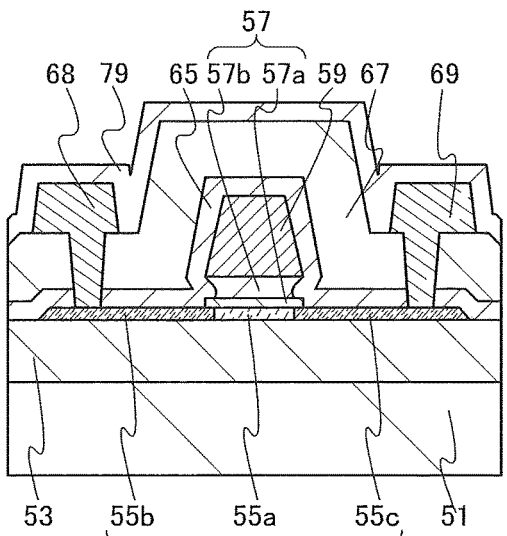
FIGS. 4A to 4D are cross-sectional views illustrating embodiments of a semiconductor device.

The transistor illustrated in FIG. 4A includes an oxide semiconductor film 55, a gate insulating film 57 in contact with the oxide semiconductor film 55, and a gate electrode 59 in contact with the gate insulating film 57 and overlapping with the oxide semiconductor film 55. In the gate insulating film 57, a first insulating film 57a and a second insulating film 57b are stacked in this order from the oxide semiconductor film 55 side. That is, the first insulating film 57a is in contact with the oxide semiconductor film 55. The second insulating film 57b is provided between the first insulating film 57a and the gate electrode 59. Although not shown in the drawing here, another insulating film may be provided between the first insulating film 57a and the second insulating film 57b. Alternatively, another insulating film may be provided between the second insulating film 57b and the gate electrode 59.

The first insulating film 57a is preferably formed using a material that is unlikely to form a defect state at the interface with the oxide semiconductor film 55. Typically, it is preferable that the first insulating film 57a be formed using an insulating film containing oxygen. A typical example of the insulating film containing oxygen is an oxide insulating film. An oxide insulating film can be formed using silicon oxide, silicon oxynitride, aluminum oxide, hafnium oxide, gallium oxide, Ga—Zn oxide, or the like.

The second insulating film 57b is formed using a material that is etched isotropically at the time of being etched. Typically, an insulating film containing nitrogen can be used for the second insulating film 57b. A typical example of the insulating film containing nitrogen is a nitride insulating film. A nitride insulating film can be formed using silicon nitride oxide, silicon nitride, or the like.

The oxide semiconductor film 55 in the transistor is formed over an insulating film 53 that is formed over a substrate 51. In addition, an insulating film 65 containing hydrogen that is in contact with second regions 55b and 55c in the oxide semiconductor film 55 is provided.

Furthermore, an insulating film 67 in contact with the insulating film 65 containing hydrogen may be provided. Furthermore, a pair of conductive films 68 and 69 in contact with the second regions 55b and 55c in the oxide semiconductor film 55, respectively, may be provided in openings formed in the insulating film 65 containing hydrogen and the insulating film 67. Furthermore, an insulating film 79 may be provided over the insulating film 67 and the pair of conductive films 68 and 69.

In the transistor described in this embodiment, a side of the gate insulating film 57 has a depressed portion. Specifically, the second insulating film 57b has a region with a smaller width than that of the gate electrode 59. In other words, a side of the second insulating film 57b has a region that is more on the inside than a side of the gate electrode 59.

The first insulating film 57a preferably has a thickness that allows an impurity element to be added to the second regions 55b and 55c. The thickness of the first insulating film 57a can be, typically, greater than or equal to 5 nm and less than or equal to 100 nm, and preferably greater than or equal to 10 nm and less than or equal to 30 nm.

The second insulating film 57b preferably has a thickness with which the second insulating film 57b can function as a gate insulating film with the first insulating film 57a. The thickness of the second insulating film 57b can be greater than or equal to 5 nm and less than or equal to 400 nm, preferably greater than or equal to 10 nm and less than or equal to 300 nm, and more preferably greater than or equal to 50 nm and less than or equal to 250 nm.

In addition, in the transistor described in this embodiment, the second regions 55b and 55c in the oxide semiconductor film 55 each have a region overlapping with part of the gate electrode 59.

Figure 4B:
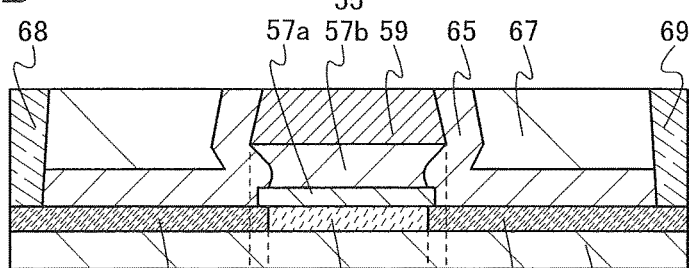
Figure 4C:
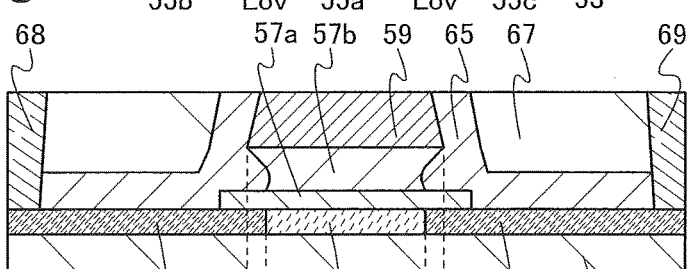
Figure 4D:
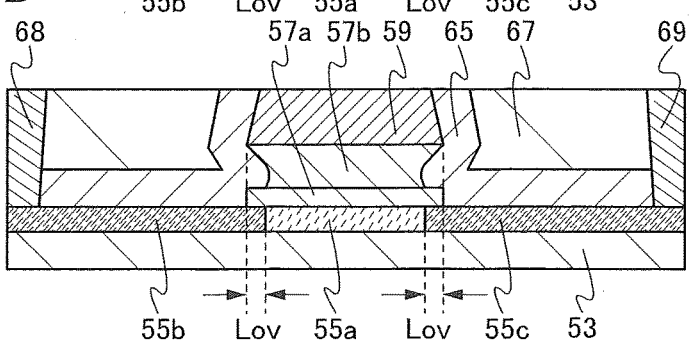

FIGS. 4B to 4D are enlarged cross-sectional views of the oxide semiconductor film 55 and its surroundings in the transistor shown in FIG. 4A.

As shown in FIG. 4B, part or the whole of side of the second insulating film 57b is positioned more on the inside than the side of the gate electrode 59. In addition, the width of the first insulating film 57a is smaller than the width of the gate electrode 59. In addition, the second regions 55b and 55c in the oxide semiconductor film 55 each have a region overlapping with part of the gate electrode 59. Such a region can be referred to as an overlap region Lov.

Alternatively, as shown in FIG. 4C, part or the whole of side of the second insulating film 57b is positioned more on the inside than the side of the gate electrode 59. Furthermore, the width of the first insulating film 57a is larger than the width of the gate electrode 59. In addition, the second regions 55b and 55c in the oxide semiconductor film 55 each have an overlap region Lov that overlaps with part of the gate electrode 59.

Further alternatively, as shown in FIG. 4D, part or the whole of side of the second insulating film 57b is positioned more on the inside than the side of the gate electrode 59. Furthermore, the width of the first insulating film 57a is substantially the same as the width of the gate electrode 59. In addition, the second regions 55b and 55c in the oxide semiconductor film 55 each have an overlap region Lov that overlaps with part of the gate electrode 59.

The length of the overlap region Lov is preferably smaller than 20%, 10%, 5%, or 2% of a channel length L.

The first insulating film 57a is formed using a material that is unlikely to form a defect state at the interface with the oxide semiconductor film 55. Since such first insulating film 57a is in contact with the oxide semiconductor film 55, the density of defect states at the interface between the oxide semiconductor film 55 and the gate insulating film 57 can be reduced. The second insulating film 57b is formed using a material that can be etched isotropically. Accordingly, the second insulating film 57b having a width smaller than that of the gate electrode 59 can be formed through etching with the use of the gate electrode 59 as a mask. The etching rate of the second insulating film 57b at an etching process may be different from that of the oxide semiconductor film. In that case, the second insulating film 57b can be etched selectively and isotropically, with the oxide semiconductor film being exposed.

Since the thickness of the first insulating film 57a is small, an impurity element can be added to the second regions 55b and 55c through the first insulating film 57a. Furthermore, hydrogen contained in the insulating film 65 can diffuse into the second regions 55b and 55c. Therefore, the second regions 55b and 55c can be formed under the first insulating film 57a.

In the transistors illustrated in FIGS. 4A to 4D, the gate insulating film 57 has a depressed portion at the side. Thus, when an impurity element is added to the oxide semiconductor film 55 to form oxygen vacancies, the impurity element also enters the depressed portion at the side of the gate insulating film. Moreover, since the first insulating film 57a is thin, the impurity element is added to the oxide semiconductor film 55 through the first insulating film 57a. As a result, the impurity element is added to and oxygen vacancies are formed in a region of the oxide semiconductor film 55 that overlaps with part of the gate electrode 59.

In addition, hydrogen contained in the insulating film 65 diffuses into a region to which the impurity element is added, directly at where the region is in contact with the insulating film 65 containing hydrogen, or through the first insulating film 57a at where the first insulating film 57a is present between the region and the insulating film 65 containing hydrogen.

As a result, in regions of the oxide semiconductor film 55 that overlap with part of the gate electrode 59, the second regions 55b and 55c containing oxygen vacancies and hydrogen are formed.

That is, according to this embodiment, the second regions 55b and 55c containing oxygen vacancies and hydrogen are selectively formed in the oxide semiconductor film by selectively adding an impurity element to the oxide semiconductor film through utilizing the shape of the gate insulating film 57, and by selectively diffusing hydrogen into the oxide semiconductor film through utilizing the shape of the gate insulating film 57. As described later in Embodiment 3, hydrogen is stable in an oxygen vacancy and thus is unlikely to be released from the oxygen vacancy. Therefore, hydrogen contained in the second regions 55b and 55c is unlikely to diffuse into the first region 55a serving as a channel region, whereby deterioration in electrical characteristics of the transistor can be reduced.

In addition, hydrogen enters the oxygen vacancies and a donor level is formed in the vicinity of the conduction band, which increases the conductivity. Therefore, the second regions 55b and 55c has a function as a source region and a drain region. A region in each of the second regions 55b and 55c, which overlaps with part of the gate electrode 59, corresponds to the overlap region Lov. Since the transistor described in this embodiment has overlap regions, a high resistance region is not formed between the channel region and the source and drain regions. As a result, the transistor described in this embodiment has high on-state current. Furthermore, although a transistor having high resistance regions between the channel region and the source and drain regions is likely to have deteriorated electrical characteristics, the transistor described in this embodiment having overlap regions is highly reliable, with less deterioration in electrical characteristics.

Furthermore, in the transistor described in this embodiment, the second regions 55b and 55c contain hydrogen, as well as oxygen vacancies formed by addition of the impurity element. This enables the resistivity of the second regions 55b and 55c to be reduced and variations in the resistivity of the second regions 55b and 55c among transistors to be reduced. In other words, by adding the impurity element to the oxide semiconductor film and forming oxygen vacancies, the resistivity of the second regions 55b and 55c can be controlled.

<Method 1 for Manufacturing Semiconductor Device>

Next, a method for manufacturing the transistor illustrated in FIGS. 4A to 4D will be described with reference to FIGS. 5A to 5D and FIGS. 6A to 6C.

Figure 5A:
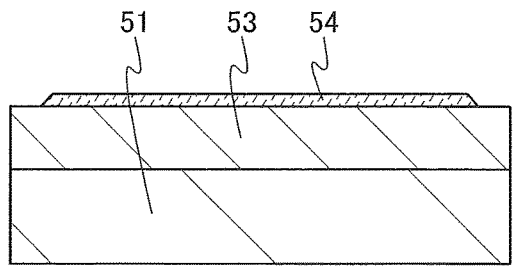
FIGS. 5A to 5D are cross-sectional views illustrating one embodiment of a manufacturing process of a semiconductor device.

In a manner similar to that in Embodiment 1, the insulating film 53 and an oxide semiconductor film 54 are formed over the substrate 51 as illustrated in FIG. 5A.

Figure 5B:
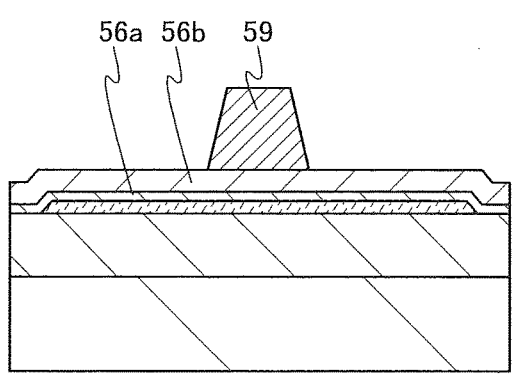

Next, a first insulating film 56a and a second insulating film 56b are formed in this order as shown in FIG. 5B. Then, the gate electrode 59 is formed over the second insulating film 56b.

Figure 5C:
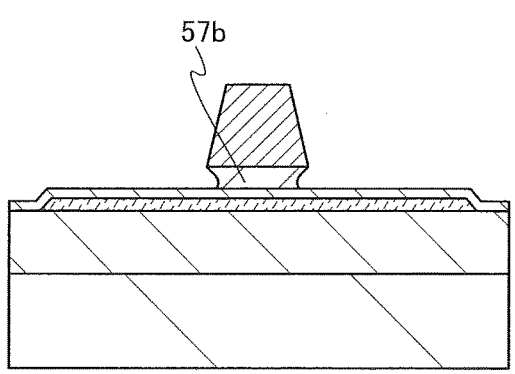

Next, as shown in FIG. 5C, the second insulating film 56b is etched using the gate electrode 59 as a mask to than the second insulating film 57b. Here, a wet etching method using an etchant with which the etching rate of the second insulating film 56b is higher than that of the first insulating film 56a can be used. Alternatively, a dry etching method using an etching gas with which the etching rate of the second insulating film 56b is higher than that of the first insulating film 56a and the second insulating film 56b can be etched isotropically can be used. As a result, the second insulating film 57b having a depressed portion at a side can be obtained.

In the case where the second insulating film 56b is a silicon nitride film, for example, the silicon nitride film can be etched isotropically by a dry etching method using a gas containing a fluorine compound such as $NF_3$, $SiF_4$, $CF_4$, or $C_4F_8$, or a mixed gas of $CF_4$ and oxygen, whereby the second insulating film 57b having a depressed portion at the side can be formed.

Alternatively, in the case where the first insulating film 56a is a silicon oxide film and the second insulating film 56b is a silicon nitride film, for example, the silicon nitride film can be selectively etched by a wet etching method using $H_3PO_4$. Since a wet etching method is capable of isotropic etching, the second insulating film 57b having a depressed portion at the side can be formed.

Figure 5D:
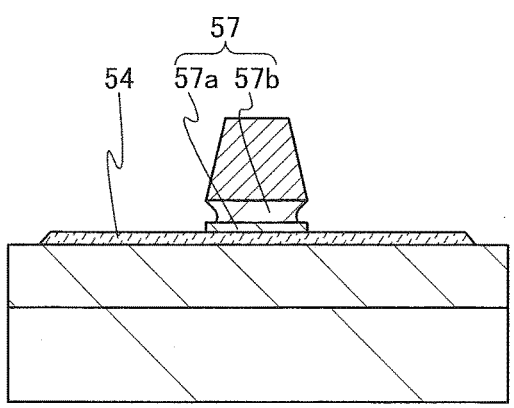

Next, as illustrated in FIG. 5D, the first insulating film 56a is etched using the gate electrode 59 as a mask to form the first insulating film 57a. Through the above steps, the gate insulating film 57 in which the first insulating film 57a and the second insulating film 57b are stacked is formed, and part of the oxide semiconductor film 54 can be exposed. Here, it is preferable to etch the first insulating film 56a selectively without etching the oxide semiconductor film 54 in order to improve the yield. Thus, a dry etching method is preferably used.

Figure 6A:
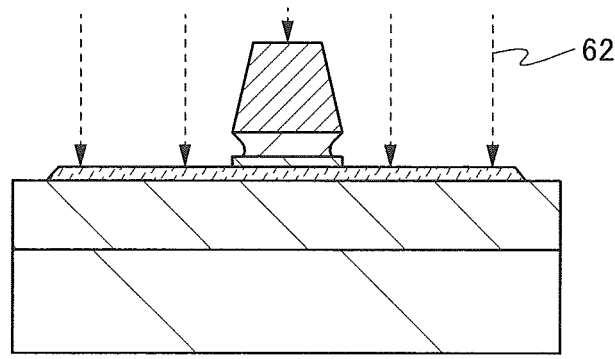
FIGS. 6A to 6C are cross-sectional views illustrating one embodiment of a manufacturing process of a semiconductor device.

Next, as shown in FIG. 6A, an impurity element 62 is added to the oxide semiconductor film 54, using the gate electrode 59 as a mask, in a manner similar to that in Embodiment 1. As a result, the impurity element is added to an exposed portion of the oxide semiconductor film 54. In addition, the impurity element is added to the oxide semiconductor film through the first insulating film 57a. Because of damages due to the addition of the impurity element 62, defects, typically, oxygen vacancies, are formed in the oxide semiconductor film 54.

Figure 6B:
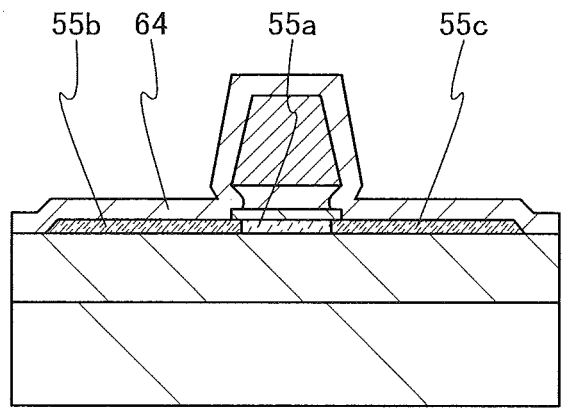
Figure 6C:
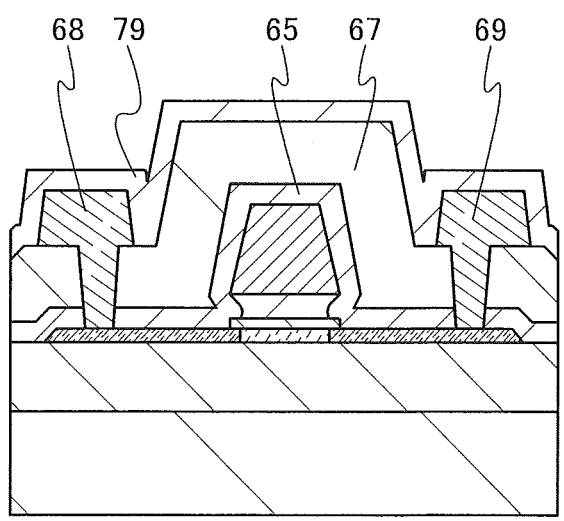

Next, as illustrated in FIG. 6B, an insulating film 64 containing hydrogen is formed over the oxide semiconductor film 54, the gate insulating film 57, and the gate electrode 59, in a manner similar to that in Embodiment 1.

The insulating film 64 contains hydrogen. Therefore, when a region of the oxide semiconductor film 54 where the impurity element is added and the insulating film 64 containing hydrogen are in contact with each other, the hydrogen contained in the insulating film 64 moves to the region of the oxide semiconductor film 54 where the impurity element is added. As a result, the oxide semiconductor film 55 that includes the first region 55a to which the impurity element is not added and the second regions 55b and 55c containing the impurity element and hydrogen is formed. Note that hydrogen contained in the insulating film 64 diffuses into part of the oxide semiconductor film 55 through the first insulating film 57a. Thus, part of the second regions 55b and 55c may overlap with the first insulating film 57a. Through the above steps, the second regions 55b and 55c that overlap with part of the gate electrode 59 can be formed.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. The heat treatment further increases the conductivity of the second regions 55b and 55c.

Next, as with Embodiment 1, an insulating film 66 may be formed. The insulating film 66 can reduce the parasitic capacitance between the gate electrode 59 and a pair of conductive films formed later.

Next, as with Embodiment 1, openings are formed in the insulating film 64 containing hydrogen and the insulating film 66 to expose parts of the second regions 55b and 55c, and then the pair of conductive films 68 and 69 are formed. Subsequently, an insulating film 79 is formed over the insulating film 67 and the pair of conductive films 68 and 69 (see FIG. 6C).

Through the above steps, the transistor can be manufactured.

<Method 2 for Manufacturing Semiconductor Device>

A modification example of a method for forming the first insulating film 57a and the second insulating film 57b will be described.

Figure 7A:
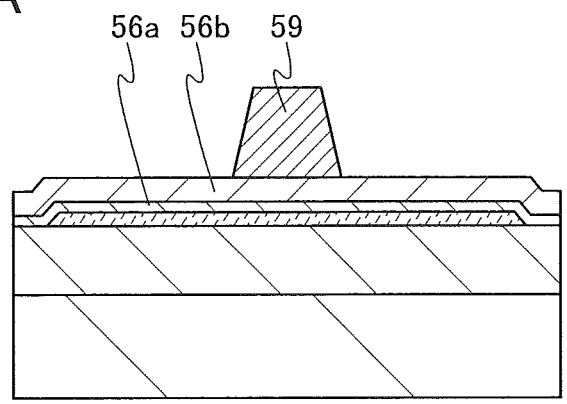
FIGS. 7A to 7C are cross-sectional views illustrating one embodiment of a manufacturing process of a semiconductor device.

As shown in FIG. 7A, the insulating film 53, the oxide semiconductor film 54, the first insulating film 56a, the second insulating film 56b, and the gate electrode 59 are formed over the substrate 51, in a manner similar to that in Embodiment 1.

Figure 7B:
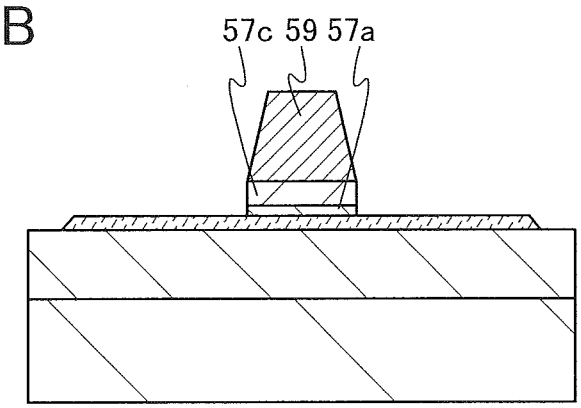

Next, as shown in FIG. 7B, each of the first insulating film 56a and the second insulating film 56b is etched using the gate electrode 59 as a mask, whereby the first insulating film 57a and the second insulating film 57c are formed.

It is preferable to etch the first insulating film 56a and the second insulating film 56b selectively without etching the oxide semiconductor film 54 in order to improve the yield. Accordingly, a dry etching method is employed here.

Figure 7C:
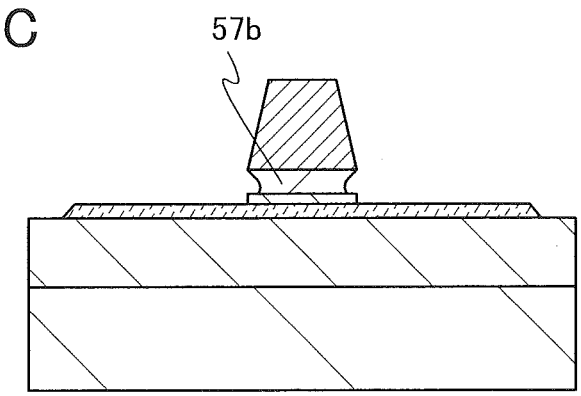

Next, as shown in FIG. 7C, the second insulating film 57c is etched to form the second insulating film 57b having a depressed portion at the side. Here, a silicon nitride film is used as the second insulating film 56b. The silicon nitride film can be etched isotropically by a dry etching method using a gas containing a fluorine compound such as $NF_3$, $SiF_4$, $CF_4$, or $C_4F_8$, or a mixed gas of $CF_4$ and oxygen, whereby the second insulating film 57b having a depressed portion at the side can be formed.

Then, through the steps similar to those of Embodiment 1 or Embodiment 2, the transistor can be manufactured.

The structures, the methods, and the like described in this embodiment can be combined as appropriate with any of the structures, the methods, and the like described in the other embodiments.

Embodiment 3

In this embodiment, a reduction in resistivity of the second regions 55b and 55c in the oxide semiconductor film 55 that occurs when the second regions 55b and 55c in the oxide semiconductor film 55 contain oxygen vacancies and hydrogen will be described. Specifically, $V_OH$ formed in the second regions 55b and 55c in the oxide semiconductor film 55 will be described. Note that in this embodiment, a state in which a hydrogen atom H exists in an oxygen vacancy $V_O$ is expressed as $V_OH$.

<(1) Ease of Formation and Stability of $V_OH$>

In the case where an oxide semiconductor film (hereinafter referred to as IGZO) is a crystal, H preferentially diffuses along the a-b plane at a room temperature. In heat treatment at 450° C., H diffuses along the a-b plane and in the c-axis direction. Here, description is made on whether H easily enters an oxygen vacancy $V_O$ if the oxygen vacancy $V_O$ exists in IGZO.

Figure 8:
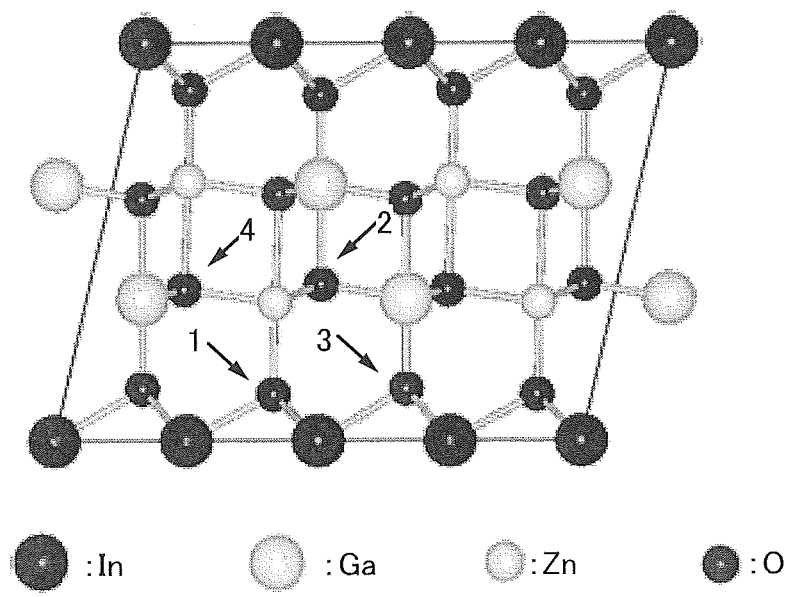
FIG. 8 illustrates a calculation model.

An $InGaZnO_4$ crystal model shown in FIG. 8 was used for calculation. The activation barrier ($E_a$) along the reaction path where H in $V_OH$ is released from $V_O$ and bonded to oxygen was calculated by a nudged elastic band (NEB) method. The calculation conditions are shown in Table 1.

TABLE 1

| Software | VASP |
|---|---|
| Calculation method | NEB method |
| Functional | GGA-PBE |
| Pseudo potential | PAW |
| Cut-off energy | 500 eV |
| k-point | 2 × 2 × 3 |

In the $InGaZnO_4$ crystal model, there are oxygen sites 1 to 4 as shown in FIG. 8 which differ from each other in metal elements bonded to oxygen and the number of bonded metal elements. Here, calculation was made on the oxygen sites 1 and 2 in which an oxygen vacancy $V_O$ is easily formed.

First, calculation was made on the oxygen site 1 in which an oxygen vacancy $V_O$ is easily formed, which is herein the oxygen site that was bonded to three In atoms and one Zn atom.

Figure 9A:
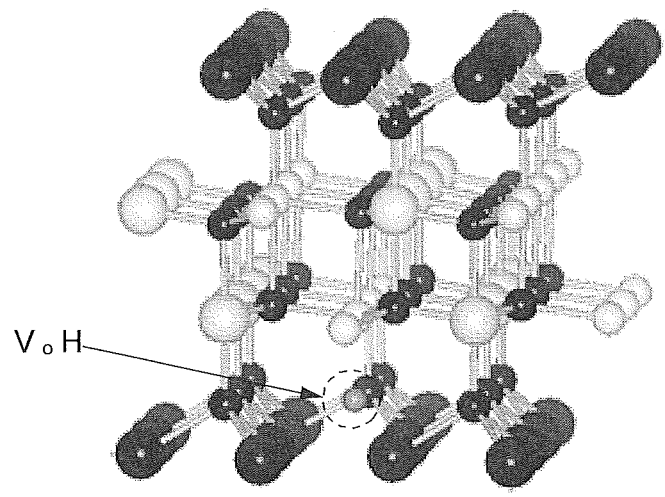
FIGS. 9A and 9B illustrate an initial state and a final state, respectively.
Figure 9B:
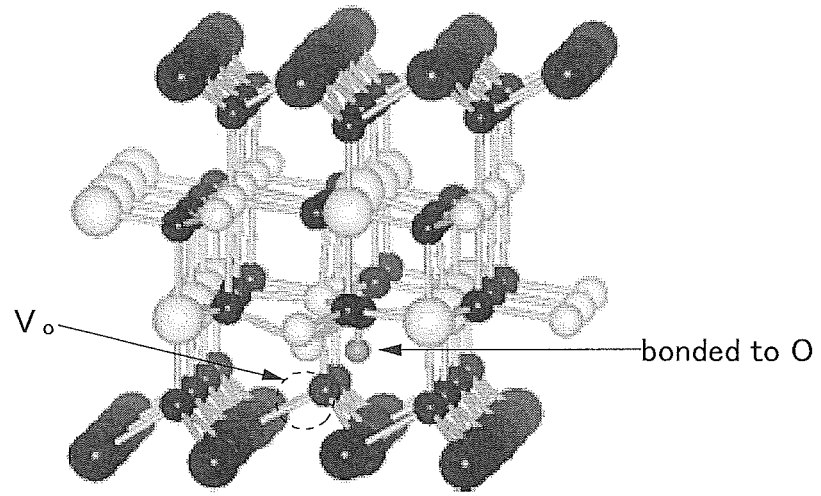
Figure 10:
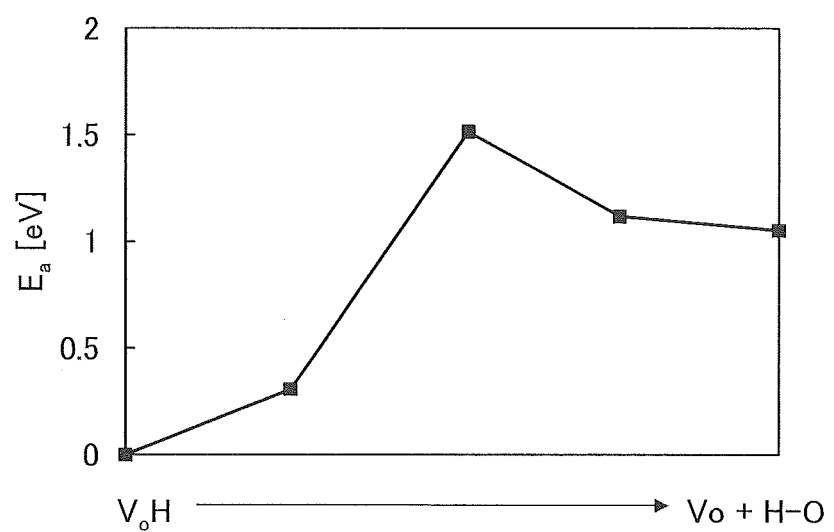
FIG. 10 illustrates an activation barrier.

FIG. 9A shows a model in the initial state and FIG. 9B shows a model in the final state. FIG. 10 shows the calculated activation barrier ($E_a$) in the initial state and the final state. Note that here, the initial state refers to a state in which H exists in an oxygen vacancy $V_O$ ($V_OH$), and the final state refers to a structure including an oxygen vacancy $V_O$ and a state in which H is bonded to oxygen bonded to one Ga atom and two Zn atoms (H—O).

From the calculation results, bonding of H in an oxygen vacancy $V_O$ to another oxygen atom needs an energy of approximately 1.52 eV, while entry of H bonded to O into an oxygen vacancy $V_O$ needs an energy of approximately 0.46 eV.

Reaction frequency (F) was calculated with use of the activation barriers ($E_a$) obtained by the calculation and Formula 1. In Formula 1, $k_B$ represents the Boltzmann constant and T represents the absolute temperature.

$$\Gamma = \nu \exp\left(-\frac{E_a}{k_B T}\right) \quad \text{[Formula 1]}$$

The reaction frequency at 350° C. was calculated on the assumption that the frequency factor ν=10^13 [1/sec]. The frequency of H transfer from the model shown in FIG. 9A to the model shown in FIG. 9B was 5.52×10⁰ [1/sec], whereas the frequency of H transfer from the model shown in FIG. 9B to the model shown in FIG. 9A was 1.82×10⁹ [1/sec]. This suggests that H diffusing in IGZO is likely to form V$_O$H if an oxygen vacancy V$_O$ exists in the neighborhood, and H is unlikely to be released from the oxygen vacancy V$_O$ once V$_O$H is formed.

Next, calculation was made on the oxygen site 2 in which an oxygen vacancy V$_O$ is easily formed, which is herein the oxygen site that was bonded to one Ga atom and two Zn atoms.

Figure 11A:
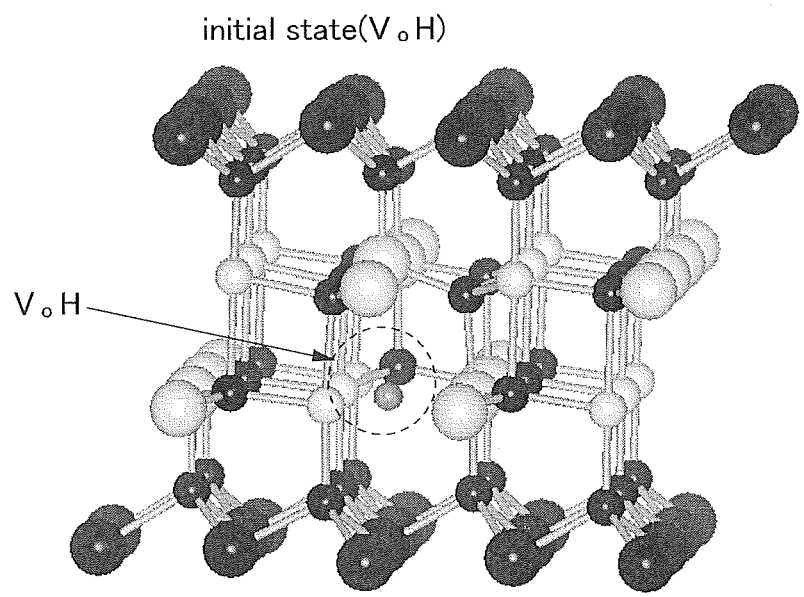
FIGS. 11A and 11B illustrate an initial state and a final state, respectively.
Figure 11B:
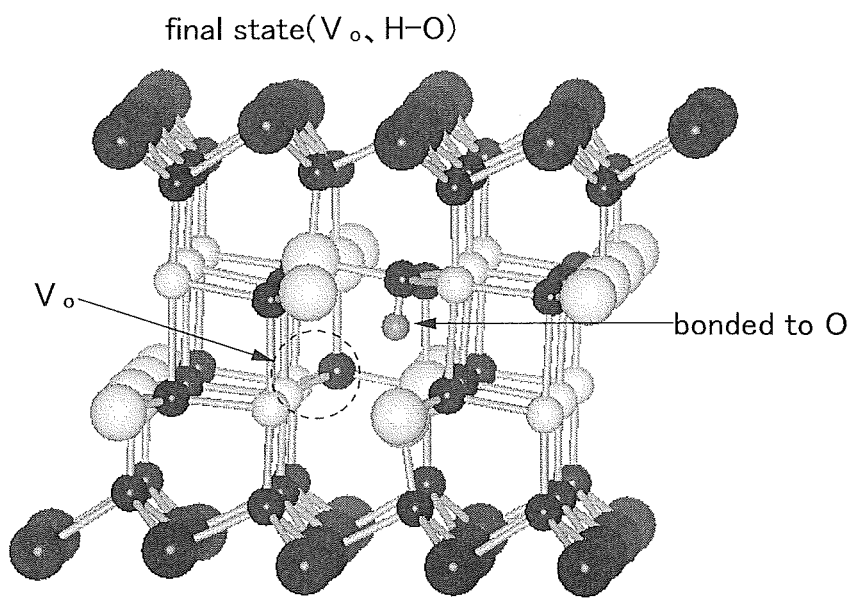
Figure 12:
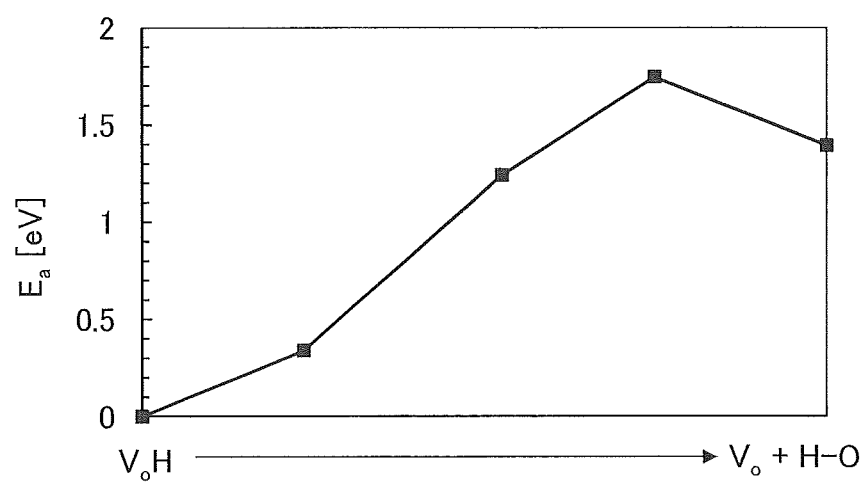
FIG. 12 illustrates an activation barrier.

FIG. 11A shows a model in the initial state and FIG. 11B shows a model in the final state. FIG. 12 shows the calculated activation barrier (E$_a$) in the initial state and the final state. Note that here, the initial state refers to a state in which H exists in an oxygen vacancy V$_O$ (V$_O$H), and the final state refers to a structure including an oxygen vacancy V$_O$ and a state in which H is bonded to oxygen bonded to one Ga atom and two Zn atoms (H—O).

From the calculation results, bonding of H in an oxygen vacancy V$_O$ to another oxygen atom needs an energy of approximately 1.75 eV, while entry of H bonded to O in an oxygen vacancy V$_O$ needs an energy of approximately 0.35 eV.

Reaction frequency (Γ) was calculated with use of the activation barriers (E$_a$) obtained by the calculation and the above Formula 1.

The reaction frequency at 350° C. was calculated on the assumption that the frequency factor ν=10^13 [1/sec]. The frequency of H transfer from the model shown in FIG. 11A to the model shown in FIG. 11B was 7.53×10⁻² [1/sec], whereas the frequency of H transfer from the model shown in FIG. 11B to the model shown in FIG. 11A was 1.44×10^10 [1/sec]. This suggests that H is unlikely to be released from the oxygen vacancy V$_O$ once V$_O$H is formed.

From the above results, it was found that H in IGZO easily diffused in heat treatment and if an oxygen vacancy V$_O$ existed, H was likely to enter the oxygen vacancy V$_O$ to be V$_O$H.

<(2) Transition Level of V$_O$H>

The calculation by the NEB method, which was described in <(1) Ease of formation and stability of V$_O$H>, indicates that in the case where an oxygen vacancy V$_O$ and H exist in IGZO, the oxygen vacancy V$_O$ and H easily form V$_O$H and V$_O$H is stable. To determine whether V$_O$H is related to a carrier trap, the transition level of V$_O$H was calculated.

The model used for calculation is the InGaZnO$_4$ crystal model (112 atoms). V$_O$H models of the oxygen sites 1 and 2 shown in FIG. 8 were made to calculate the transition levels. The calculation conditions are shown in Table 2.

TABLE 2

| Software | VASP |
| --- | --- |
| Model | InGaZnO$_4$ crystal (112 atoms) |
| Functional | HSE06 |
| Mixture ratio of exchange terms | 0.25 |
| Pseudo potential | GGA-PBE |
| Cut-off energy | 800 eV |
| k-point | 1 × 1 × 1 |

The mixture ratio of exchange terms was adjusted to have a band gap close to the experimental value. As a result, the band gap of the InGaZnO$_4$ crystal model without defects was 3.08 eV that is close to the experimental value, 3.15 eV.

The transition level (∈(q/q')) of a model having defect D can be calculated by the following Formula 2. Note that ΔE(D$^q$) represents the formation energy of defect D at charge q, which is calculated by Formula 3.

$$\varepsilon(q/q') = \frac{\Delta E(D^q) - \Delta E(D^{q'})}{q' - q} \quad \text{[Formula 2]}$$

$$\Delta E(D^q) = \quad \text{[Formula 3]}$$
$$E_{tot}(D^q) - E_{tot}(bulk) + \sum_i \Delta n_i \mu_i + q(\varepsilon_{VBM} + \Delta V_q + E_F)$$

In Formulae 2 and 3, E$_{tot}$(D$^q$) represents the total energy of the model having defect D at the charge q in, E$_{tot}$(bulk) represents the total energy in a model without defects, Δn$_i$ represents a change in the number of atoms i contributing to defects, μ$_i$ represents the chemical potential of atom i, ∈$_{VBM}$ represents the energy of the valence band maximum in the model without defects, ΔV$_q$ represents the correction term relating to the electrostatic potential, and E$_F$ represents the Fermi energy.

Figure 13:
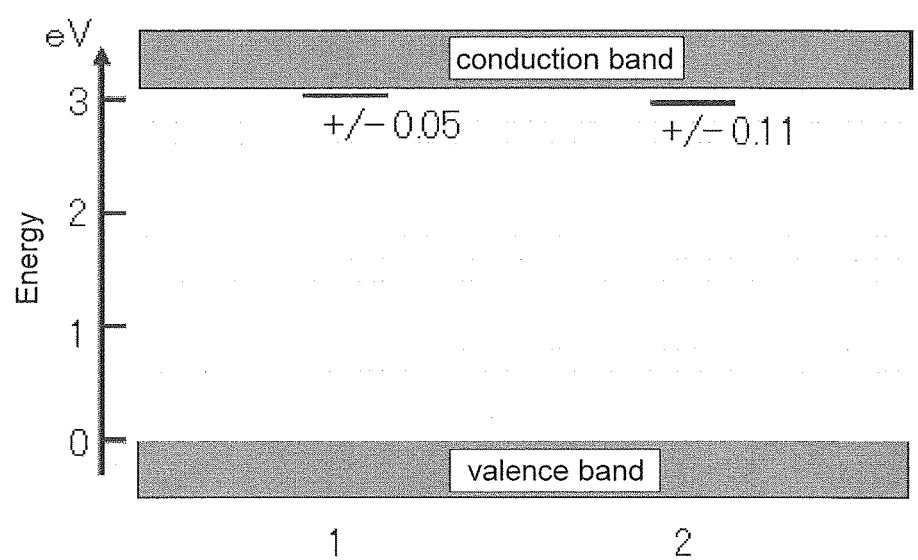
FIG. 13 illustrates the transition levels of $V_OH$.

FIG. 13 shows the transition levels of V$_O$H obtained from the above formulae. The numbers in FIG. 13 represent the depth from the conduction band minimum. In FIG. 13, the transition level of V$_O$H in the oxygen site 1 is at 0.05 eV from the conduction band minimum, and the transition level of V$_O$H in the oxygen site 2 is at 0.11 eV from the conduction band minimum. Therefore, these V$_O$H would be related to electron traps; that is, V$_O$H was found to behave as a donor. It was also found that IGZO including V$_O$H had conductivity.

<(3) Temperature Dependence of Resistivity>

The temperature dependence of the resistivity of a film formed using an oxide conductor (hereinafter referred to as an oxide conductor film) will be described with reference to FIG. 14.

In this embodiment, samples each including an oxide conductor film were fabricated. As the oxide conductor film, an oxide conductor film (OC_SiN$_x$) formed by making an oxide semiconductor film in contact with a silicon nitride film, an oxide conductor film (OC_Ar_dope+SiN$_x$) formed by making an oxide semiconductor film in contact with a silicon nitride film after addition of argon to the oxide semiconductor film with a doping apparatus, or an oxide conductor film (OC_Ar_plasma+SiN$_x$) formed by making an oxide semiconductor film in contact with a silicon nitride film after exposure of the oxide semiconductor film to argon plasma with a plasma treatment apparatus was formed. The silicon nitride film contains hydrogen.

A method for fabricating the sample including the oxide conductor film (OC_SiN$_x$) will be described below. A 400-nm-thick silicon oxynitride film was deposited over a glass substrate by a plasma CVD method and then exposed to oxygen plasma so that an oxygen ion was added to the silicon oxynitride film, whereby a silicon oxynitride film from which oxygen is released by being heated was formed. Next, a 100-nm-thick In—Ga—Zn oxide film was formed over the silicon oxynitride film by a sputtering method using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. Next, a 100-nm-thick silicon nitride film was deposited by a plasma CVD method. Then, the film was subjected to heat treatment in a mixed gas atmosphere of nitrogen and oxygen at 350° C.

A method for fabricating the sample including the oxide conductor film (OC_Ar_dope+SiN$_x$) will be described below. A 400-nm-thick silicon oxynitride film was deposited over a glass substrate by a plasma CVD method and then exposed to oxygen plasma so that an oxygen ion was added to the silicon oxynitride film, whereby a silicon oxynitride film from which oxygen is released by being heated was formed. Next, a 100-nm-thick In—Ga—Zn oxide film was formed over the silicon oxynitride film by a sputtering method using a sputtering target with an atomic ratio of In:Ga:Zn 1:1:1.2, and heat treatment at 450° C. in a nitrogen atmosphere and subsequently heat treatment at 450° C. in a mixed gas atmosphere of nitrogen and oxygen were performed. Next, with a doping apparatus, argon with a dose of $5×10^{14}/cm^2$ was added to the In—Ga—Zn oxide film at an accelerating voltage of 10 kV, whereby an oxygen vacancy was formed in the In—Ga—Zn oxide film. Next, a 100-nm-thick silicon nitride film was deposited by a plasma CVD method. Then, the film was subjected to heat treatment in a mixed gas atmosphere of nitrogen and oxygen at 350° C.

A method for fabricating the sample including the oxide conductor film (OC_Ar plasma+SiN$_x$) will be described below. A 400-nm-thick silicon oxynitride film was deposited over a glass substrate by a plasma CVD method and then exposed to oxygen plasma, whereby a silicon oxynitride film from which oxygen is released by being heated was formed. Next, a 100-nm-thick In—Ga—Zn oxide film was formed over the silicon oxynitride film by a sputtering method using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. Next, argon plasma was generated with a plasma treatment apparatus, and an accelerated argon ion was made to collide against the In—Ga—Zn oxide film, whereby an oxygen vacancy was generated. Next, a 100-nm-thick silicon nitride film was deposited by a plasma CVD method. Then, the film was subjected to heat treatment in a mixed gas atmosphere of nitrogen and oxygen at 350° C.

Figure 14:
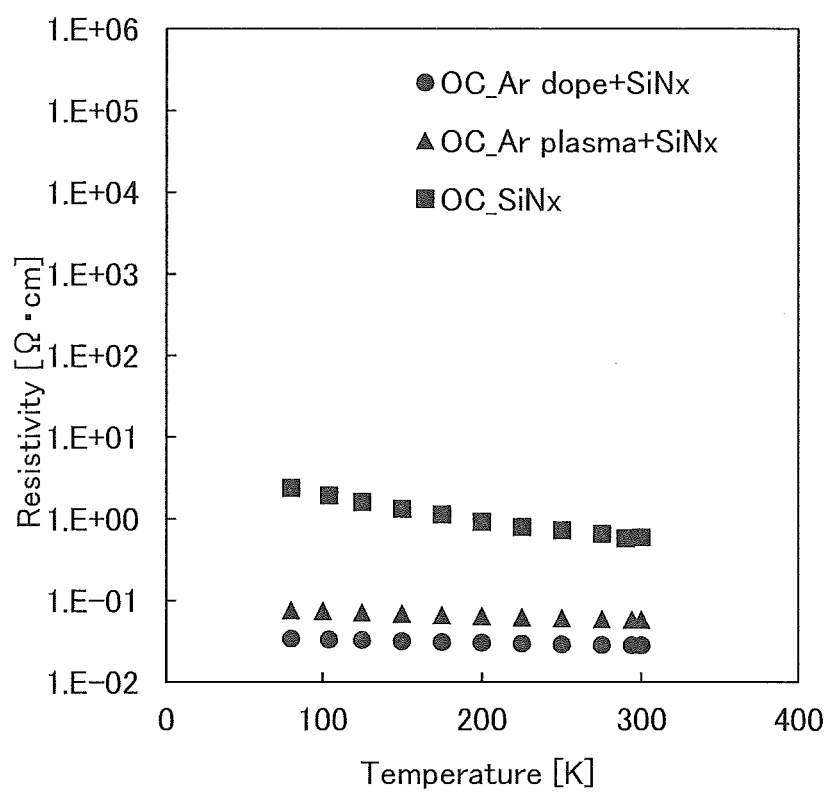
FIG. 14 illustrates temperature dependence of resistivity.

Next, FIG. 14 shows the measured resistivity of the samples. The measurement of resistivity was performed by the four probe Van der Pauw method. In FIG. 14, the horizontal axis represents measurement temperature, and the vertical axis represents resistivity. Measurement results of the oxide conductor film (OC_SiN$_x$) are plotted as squares, measurement results of the oxide conductor film (OC_Ar dope+SiN$_x$) are plotted as circles, and measurement results of the oxide conductor film (OC_Ar plasma+SiN$_x$) are plotted as triangles.

Note that although not shown in the graph, an oxide semiconductor film that is not in contact with a silicon nitride film has high resistivity that is difficult to measure. This indicates that the oxide conductor film has lower resistivity than the oxide semiconductor film.

As is seen from FIG. 14, there is a small variation in the resistivity of the oxide conductor film (OC_Ar dope+SiN$_x$) and the oxide conductor film (OC_Ar plasma+SiN$_x$), each of which includes oxygen vacancies and hydrogen. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used for a source region and a drain region of a transistor, an ohmic contact is made between the oxide conductor film and conductive films functioning as a source electrode and a drain electrode, thereby reducing the contact resistance between the oxide conductor film and the conductive films functioning as the source and drain electrodes. Since the temperature dependence of the resistivity of an oxide conductor is low, the amount of change in the contact resistance between the oxide conductor film and the conductive films functioning as the source and drain electrodes is small; thus, a highly reliable transistor can be fabricated.

The structures, the methods, and the like described in this embodiment can be combined as appropriate with any of the structures, the methods, and the like described in the other embodiments.

Embodiment 4

A structure of a gate electrode that can be employed in Embodiments 1 to 3 will be described with reference to FIG. 15.

Figure 15:
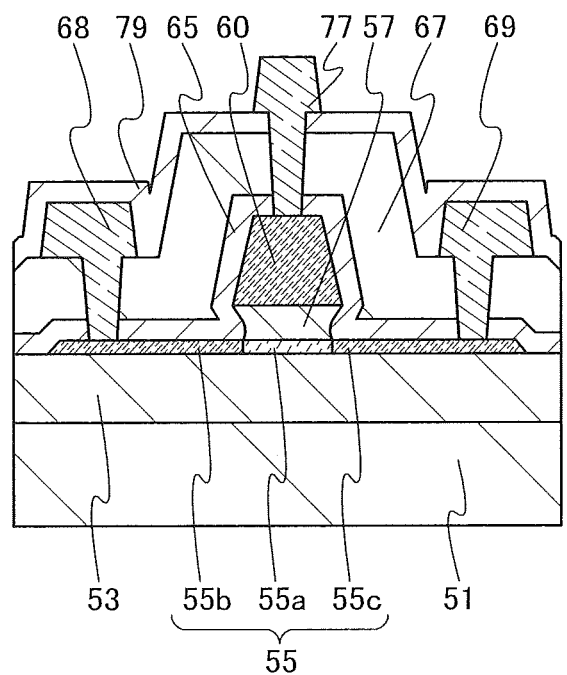
FIG. 15 is a cross-sectional view illustrating one embodiment of a semiconductor device.

In this embodiment, a gate electrode 60 may be formed of a conductive oxide semiconductor film similarly to the second regions 55b and 55c in the oxide semiconductor film 55 (see FIG. 15). The conductive oxide semiconductor film has a light-transmitting property like the oxide semiconductor film 55. This enables a transistor with a light-transmitting property to be manufactured.

Note that the conductive oxide semiconductor film has higher resistivity than a conductive film formed of a metal; thus, a conductive film 77 connected to the gate electrode 60 is preferably formed over the insulating film 67 in the case where a large substrate is used as the substrate 51.

Next, a method for manufacturing the transistor shown in FIG. 15 will be described with reference to FIGS. 2A to 2D and FIGS. 3A to 3C.

In a step shown in FIG. 2B, an oxide semiconductor film is formed instead of the gate electrode 59.

After that, the gate insulating film 57 is formed as shown in FIG. 2C, and then the impurity element 62 is added to the oxide semiconductor film 54 and the oxide semiconductor film over the gate insulating film 57.

Then, the insulating film 64 containing hydrogen is formed as shown in FIG. 3A, so that the gate electrode 60 can be formed of the conductive oxide semiconductor film (see FIG. 15) similarly to the second regions 55b and 55c in the oxide semiconductor film 55.

Next, the insulating film 67 having openings is formed, and then the pair of conductive films 68 and 69 are formed. After that, the insulating film 79 having an opening is formed, and then the conductive film 77 connected to the gate electrode 60 (see FIG. 15) is formed in a manner similar to that of the pair of conductive films 68 and 69.

Through the above-described steps, a self-aligned transistor can be manufactured.

The structures, the methods, and the like described in this embodiment can be combined as appropriate with any of the structures, the methods, and the like described in the other embodiments.

Embodiment 5

In this embodiment, a structure of an oxide semiconductor film that can be used in any of the above embodiments will be described with reference to FIG. 16A to 16D. Note that although description is made here using the transistor described in Embodiment 1, this embodiment can be applied as appropriate to the transistor described in any of the above embodiments.

Figure 16A:
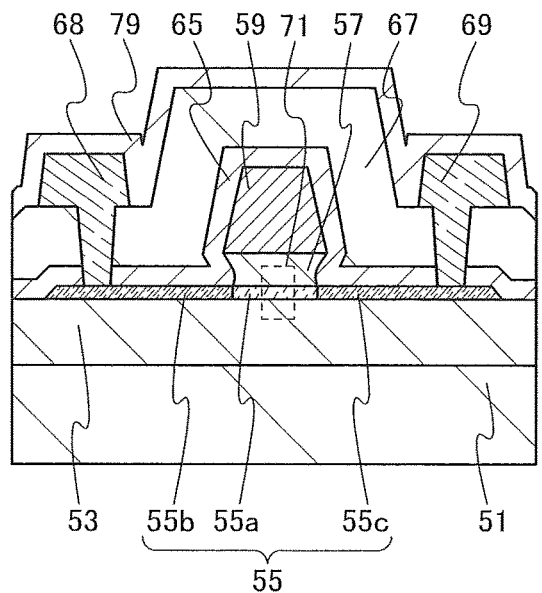
FIGS. 16A to 16D are cross-sectional views illustrating embodiments of a semiconductor device.
Figure 16B:
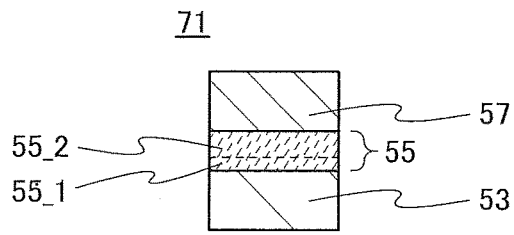
Figure 16C:
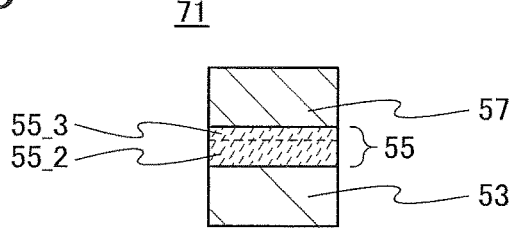
Figure 16D:
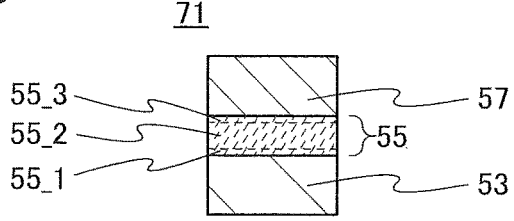

The transistor shown in FIG. 16A has the same structure as the transistor shown in FIG. 1A, which is described in Embodiment 1, except that the structure of the oxide semiconductor film 55 is different. FIGS. 16B to 16D are enlarged views of the region 71 including the oxide semiconductor film 55 and its surroundings.

As shown in FIG. 16B, the oxide semiconductor film 55 includes a first oxide semiconductor film 55_1 that is in contact with the insulating film 53 and a second oxide semiconductor film 55_2 that is in contact with the first oxide semiconductor film 55_1 and the gate insulating film 57.

Alternatively, as shown in FIG. 16C, the oxide semiconductor film 55 includes the second oxide semiconductor film 55_2 that is in contact with the insulating film 53 and a third oxide semiconductor film 55_3 that is in contact with the second oxide semiconductor film 55_2 and the gate insulating film 57.

Further alternatively, as illustrated in FIG. 16D, the oxide semiconductor film 55 includes the first oxide semiconductor film 55_1 that is in contact with the insulating film 53, the second oxide semiconductor film 55_2 that is in contact with the first oxide semiconductor film 55_1, and the third oxide semiconductor film 55_3 that is in contact with the second oxide semiconductor film 55_2 and the gate insulating film 57.

In the case where the first oxide semiconductor film 55_1, the second oxide semiconductor film 55_2, and the third oxide semiconductor film 55_3 are each an In-M-Zn oxide film (M is Al, Ti, Ga, Y, Zr, Sn, La, Ce, Nd, or Hf), when In:M:Zn=$x_1$:$y_1$:$z_1$ [atomic ratio] is satisfied in the first oxide semiconductor film 55_1 and the third oxide semiconductor film 55_3 and In:M:Zn=$x_2$:$y_2$:$z_2$ [atomic ratio] is satisfied in the second oxide semiconductor film 55_2, $y_1/x_1$ is larger than $y_2/x_2$, preferably $y_1/x_1$ is 1.5 times or more as large as $y_2/x_2$. It is further preferable that $y_1/x_1$ be twice or more as large as $y_2/x_2$. It is still further preferable that $y_1/x_1$ be three or more times as large as $y_2/x_2$. In that case, $y_1$ is preferably larger than or equal to $x_1$ in the first oxide semiconductor film 55_1 and the third oxide semiconductor film 55_3, in which case a transistor including the second oxide semiconductor film 55_2 can have stable electrical characteristics. However, when $y_1$ is three or more times as large as $x_1$, the field-effect mobility of the transistor including the second oxide semiconductor film 55_2 is reduced. Thus, it is preferable that $y_1$ be less than three times $x_1$.

In the case where the second oxide semiconductor film 55_2 is an In-M-Zn oxide film (M is Ga, Y, Zr, La, Ce, or Nd) and a target having the atomic ratio of metal elements of In:M:Zn=$x_1$:$y_1$:$z_1$ is used for forming the second oxide semiconductor film 55_2, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the second oxide semiconductor film 55_2. Typical examples of the atomic ratio of In to M and Zn of the target are 1:1:1, 1:1:1.2, 2:1:1.5, 2:1:2.3, 2:1:3, and 3:1:2.

In the case where the first oxide semiconductor film 55_1 and the third oxide semiconductor film 55_3 are each an In-M-Zn oxide film (M is Ga, Y, Zr, La, Ce, or Nd) and a target having an atomic ratio of metal elements of In:M:Zn=$x_2$:$y_2$:$z_2$ is used for forming the first oxide semiconductor film 55_1 and the third oxide semiconductor film 55_3, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed as the first oxide semiconductor film 55_1 and the third oxide semiconductor film 55_3. Typical examples of the atomic ratio of In to M and Zn in the target are 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, and 1:6:9.

Note that the proportion of each metal element in the atomic ratio of each of the first oxide semiconductor film 55_1, the second oxide semiconductor film 55_2, and the third oxide semiconductor film 55_3 varies within a range of ±40% of any of the above atomic ratios as an error.

The atomic ratio is not limited to the above, and the atomic ratio may be appropriately set in accordance with required semiconductor characteristics.

Furthermore, the first oxide semiconductor film 55_1 and/or the third oxide semiconductor film 55_3 can be formed using gallium oxide. The use of gallium oxide for the first oxide semiconductor film 55_1 and the third oxide semiconductor film 55_3 can reduce leakage current of the transistor.

In FIG. 16D, the first oxide semiconductor film 55_1 and the third oxide semiconductor film 55_3 may have the same composition. For example, an In—Ga—Zn oxide having an atomic ratio of In:Ga:Zn=1:3:2, 1:3:4, or 1:4:5 may be used for the first oxide semiconductor film 55_1 and the third oxide semiconductor film 55_3.

Alternatively, in FIG. 16D, the first oxide semiconductor film 55_1 and the third oxide semiconductor film 55_3 may have different compositions. For example, an In—Ga—Zn oxide having an atomic ratio of In:Ga:Zn=1:3:2 may be used for the first oxide semiconductor oxide film 55_1, and an In—Ga—Zn oxide having an atomic ratio of In:Ga:Zn=1:3:4 or 1:4:5 may be used for the third oxide semiconductor film 55_3.

The thicknesses of the first oxide semiconductor film 55_1 and the third oxide semiconductor film 55_3 are each greater than or equal to 3 nm and less than or equal to 100 nm, preferably greater than or equal to 3 nm and less than or equal to 50 nm. The thickness of the second oxide semiconductor film 55_2 is greater than or equal to 3 nm and less than or equal to 200 nm, preferably greater than or equal to 3 nm and less than or equal to 100 nm, further preferably greater than or equal to 3 nm and less than or equal to 50 nm. Note that when the thickness of each of the first oxide semiconductor film 55_1 and the third oxide semiconductor film 55_3 is smaller than that of the second oxide semiconductor film 55_2, the amount of threshold voltage shift of the transistor can be reduced. In addition, to prevent oxygen contained in the third oxide semiconductor film 55_3 from diffusing to the pair of conductive films 68 and 69 and thus oxidizing the pair of conductive films 68 and 69, it is preferable that the thickness of the third oxide semiconductor film 55_3 be small.

The interface between the first oxide semiconductor film 55_1 and the second oxide semiconductor film 55_2 and the interface between the second oxide semiconductor film 55_2 and the third oxide semiconductor film 55_3 can be observed by scanning transmission electron microscopy (STEM).

Any of the crystal structures of the oxide semiconductor film 55 described in Embodiment 1 can be used as appropriate for the first oxide semiconductor film 55_1, the second oxide semiconductor film 55_2, and the third oxide semiconductor film 55_3.

By providing an oxide semiconductor film in which oxygen vacancies are less likely to be generated than in the second oxide semiconductor film 55_2 on and/or under the second oxide semiconductor film 55_2 so as to be in contact with the second oxide semiconductor film 55_2, oxygen vacancies in the second oxide semiconductor film 55_2 can be reduced. In addition, the second oxide semiconductor film 55_2 is in contact with the first oxide semiconductor film 55_1 and/or the third oxide semiconductor film 55_3 containing one or more metal elements contained in the second oxide semiconductor film 55_2; thus, the interface between the first oxide semiconductor film 55_1 and the second oxide semiconductor film 55_2 and the interface between the second oxide semiconductor film 55_2 and the third oxide semiconductor film 55_3 have extremely low interface state density. Thus, oxygen vacancies in the second oxide semiconductor film 55_2 can be reduced.

In the case where the second oxide semiconductor film 55_2 is in contact with an insulating film containing a different constituent element (e.g., a gate insulating film including a silicon oxide film), an interface state might be formed and the interface state might form a channel. At this time, a second transistor having a different threshold voltage appears, so that an apparent threshold voltage of the transistor is varied. However, since the first oxide semiconductor film 55_1 that contains one or more metal elements contained in the second oxide semiconductor film 55_2 is in contact with the second oxide semiconductor film 55_2, an interface state is not easily formed at the interface between the first oxide semiconductor film 55_1 and the second oxide semiconductor film 55_2. Thus, with the first oxide semiconductor film 55_1, variations in the electrical characteristics of the transistor, such as threshold voltage, can be reduced.

In the case where a channel is formed at the interface between the gate insulating film 57 and the second oxide semiconductor film 55_2, interface scattering occurs at the interface and the field-effect mobility of the transistor is decreased. However, since the third oxide semiconductor film 55_3 that contains one or more metal elements contained in the second oxide semiconductor film 55_2 is in contact with the second oxide semiconductor film 55_2, carrier scattering does not easily occur at the interface between the second oxide semiconductor film 55_2 and the third oxide semiconductor film 55_3 and the field-effect mobility of the transistor can be increased.

The first oxide semiconductor film 55_1 and the third oxide semiconductor film 55_3 also function as barrier films that prevent formation of an impurity state due to the entry of the constituent elements of the insulating film 53 and the gate insulating film 57 into the second oxide semiconductor film 55_2.

For example, in the case where an insulating film containing silicon is used as the insulating film 53 and the gate insulating film 57, silicon contained in the insulating film 53 and the gate insulating film 57 or carbon that might be contained in the insulating film 53 and the gate insulating film 57 might enter the first oxide semiconductor film 55_1 and/or the third oxide semiconductor film 55_3 at a depth of several nanometers from the interfaces. When an impurity such as silicon or carbon enters the second oxide semiconductor film 55_2, an impurity state is formed. The impurity state serves as a donor and generates an electron, so that the second oxide semiconductor film 55_2 might become an n-type.

However, when the thicknesses of the first oxide semiconductor film 55_1 and the third oxide semiconductor film 55_3 are larger than several nanometers, the impurity such as silicon or carbon that has entered the first oxide semiconductor film 55_1 and the third oxide semiconductor film 55_3 does not reach the second oxide semiconductor film 55_2, so that the influence of impurity states is reduced.

Thus, the transistor described in this embodiment is a transistor in which variations in the electrical characteristics such as threshold voltage are reduced.

<Band Structure>

Next, band structures along given cross sections of the transistor shown in FIG. 17A, which is a typical example of a transistor described in this embodiment, will be described. An enlarged view of a region indicated by a dashed square 71a is shown in FIG. 17B, an enlarged view of a region indicated by a dashed square 71b is shown in FIG. 17C, and an enlarged view of a region indicated by a dashed square 71c is shown in FIG. 17D. That is, the transistor shown in FIG. 17A includes an oxide semiconductor film 55 including a first region 55a and second regions 55b and 55c. In addition, as shown in FIG. 17B, the first region 55a includes a first region 55_2a and a first region 55_3a between an insulating film 53 and a gate insulating film 57. In addition, as illustrated in FIG. 17C, the second region 55b includes a second region 55_2b and a second region 55_3b between the insulating film 53 and an insulating film 65 containing hydrogen. In addition, as illustrated in FIG. 17D, the second region 55c includes a second region 55_2c and a second region 55_3c between the insulating film 53 and the insulating film 65 containing hydrogen.

Figure 17A:
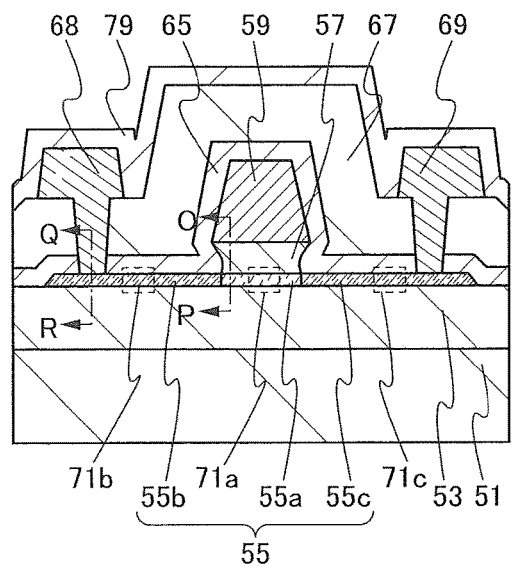
FIGS. 17A to 17F illustrate structures and band diagrams of a transistor of one embodiment of the present invention.
Figure 17B:
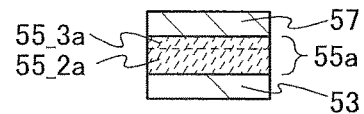
Figure 17C:
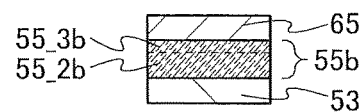
Figure 17D:
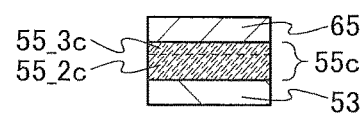
Figure 17E:
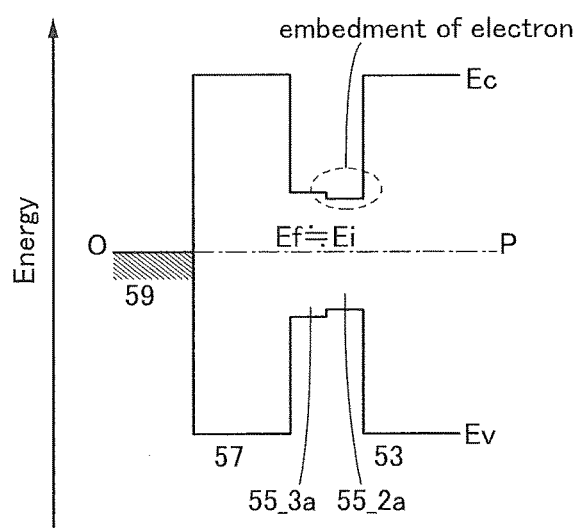

A band structure in the O—P cross section including a channel region of the transistor shown in FIG. 17A is illustrated in FIG. 17E. The first region 55_3a is assumed to have a slightly larger energy gap than the first region 55_2a. The insulating film 53 and the gate insulating film 57 are each assumed to have a sufficiently larger energy gap than the first region 55_2a and the first region 55_3a. Furthermore, the Fermi levels (denoted by Ef) of the first region 55_2a, the first region 55_3a, the insulating film 53, and the gate insulating film 57 are assumed to be equal to the intrinsic Fermi levels thereof (denoted by Ei). Furthermore, the work function of the gate electrode 59 is assumed to be equal to the Fermi level. Furthermore, the energy at the conduction band minimum is denoted by Ec, and the energy at the valence band maximum is denoted by Ev.

When a gate voltage is set to be higher than or equal to the threshold voltage of the transistor, an electron flows preferentially in the first region 55_2a owing to the difference between the energies of the conduction band minimums of the first region 55_2a and the first region 55_3a. That is, it is probable that an electron is embedded in the first region 55_2a.

Accordingly, in the transistor according to one embodiment of the present invention, the embedment of an electron reduces the influence of interface scattering. Therefore, resistance in the channel region of the transistor according to one embodiment of the present invention is low.

Figure 17F:
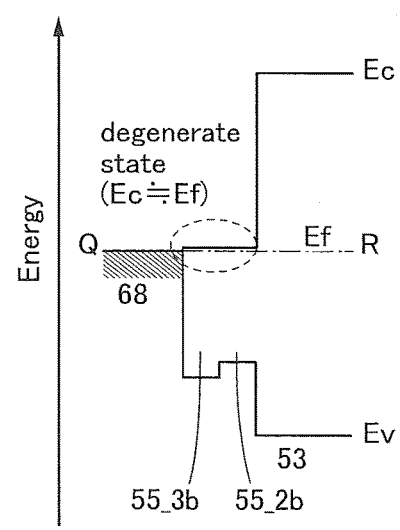

Next, FIG. 17F illustrates a band structure in the Q-R cross section including a source region or a drain region of the transistor shown in FIG. 17A. Note that the second regions 55_2b and 55_2c and the second regions 55_3b and 55_3c are assumed to be in a degenerate state. Furthermore, the energy of the conduction band minimum in the second region 55_2b is assumed to be approximately the same as the Fermi level of the first region 55_2a. Furthermore, the energy of the conduction band minimum in the second region 55_3b is assumed to be approximately the same as the Fermi level of the first region 55_3a. The same applies to the second region 55_2c and the second region 55_3c.

At this time, an ohmic contact is made between the conductive film 68 and the second region 55_3b because an energy barrier therebetween is sufficiently low. An ohmic contact is also made between the second region 55_3b and the second region 55_2b. Similarly, an ohmic contact is made between the conductive film 69 and the second region 55_3c because an energy barrier therebetween is sufficiently low. An ohmic contact is also made between the second region 55_3c and the second region 55_2c. Therefore, electron transfer is conducted smoothly between the conductive films 68 and 69 and the first regions 55_2a and 55_3a.

As described above, the transistor of one embodiment of the present invention is a transistor in which resistance in the channel region is low, since electron transfer between the channel region and the source and drain electrodes is conducted smoothly. That is, the transistor has excellent switching characteristics.

The structures, the methods, and the like described in this embodiment can be combined as appropriate with any of the structures, the methods, and the like described in the other embodiments.

Embodiment 6

Figure 18A:
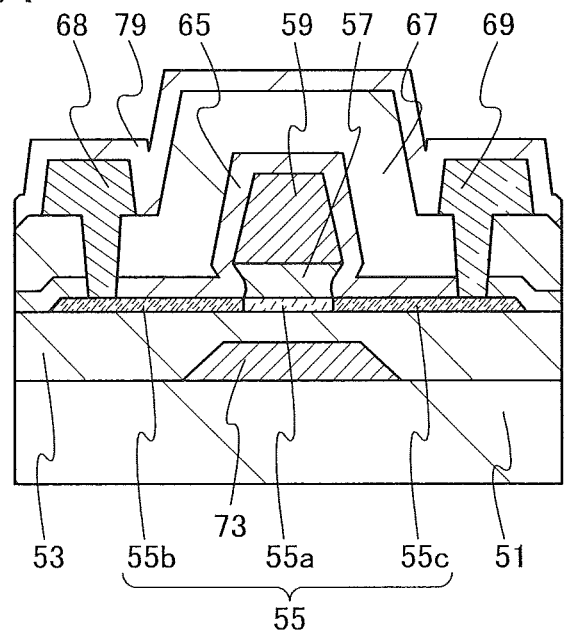
FIGS. 18A and 18B are cross-sectional views illustrating one embodiment of a semiconductor device.

In this embodiment, a structure of a transistor that can be used in the above-described Embodiments will be described with reference to FIGS. 18A and 18B. Note that although description is made here using the transistor described in Embodiment 1, this embodiment can be applied as appropriate to the transistor described in the above-described Embodiments. FIG. 18A is a cross-sectional view of the transistor in the channel length direction, and FIG. 18B is a cross-sectional view of the transistor in the channel width direction.

Figure 18B:
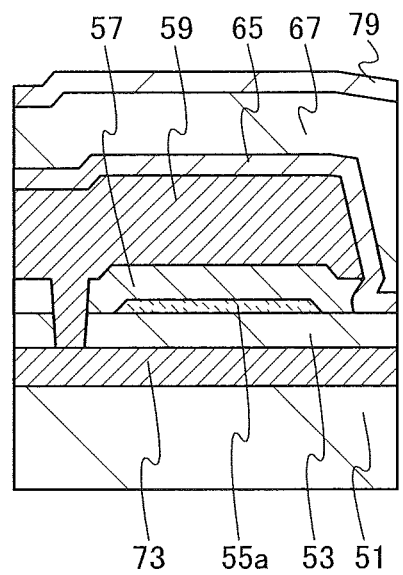

As illustrated in FIGS. 18A and 18B, a transistor described in this embodiment includes a gate electrode 73 that is overlapped with the oxide semiconductor film 55 with the insulating film 53 provided therebetween.

By making the potential of the gate electrode 73 different from the potential of the gate electrode 59, the threshold voltage of the transistor can be controlled and the transistor can be a normally-off transistor. Furthermore, by making the gate electrode 59 and the gate electrode 73 connected to each other through an opening provided in the insulating film 53 and the gate insulating film 57 as shown in FIG. 18B, the potential of the gate electrode 73 can be the same as the potential of the gate electrode 59, whereby on-state current of the transistor can be increased.

The structures, the methods, and the like described in this embodiment can be combined as appropriate with any of the structures, the methods, and the like described in the other embodiments.

Embodiment 7

In this embodiment, one embodiment of an oxide semiconductor film that can be applied to an oxide semiconductor film in any of the transistors described in the above embodiments will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

<CAAC-OS Film>

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

FIG. 19A is a high-resolution cross-sectional TEM image of a CAAC-OS film. FIG. 19B is a high-resolution cross-sectional TEM image obtained by enlarging the image of FIG. 19A. In FIG. 19B, atomic arrangement is highlighted for easy understanding.

FIG. 19C is Fourier transform images of regions each surrounded by a circle (the diameter is about 4 nm) between A and O and between O and A' in FIG. 19A. C-axis alignment can be observed in each region in FIG. 19C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Figure 20A:
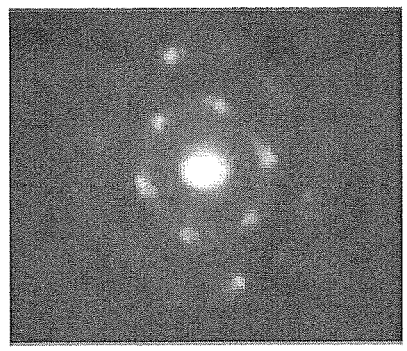
FIGS. 20A and 20B show nanobeam electron diffraction patterns of oxide semiconductor films and FIGS. 20C and 20D illustrate an example of a transmission electron diffraction measurement apparatus.

Note that in an electron diffraction pattern of the CAAC-OS film, spots (bright spots) having alignment are shown. For example, when electron diffraction with an electron beam having a diameter of, for example, 1 nm or more and 30 nm or less (such electron diffraction is also referred to as nanobeam electron diffraction) is performed on the top surface of the CAAC-OS film, the spots are observed (see FIG. 20A).

From the results of the high-resolution cross-sectional TEM image and the high-resolution plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment.

As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Polycrystalline Oxide Semiconductor Film>

Next, a polycrystalline oxide semiconductor film will be described.

In a high-resolution TEM image of the polycrystalline oxide semiconductor film, crystal grains can be observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a grain boundary may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

<Microcrystalline Oxide Semiconductor Film>

Next, a microcrystalline oxide semiconductor film will be described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes, for example.

Figure 20B:
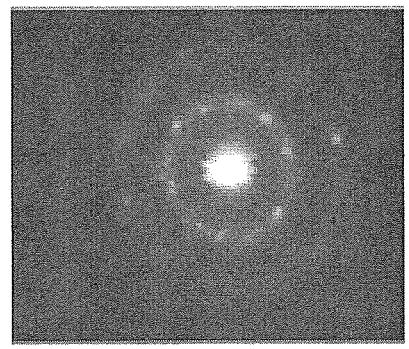

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an MUD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots are observed (see FIG. 20B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

<Amorphous Oxide Semiconductor Film>

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor film can be used in a transistor that needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is substantially equivalent to the lattice spacing (also referred to as d value) on the (009) plane, and is 0.29 nm according to crystal structure analysis. Thus, each of the lattice fringes in which the spacing therebetween is from 0.28 nm to 0.30 nm is regarded to correspond to the a-b plane of the $InGaZnO_4$ crystal, focusing on the lattice fringes in the high-resolution TEM image. Let the maximum length in the region in which the lattice fringes are observed be the size of crystal part of the amorphous-like OS film and the nc-OS film. Note that the crystal part whose size is 0.8 nm or larger is selectively evaluated.

Figure 37:
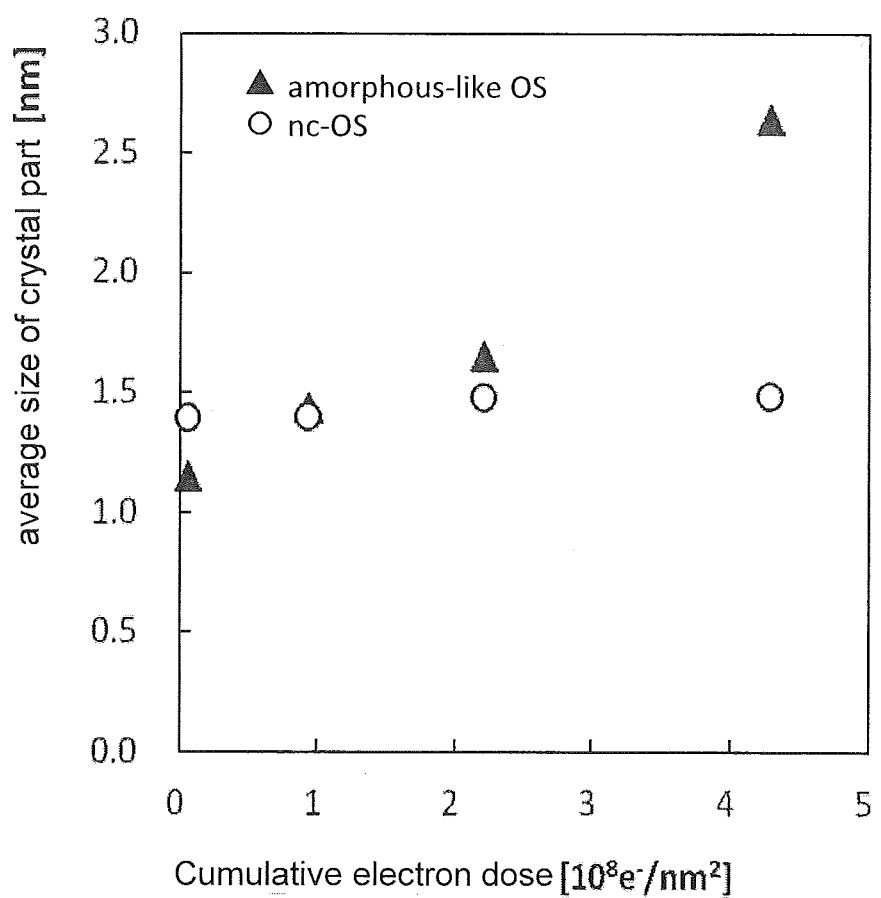
FIG. 37 is a graph showing changes in crystal parts by electron irradiation.

FIG. 37 shows examination results of change in average size of crystal parts (20-40 points) in the amorphous-like OS film and the nc-OS film, obtained using the high-resolution TEM images. As in FIG. 37, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8 e^-/nm^2$. In contrast, the crystal part size in the good-quality nc-OS film shows little change from the start of electron irradiation to the total amount of electron irradiation of $4.2 \times 10^8 e^-/nm^2$ regardless of the amount of electron irradiation.

Furthermore, in FIG. 37, by linear approximation of the change in the crystal part size in the amorphous-like OS film and the nc-OS film and extrapolation to the total amount of electron irradiation of $0 e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 20C:
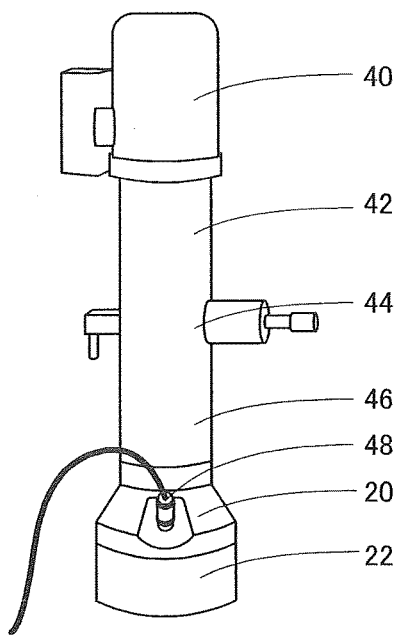

FIG. 20C illustrates a transmission electron diffraction measurement apparatus which includes an electron gun chamber 40, an optical system 42 below the electron gun chamber 40, a sample chamber 44 below the optical system 42, an optical system 46 below the sample chamber 44, an observation chamber 20 below the optical system 46, a camera 48 installed in the observation chamber 20, and a film chamber 22 below the observation chamber 20. The camera 48 is toward the inside of the observation chamber 20. Note that the film chamber 22 is not necessarily provided.

Figure 20D:
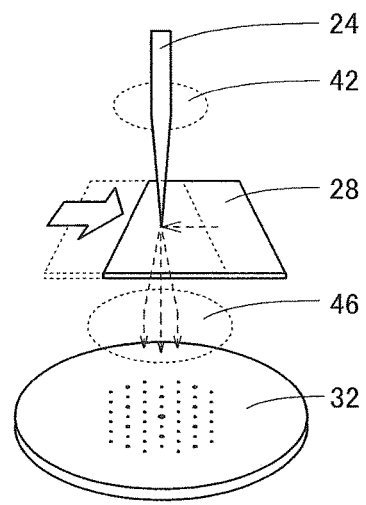

FIG. 20D illustrates an internal structure of the transmission electron diffraction measurement apparatus illustrated in FIG. 20C. In the transmission electron diffraction measurement apparatus, a substance 28 which is positioned in the sample chamber 44 is irradiated with electrons emitted from an electron gun installed in the electron gun chamber 40 through the optical system 42. The electrons that have passed through the substance 28 enter a fluorescent plate 32 provided in the observation chamber 20 through the optical system 46. On the fluorescent plate 32, a pattern corresponding to the intensity of entered electron appears, which allows measurement of a transmission electron diffraction pattern.

The camera 48 is installed so as to face the fluorescent plate 32 and can take a picture of a pattern appearing in the fluorescent plate 32. An angle formed by a straight line which passes through the center of a lens of the camera 48 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 48 becomes larger. Note that if the angle is obtained in advance, the distortion of an obtained transmission electron diffraction pattern can be corrected. Note that the camera 48 can be provided in the film chamber 22 in some cases. For example, the camera 48 may be provided in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 44. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing (or by scanning) the irradiation position of the electrons 24 that are a nanobeam in the substance as illustrated in FIG. 20D. At this time, when the substance 28 is a CAAC-OS film, a diffraction pattern shown in FIG. 20A can be observed. When the substance 28 is an nc-OS film, a diffraction pattern shown in FIG. 20B can be observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region other than that of the CAAC region is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 21A:
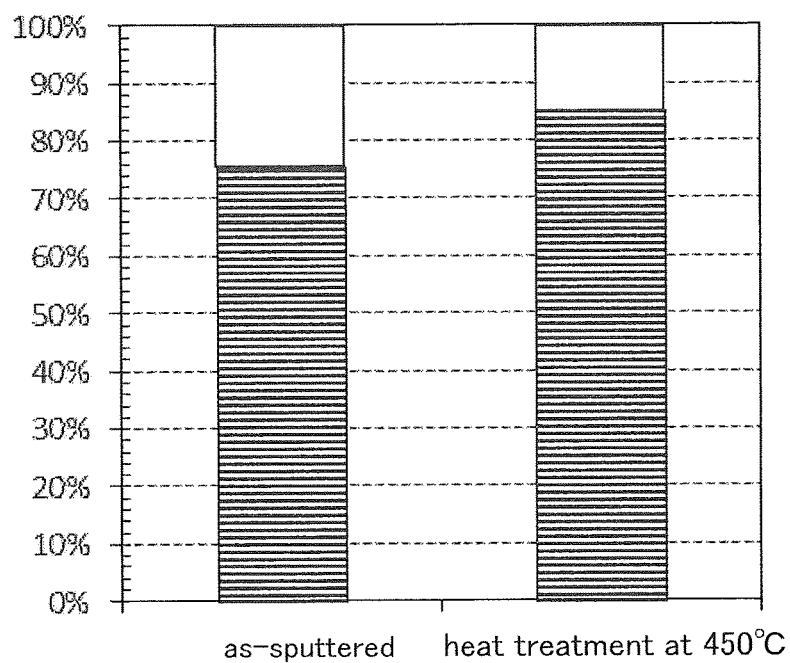
FIG. 21A shows an example of structural analysis by transmission electron diffraction measurement and FIGS. 21B and 21C show high-resolution plan-view TEM images.

FIG. 21A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion, of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 21B:
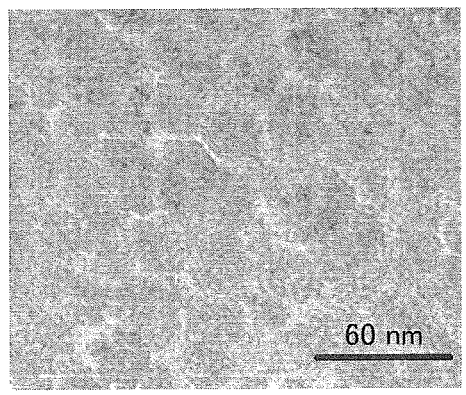
Figure 21C:
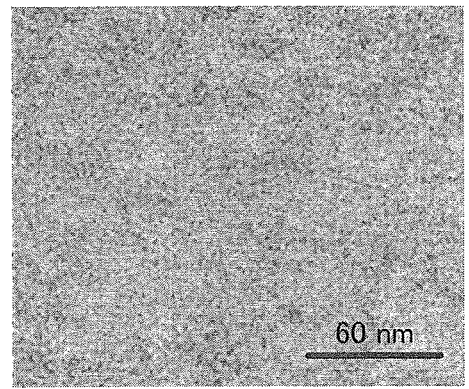

FIGS. 21B and 21C are high-resolution plan-view TEM images of the CAAC-OS film obtained just after the deposition and the CAAC-OS film subjected to the heat treatment at 450° C., respectively. Comparison between FIGS. 21B and 21C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

<Deposition Model>

Examples of deposition models of a CAAC-OS film and an nc-OS film will be described below.

Figure 23A:
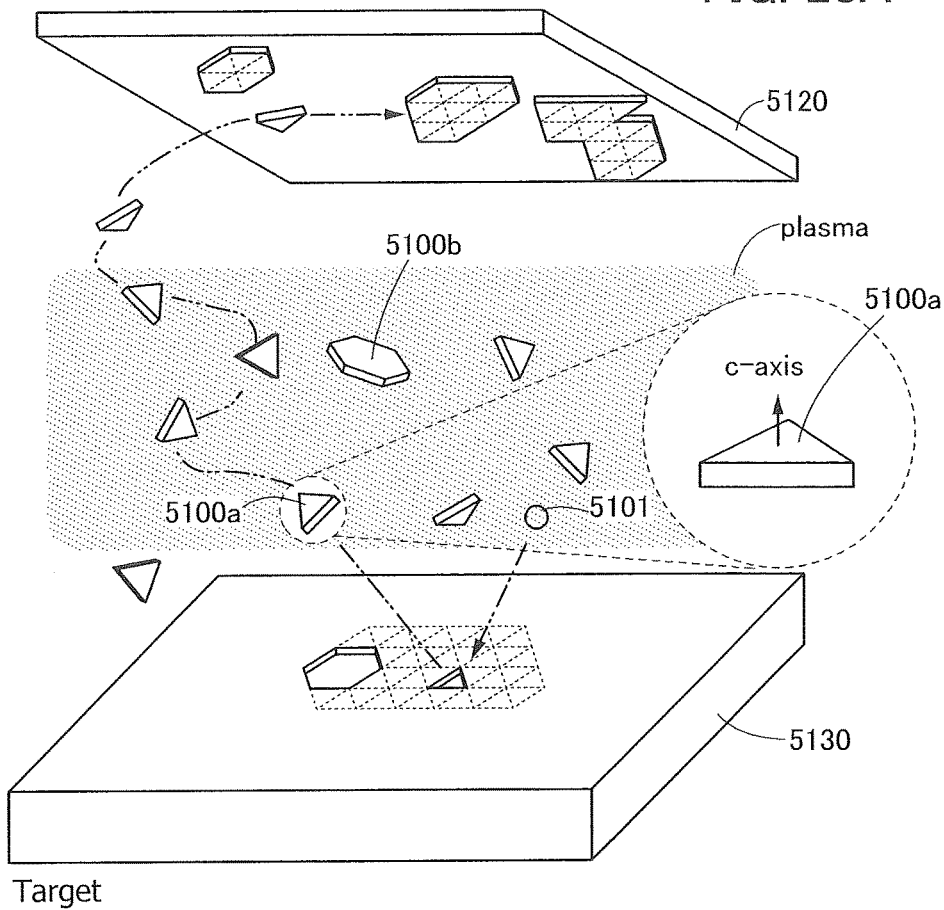
FIG. 23A schematically illustrates a CAAC-OS deposition model and FIGS. 23B and 23C are cross-sectional views of pellets and a CAAC-OS.

FIG. 23A is a schematic diagram of a deposition chamber illustrating a state where a CAAC-OS film is deposited by a sputtering method.

A target 5130 is attached to a backing plate. Under the target 5130 and the backing plate, a plurality of magnets are provided. The plurality of magnets cause a magnetic field over the target 5130. A sputtering method in which the disposition speed is increased by utilizing a magnetic field of magnets is referred to as a magnetron sputtering method.

The target 5130 has a polycrystalline structure in which a cleavage plane exists in at least one crystal grain. Note that the details of the cleavage plane will be described later.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and the pressure in the deposition chamber is controlled to higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5130, and plasma is observed. Note that the magnetic field over the target 5130 forms a high-density plasma region. In the high-density plasma region, the deposition gas is ionized, so that an ion 5101 is generated. Examples of the ion 5101 include an oxygen cation ($O^+$) and an argon cation ($Ar^+$).

The ion 5101 is accelerated toward the target 5130 side by an electric field, and collides with the target 5130 eventually. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining greater than or equal to two and less than or equal to six triangles. For example, a square (rhombus) is formed by combining two triangles (regular triangles) in some cases.

The thickness of the pellet 5100 is determined depending on the kind of deposition gas and the like. The thicknesses of the pellets 5100 are preferably uniform; the reasons thereof will be described later. In addition, the sputtered particle preferably has a pellet shape with a small thickness as compared to a dice shape with a large thickness.

Figure 25:
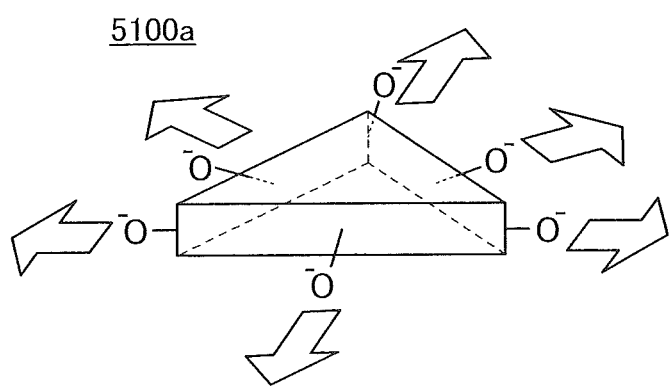
FIG. 25 illustrates a pellet.

The pellet 5100 receives a charge when passing through the plasma, so that side surfaces thereof are negatively or positively charged in some cases. The pellet 5100 includes an oxygen atom on its side surface, and the oxygen atom may be negatively charged. For example, a case in which the pellet 5100*a* includes, on its side surfaces, oxygen atoms that are negatively charged is illustrated in FIG. 25. As in this view, when the side surfaces are charged in the same polarity, charges repel each other, and accordingly, the pellet 5100*a* can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 26:
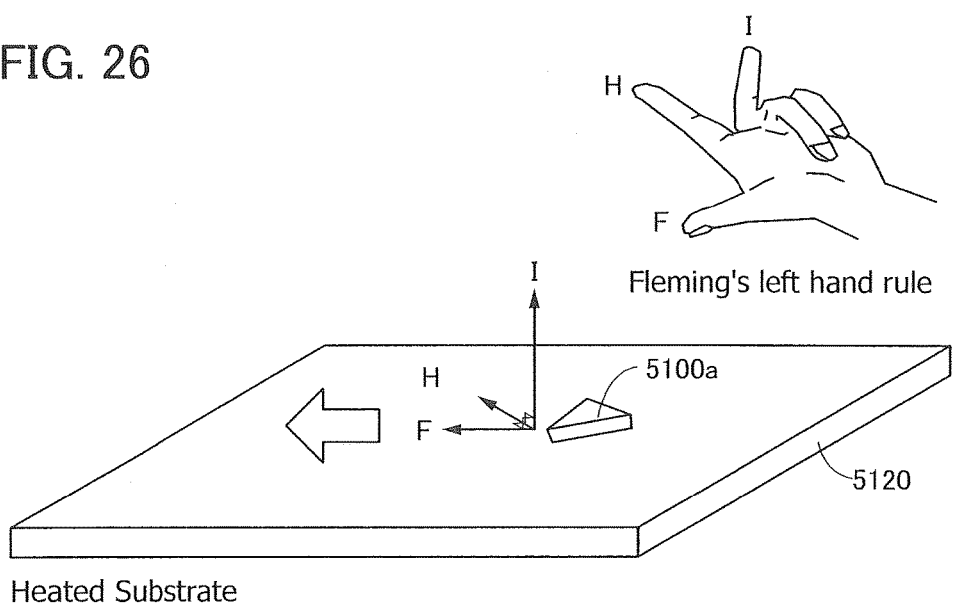
FIG. 26 illustrates force applied to a pellet on a formation surface.

As shown in FIG. 23A, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field is generated in a direction parallel to a top surface of the substrate 5120. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current (see FIG. 26). This is explainable with Fleming's left-hand rule. In order to increase a force applied to the pellet 5100, it is preferable to provide, on the top surface of the substrate 5120, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface of the substrate 5120, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

Figure 27A:
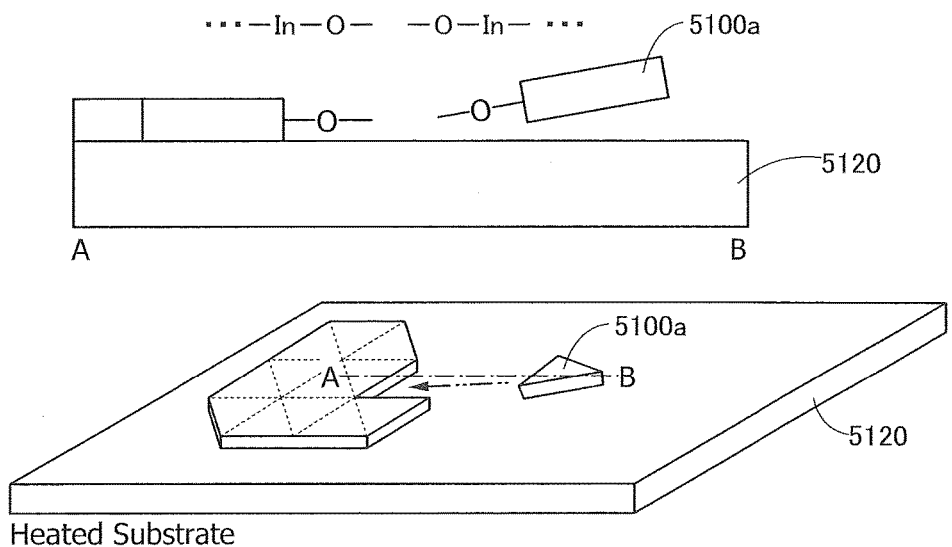
FIGS. 27A and 27B illustrate transfer of pellets on film formation surfaces.
Figure 27B:
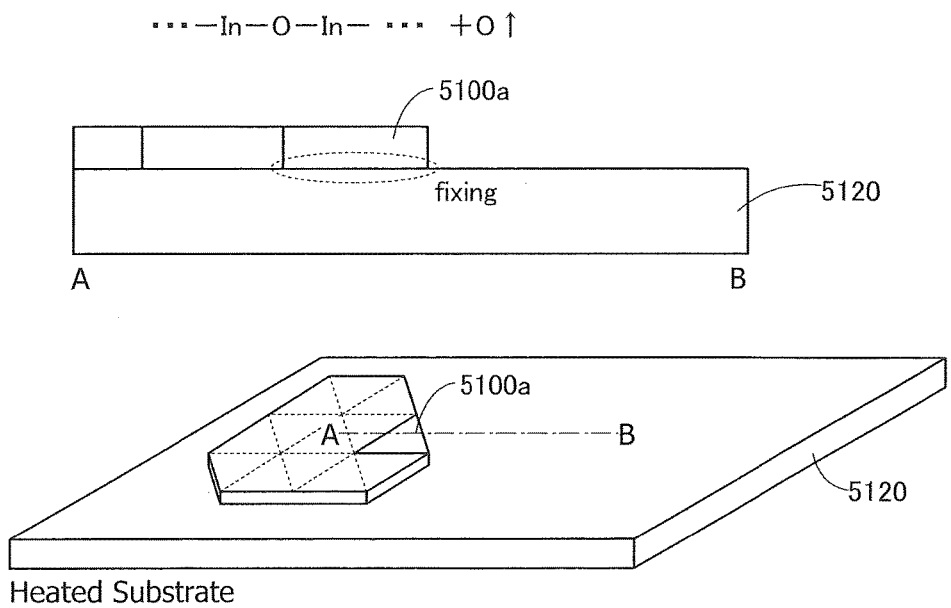

Furthermore, the substrate 5120 is heated, and the resistance such as friction between the pellet 5100 and the substrate 5120 is low. As a result, as illustrated in FIG. 27A, the pellet 5100 glides above the surface of the substrate 5120. The glide of the pellet 5100 is caused in a state where the flat plane faces the substrate 5120. Then, as illustrated in FIG. 27B, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occurs, which is caused by turning the pellet 5100 to be substantially single crystal. Thus, formation of defects such as a grain boundary due to expansion of a space between the pellets 5100 can be prevented, and accordingly, generation of crevasses can be prevented. Furthermore, the space is filled with elastic metal atoms and the like, whereby the elastic metal atoms have a function, like a highway, of jointing side surfaces of the pellets 5100 which are not aligned with each other.

It is considered that as shown in such a model, the pellets 5100 are deposited on the substrate 5120. Thus, a CAAC-OS film can be deposited even when a surface over which a film is formed (film formation surface) does not have a crystal structure, which is different from film deposition by epitaxial growth. For example, even when a surface (film formation surface) of the substrate 5120 has an amorphous structure, a CAAC-OS film can be formed.

Figure 23B:
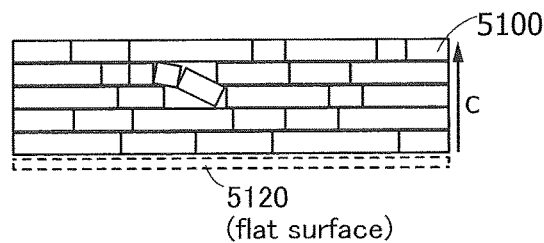

Furthermore, it is found that in formation of the CAAC-OS, the pellets 5100 are arranged in accordance with a surface shape of the substrate 5120 that is the film formation surface even when the film formation surface has unevenness besides a flat surface. For example, in the case where the top surface of the substrate 5120 is flat at the atomic level, the pellets 5100 are arranged so that flat planes parallel to the a-b plane face downwards; thus a layer with a uniform thickness, flatness, and crystallinity is formed. By stacking n layers (n is a natural number), the CAAC-OS can be obtained (see FIG. 23B).

Figure 23C:
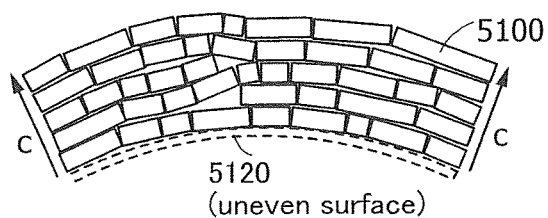

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be formed (see FIG. 23C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that when the sputtered particles have a dice shape with a large thickness, planes facing the substrate 5120 vary, which may lead to formation of a film whose thickness or crystal alignment is not uniformed.

According to the deposition model described above, a CAAC-OS with high crystallinity can be formed even on a film formation surface with an amorphous structure.

Furthermore, formation of a CAAC-OS can be described with a deposition model including a zinc oxide particle besides the pellet 5100.

The zinc oxide particle reaches the substrate 5120 before the pellet 5100 does because the zinc oxide particle is smaller than the pellet 5100 in mass. On the surface of the substrate 5120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 5120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

An nc-OS can be understood with a deposition model illustrated in FIG. 24. Note that a difference between FIG. 24 and FIG. 23A lies only in the fact that whether the substrate 5120 is heated or not.

Thus, the substrate 5120 is not heated, and a resistance such as friction between the pellet 5100 and the substrate 5120 is high. As a result, the pellets 5100 cannot glide on the surface of the substrate 5120 and are stacked randomly, thereby forming an nc-OS.

<Cleavage Plane>

A cleavage plane that has been mentioned in the deposition model of the CAAC-OS will be described below.

Figure 28A:
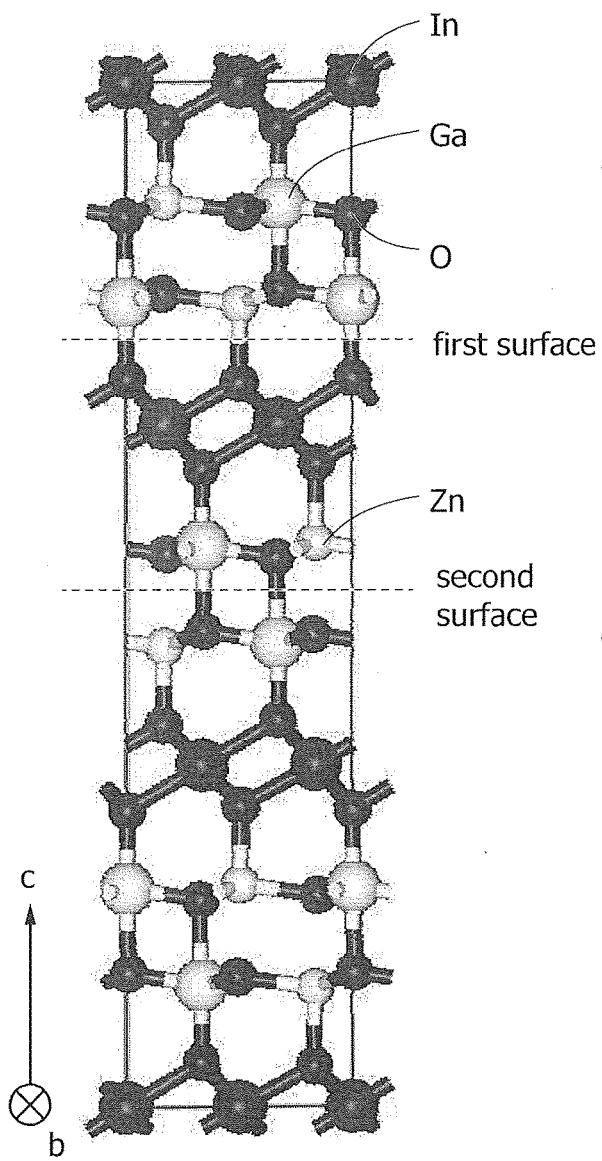
FIGS. 28A and 28B show an $InGaZnO_4$ crystal.
Figure 28B:
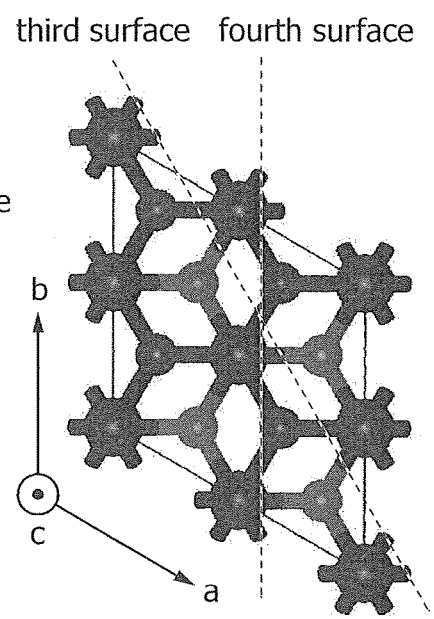

First, a cleavage plane of the target will be described with reference to FIGS. 28A and 28B. FIGS. 28A and 28B show a structure of an InGaZnO$_4$ crystal. Note that FIG. 28A shows a structure in the case where the InGaZnO$_4$ crystal is observed from a direction parallel to the b-axis when the c-axis is in an upward direction. Furthermore, FIG. 28B shows a structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Furthermore, GGA/PBE is used as the functional. Cut-off energy is 400 eV.

Energy of a structure in an initial state is obtained after structural optimization including a cell size is performed. Furthermore, energy of a structure after the cleavage at each plane is obtained after structural optimization of atomic arrangement is performed in a state where the cell size is fixed.

On the basis of the structure of the InGaZnO$_4$ crystal in FIGS. 28A and 28B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 28A). The second plane is a crystal plane between a Ga—Zn—O layer and a Ga—Zn—O layer and is parallel to the (001) plane (or the a-b plane) (see FIG. 28A). The third plane is a crystal plane parallel to the (110) plane (see FIG. 28B). The fourth plane is a crystal plane parallel to the (100) plane (or the b-c plane) (see FIG. 28B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 3).

TABLE 3

|  | Cleavage energy [J/m$^2$] |
| --- | --- |
| First plane | 2.60 |
| Second plane | 0.68 |
| Third plane | 2.18 |
| Fourth plane | 2.12 |

From the calculations, in the structure of the InGaZnO$_4$ crystal shown in FIGS. 28A and 28B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 28A can be separated at two planes equivalent to the second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 29A:
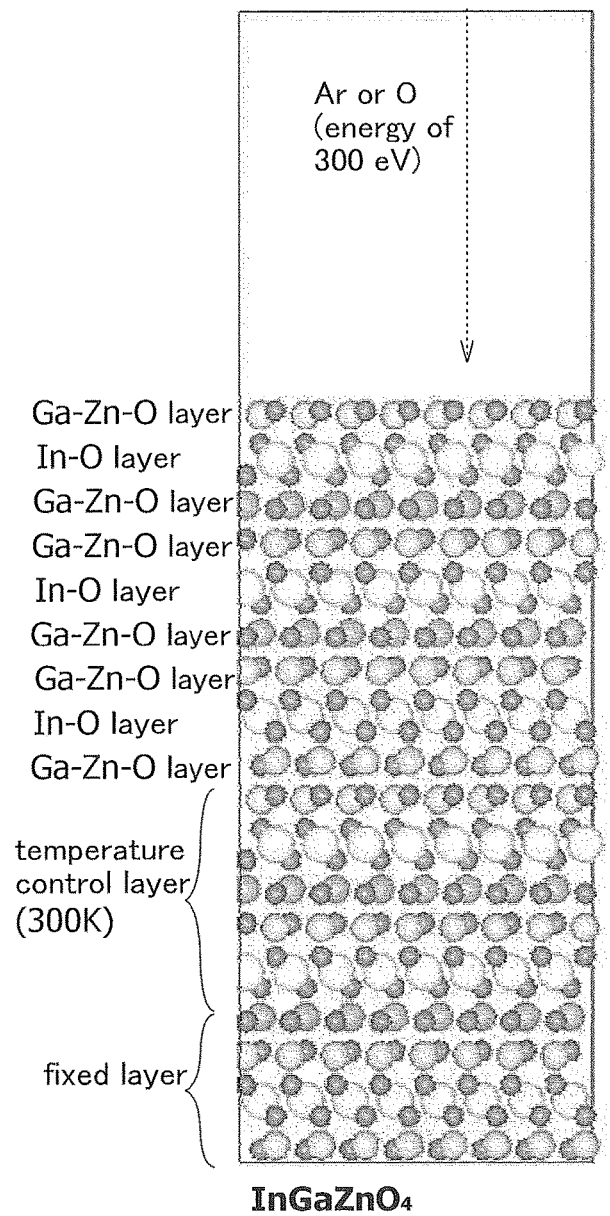
Figure 29B:
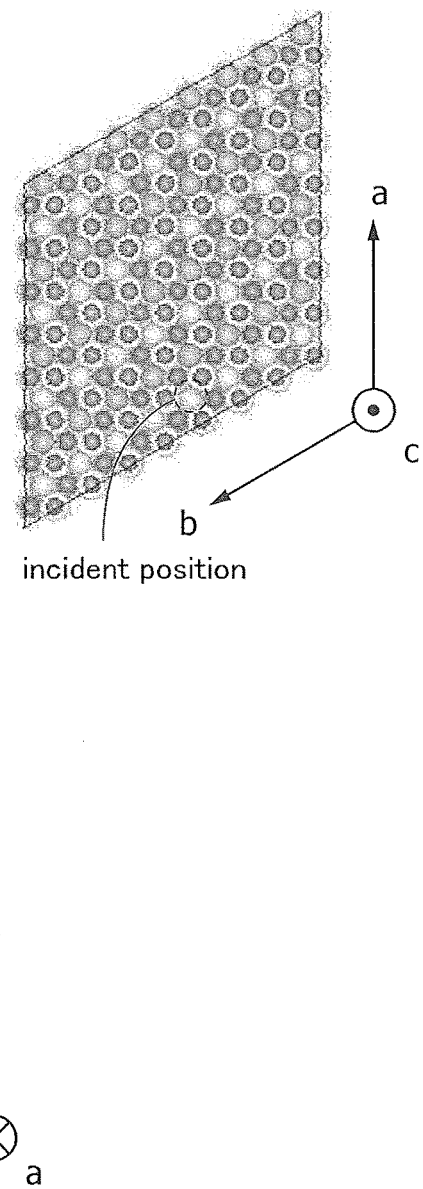

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 29A shows a cross-sectional structure of an InGaZnO$_4$ crystal (2688 atoms) used for the calculation, and FIG. 29B shows a top structure thereof. Note that a fixed layer in FIG. 29A is a layer which prevents the positions of the atoms from moving. A temperature control layer in FIG. 29A is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

FIG. 30A shows an atomic arrangement when 99.9 picoseconds have passed after argon enters the cell including the InGaZnO$_4$ crystal shown in FIGS. 29A and 29B. FIG. 30B shows atomic arrangement when 99.9 picoseconds have passed after oxygen enters the cell. Note that in FIGS. 30A and 30B, part of the fixed layer in FIG. 29A is omitted.

According to FIG. 30A, in a period from entry of argon into the cell to when 99.9 picoseconds have passed, a crack is formed from the cleavage plane corresponding to the second plane shown in FIG. 28A. Thus, in the case where argon collides with the InGaZnO$_4$ crystal and the uppermost surface is the second plane (the zero-th), a large crack is found to be formed in the second plane (the second).

On the other hand, according to FIG. 30B, in a period from entry of oxygen into the cell to when 99.9 picoseconds have passed, a crack is found to be formed from the cleavage plane corresponding to the second plane shown in FIG. 28A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 31A:
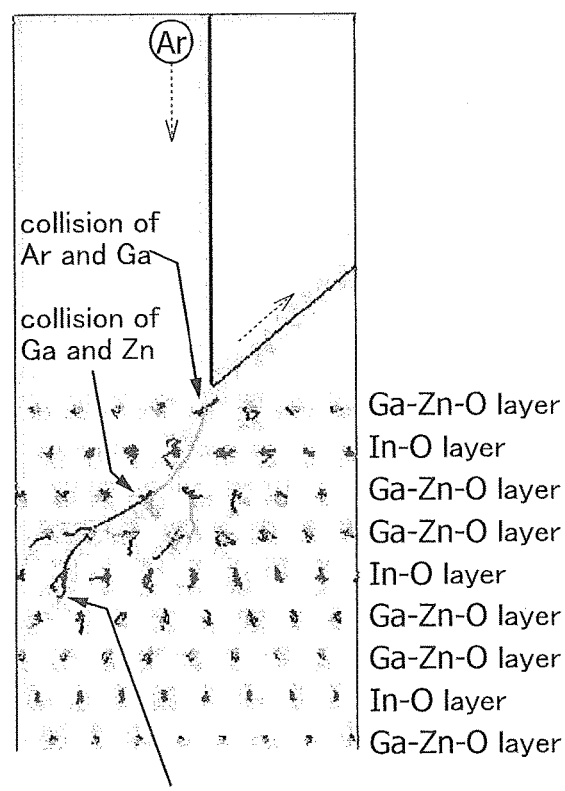
FIGS. 31A and 31B show trajectories of atoms after collision of atoms.

FIG. 31A shows trajectories of the atoms from 0 picosecond to 0.3 picoseconds after argon enters the cell including the InGaZnO$_4$ crystal shown in FIGS. 29A and 29B. Accordingly, FIG. 31A corresponds to a period from FIGS. 29A and 29B to FIG. 30A.

According to FIG. 31A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 29A.

Figure 31B:
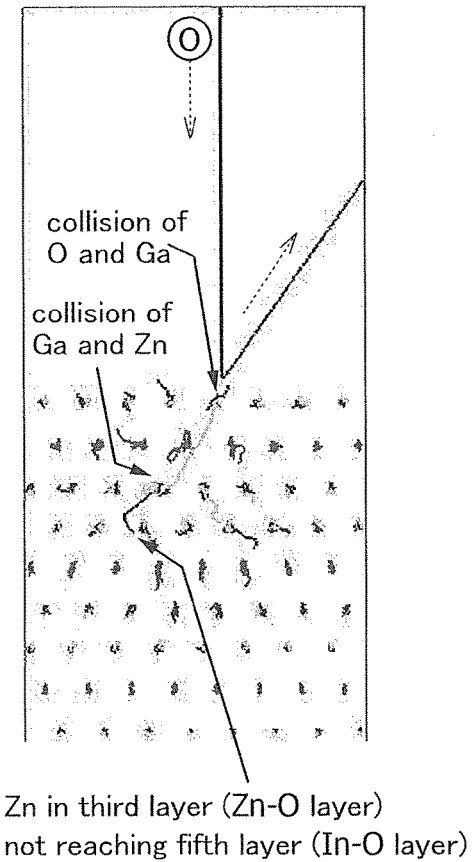

FIG. 31B shows trajectories of the atoms from 0 picosecond to 0.3 picoseconds after oxygen enters the cell including the InGaZnO$_4$ crystal shown in FIGS. 29A and 29B. Accordingly, FIG. 31B corresponds to a period from FIGS. 29A and 29B to FIG. 30A.

On the other hand, according to FIG. 31B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 29A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by Formula 4 and Formula 5 below. Here, E represents energy of argon or oxygen before collision (300 eV), $m_A$ represents mass of argon or oxygen, $V_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2} m_A v_A^2 + \frac{1}{2} m_{Ga} v_{Ga}^2 \qquad \text{[Formula 4]}$$

$$m_A v_A + m_{Ga} v_{Ga} = m_A v'_A + m_{Ga} v'_{Ga} \qquad \text{[Formula 5]}$$

On the assumption that collision of argon or oxygen is elastic collision, the relationship among $v_A$, $v'_A$, $v_{Ga}$, and $v'_{Ga}$ can be represented by Formula 6 below.

$$v'_A - v'_{Ga} = -(v_A - v_{Ga}) \qquad \text{[Formula 6]}$$

From Formulae 4, 5, and 6, when $v_{Ga}$ is 0, the speed of gallium $v'_{Ga}$ after collision of argon or oxygen can be represented by Formula 7 below.

$$v'_{Ga} = \frac{\sqrt{m_A}}{m_A + m_{Ga}} \cdot 2\sqrt{2E} \qquad \text{[Formula 7]}$$

In Formula 7, mass of argon or oxygen is substituted into $m_A$, whereby the speeds of gallium after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 23A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 32A:
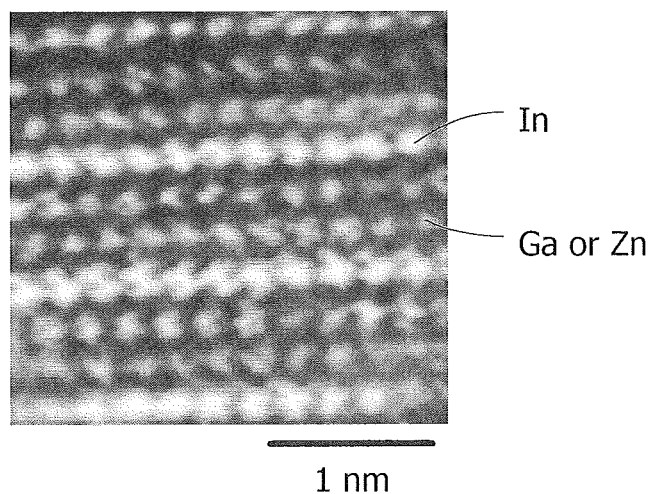
FIGS. 32A and 32B are cross-sectional HAADF-STEM images of a CAAC-OS film and a target.
Figure 32B:
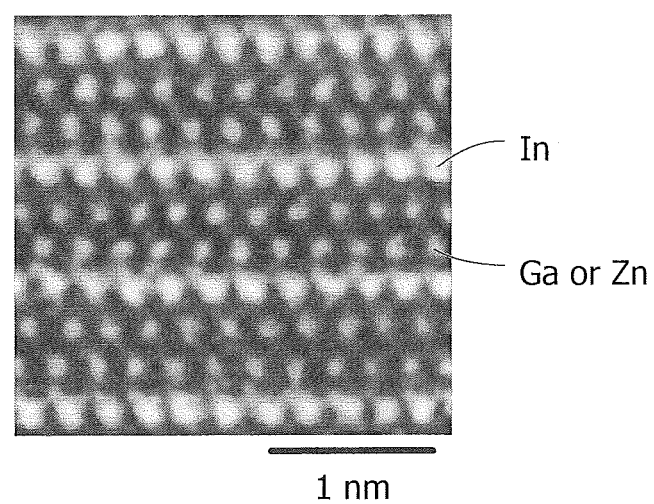

FIGS. 32A and 32B show atomic arrangement of cross sections of an In—Ga—Zn oxide (see FIG. 32A) that is a CAAC-OS deposited by sputtering and a target thereof (see FIG. 32B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 32A and FIG. 32B are compared, it is found that the CAAC-OS and the target each have a homologous structure and arrangements of atoms in the CAAC-OS correspond to those in the target. Thus, as illustrated in the deposition model in FIG. 23A, the crystal structure of the target is transferred, so that a CAAC-OS is deposited.

Note that the structures, methods, and the like described in this embodiment can be used as appropriate in combination with any of the structures, methods, and the like described in the other embodiments.

Embodiment 8

In this embodiment, a structure of an input/output device of one embodiment of the present invention will be described with reference to FIGS. 33A to 33C and FIGS. 34A to 34C. Note that an input/output device can also be referred to as a touch panel.

FIGS. 33A to 33C are projection drawings illustrating a structure of an input/output device of one embodiment of the present invention.

FIG. 33A is a projection drawing of an input/output device 500 of one embodiment of the present invention, and FIG. 33B is a projection drawing illustrating a structure of a sensor unit 10U included in the input/output device 500.

Figure 34A:
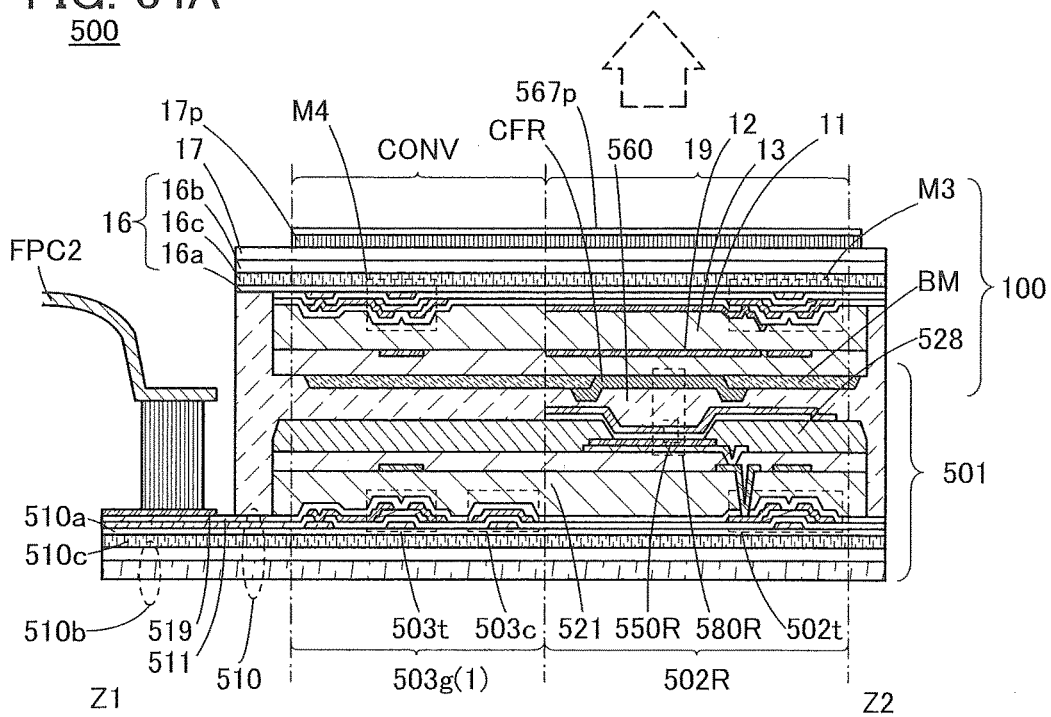
FIGS. 34A to 34C are cross-sectional views illustrating input/output devices of embodiments.
Figure 34B:
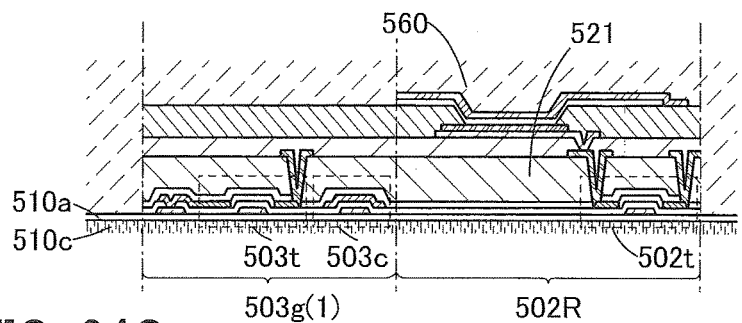
Figure 34C:
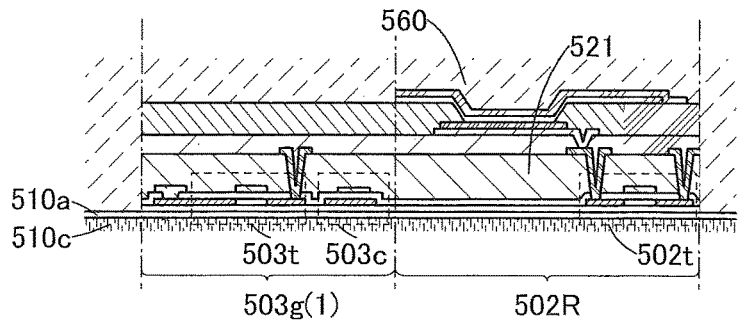

FIGS. 34A to 34C are cross-sectional views illustrating a structure of the input/output device 500 of one embodiment of the present invention.

FIG. 34A is a cross-sectional view taken along line Z1-Z2 of the input/output device 500 of one embodiment of the present invention in FIGS. 33A to 33C.

<Structure Example of Input/Output Device>

The input/output device 500 described in this embodiment includes a flexible input device 100 and a display portion 501. The flexible input device 100 includes a plurality of sensor units 10U arranged in matrix and each provided with window portions 14 transmitting visible light, a scan line G1 electrically connected to a plurality of sensor units 10U placed in the row direction (indicated by arrow R in the drawing), a signal line DL electrically connected to a plurality of sensor units 10U placed in the column direction (indicated by arrow C in the drawing), and a flexible first base material 16 supporting the sensor unit 10U, the scan line G1, and the signal line DL. The display portion 501 includes a plurality of pixels 502 overlapping with the window portions 14 and arranged in matrix and a flexible second base material 510 supporting the pixels 502 (see FIGS. 33A to 33C).

The sensor unit 10U includes a sensor element C overlapping with the window portion 14 and a sensor circuit 19 electrically connected to the sensor element C (see FIG. 33B).

The sensor element C includes an insulating layer 13, and a first electrode 11 and a second electrode 12 between which the insulating layer 13 is sandwiched (see FIG. 34A).

A selection signal is supplied to the sensor circuit 19, and the sensor circuit 19 supplies a sensor signal DATA based on the change in capacitance of the sensor element C.

The scan line G1 can supply the selection signal, the signal line DL can supply the sensor signal DATA, and the sensor circuit 19 is placed to overlap with gaps between the plurality of window portions 14.

In addition, the input/output device 500 described in this embodiment includes a coloring film between the sensor unit 10U and the pixel 502 overlapping with the window portion 14 of the sensor unit 10U.

The input/output device 500 described in this embodiment includes the flexible input device 100 including the plurality of sensor units 10U, each of which is provided with the window portions 14 transmitting visible light, and the flexible display portion 501 including the plurality of pixels 502 overlapping with the window portions 14. The coloring film is included between the window portion 14 and the pixel 502.

With such a structure, the input/output device can supply a sensor signal based on the change in the capacitance and positional information of the sensor unit supplying the sensor signal, can display image data relating to the positional information of the sensor unit, and can be bent. As a result, a novel input/output device with high convenience or high reliability can be provided.

The input/output device 500 may include a flexible substrate FPC 1 to which a signal from the flexible input device 100 is supplied and/or a flexible substrate FPC 2 supplying a signal including image data to the display portion 501.

In addition, a protective layer 17p protecting the input/output device 500 by preventing damage and/or an anti-reflective film 56'7p that weakens the intensity of external light reflected by the input/output device 500 may be included.

Moreover, the input/output device 500 includes a scan line driver circuit 503g which supplies the selection signal to a scan line of the display portion 501, a wiring 511 supplying a signal, and a terminal 519 electrically connected to the flexible substrate FPC 2.

Components of the input/output device 500 will be described below. Note that these components cannot be clearly distinguished and one component also serves as another component or include part of another component in some cases.

For example, the flexible input device 100 including the coloring film overlapping with the plurality of window portions 14 also serves as a color filter.

Furthermore, for example, the input/output device 500 in which the flexible input device 100 overlaps with the display portion 501 serves as the flexible input device 100 as well as the display portion 501.

<Whole Structure>

The input/output device 500 includes the flexible input device 100 and the display portion 501 (see FIG. 33A).

<Flexible Input Device 100>

The flexible input device 100 includes the plurality of sensor units 10U and the flexible base material 16 supporting the sensor units. For example, the plurality of sensor units 10U is arranged in matrix with 40 rows and 15 columns on the flexible base material 16.

<Window Portion 14, Coloring Film, and Light-Blocking Film BM>

The window portion 14 transmits visible light.

A coloring film transmitting light of a predetermined color is provided to overlap with the window portion 14. For example, a coloring film CFB transmitting blue light, a coloring film CFG, or a coloring film CFR is included (see FIG. 33B).

Note that, in addition to the coloring films transmitting blue light, green light, and/or red light, coloring films transmitting light of various colors such as a coloring film transmitting white light and a coloring film transmitting yellow light can be included.

For a coloring film, a metal material, a pigment, dye, or the like can be used.

A light-blocking film BM is provided to surround the window portions 14. The light-blocking film BM does not easily transmit light as compared to the window portion 14.

For the light-blocking film BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 19 are provided to overlap with the light-blocking film BM.

Note that a light-transmitting overcoat layer covering the coloring film and the light-blocking film BM can be provided.

<Sensor Element C>

The sensor element C includes the first electrode 11, the second electrode 12, and the insulating layer 13 between the first electrode 11 and the second electrode 12 (see FIG. 34A).

The first electrode 11 is formed apart from other regions, for example, is formed into an island shape. A layer that can be formed in the same process as that of the first electrode 11 is preferably placed close to the first electrode 11 so that the user of the input/output device 500 does not recognize the first electrode 11. Further preferably, the number of the window portions 14 placed in the gap between the first electrode 11 and the layer placed close to the first electrode 11 is reduced as much as possible. In particular, the window portion 14 is preferably not placed in the gap.

The second electrode 12 is provided to overlap with the first electrode 11, and the insulating layer 13 is provided between the first electrode 11 and the second electrode 12.

When an object whose dielectric constant is different from that of the air gets closer to the first electrode 11 or the second electrode 12 of the sensor element C that is put in the air, the capacitance of the sensor element C is changed. Specifically, when a finger or the like gets closer to the sensor element C, the capacitance of the sensor element C is changed. Thus, the sensor element C can be used in a proximity sensor.

The capacitance of the sensor element C that can be changed in shape, for example, is changed depending on the change in shape.

Specifically, when a finger or the like is in contact with the sensor element C, and the gap between the first electrode 11 and the second electrode 12 becomes small, the capacitance of the sensor element C is increased. Accordingly, the sensor element C can be used in a tactile sensor.

Specifically, when the sensor element C is bent, the gap between the first electrode 11 and the second electrode 12 becomes small, whereby the capacitance of the sensor element C is increased. Accordingly, the sensor element C can be used in a bend sensor.

The first electrode 11 and the second electrode 12 include a conductive material.

For example, an inorganic conductive material, an organic conductive material, a metal material, a conductive ceramic material, or the like can be used for the first electrode 11 and the second electrode 12.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used. It is preferable that the first electrode 11 and the second electrode 12 have a thickness that allows light to pass through.

Alternatively, a conductive oxide such as indium oxide, indium tin oxide, indium zinc oxide, zinc oxide, or zinc oxide to which gallium is added can be used.

Alternatively, graphene or graphite can be used. The film including graphene can be formed, for example, by reducing a film containing graphene oxide. As a reducing method, a method with application of heat, a method using a reducing agent, or the like can be employed.

Alternatively, a conductive polymer can be used.

<Sensor Circuit 19>

The sensor circuit 19 includes transistors M1 to M3, for example. In addition, the sensor circuit 19 includes wirings supplying a power supply potential and a signal. For example, the signal line DL, the wiring VPI, a wiring CS, the scan line G1, the wiring RES, and the wiring VRES are included. Note that the specific structure example of the sensor circuit 19 will be described in detail in Embodiment 9.

Note that the sensor circuit 19 may be placed not to overlap with the window portion 14. For example, a wiring is placed not to overlap with the window portion 14, whereby one side of the flexible input device 100 can be visually recognized easily from the other side of the flexible input device 100.

Transistors that can be formed in the same process can be used as the transistors M1 to M3, for example.

The transistor M1 includes a semiconductor film. For example, for the semiconductor film, an element belonging to group 4, a compound semiconductor, or an oxide semiconductor can be used. Specifically, a semiconductor containing silicon, a semiconductor containing gallium arsenide, an oxide semiconductor containing indium, or the like can be used. Any of the transistors described in the above embodiments can be used as the transistor M1 as appropriate.

For the wiring, a conductive material can be used.

For example, an inorganic conductive material, an organic conductive material, a metal material, a conductive ceramic material, or the like can be used for the wiring. Specifically, a material which is the same as those of the first electrode 11 and the second electrode 12 can be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 19 may be formed on the base material 16 by processing a film formed over the base material 16.

Alternatively, the sensor circuit 19 formed on another base material may be transferred to the base material 16.

<Base Material 16>

For the flexible base material 16, an organic material, an inorganic material, or a composite material of an organic material and an inorganic material can be used.

For the base material 16, a material with a thickness of 5 µm or more and 2500 µm or less, preferably 5 µm or more and 680 µm or less, further preferably 5 µm or more and 170 µm or less, further preferably 5 µm or more and 45 µm or less, further preferably 8 µm or more and 25 µm or less can be used.

Furthermore, a material with which passage of impurities is inhibited can be preferably used for the base material 16. For example, materials with a vapor permeability of lower than or equal to $10^{-5}$ g/(m²·day), preferably lower than or equal to $10^{-6}$ g/(m²·day) can be favorably used.

The base material 16 can be favorably formed using a material whose coefficient of linear expansion is substantially equal to that of the base material 510. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

Examples of the material of the base material 16 are organic materials such as a resin, a resin film, and a plastic film.

Another examples of the material of the base material 16 are inorganic materials such as a metal plate and a thin glass plate with a thickness of more than or equal to 10 μm and less than or equal to 50 μm.

Another example of the material of the base material 16 is a composite material such as a resin film to which a metal plate, a thin glass plate, or a film of an inorganic material is attached with the use of a resin film.

Another example of the material of the base material 16 is a composite material such as a resin or a resin film into which a fibrous or particulate metal, glass, or inorganic material is dispersed.

The resin film can be formed using a thermosetting resin or an ultraviolet curable resin.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, silicon oxide, silicon nitride, silicon oxynitride, an alumina film, or the like can be used.

Specifically, SUS, aluminum, or the like in which an opening portion is provided can be used.

Specifically, an acrylic resin, an urethane resin, an epoxy resin, or a resin having a siloxane bond can be used.

For example, a stack in which a flexible base material 16b, a barrier film 16a that prevents diffusion of impurities, and a resin layer 16c attaching the barrier film 16a to the base material 16b are stacked can be preferably used for the base material 16 (see FIG. 34A).

Specifically, a film containing a stacked-layer material of a 600-nm-thick silicon oxynitride film and a 200-nm-thick silicon nitride film can be used as the barrier film 16a.

Alternatively, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the barrier film 16a.

A resin film or resin plate of polyester, polyolefin, polyamide, polyimide, polycarbonate, an acrylic resin, or the like, a stack of two or more of the above materials, or the like can be used as the base material 16b.

For example, materials that contain polyester, polyolefin, polyamide (e.g., nylon or aramid), polyimide, polycarbonate, or a resin having an acrylic bond, an urethane bond, an epoxy bond, or a siloxane bond can be used for the resin film 16c.

<Protective Base Material 17, Protective Film 17p>

A flexible protective base material 17 and/or the protective film 17p can be provided. The flexible protective base material 17 or the protective film 17p protects the flexible input device 100 by preventing damage.

For example, a resin film or resin plate of polyester, polyolefin, polyamide, polyimide, polycarbonate, an acrylic resin, or the like, a stack of two or more of the above materials, or the like can be used as the protective base material 17.

For example, a hard coat layer or a ceramic coat layer can be used as the protective film 17p. Specifically, a layer containing a UV curable resin or aluminum oxide may be formed to overlap with the second electrode.

<Display Portion 501>

The display portion 501 includes the plurality of pixels 502 arranged in matrix (see FIG. 33C).

For example, the pixel 502 includes a sub-pixel 502B, a sub-pixel 502G, and a sub-pixel 502R, and each sub-pixel includes a display element and a pixel circuit for driving the display element.

In the pixel 502, the sub-pixel 502B is placed to overlap with the coloring film CFB, the sub-pixel 502G is placed to overlap with the coloring film CFG, and the sub-pixel 502R is placed to overlap with the coloring film CFR.

In this embodiment, an example of using an organic electroluminescent element that emits white light as a display element will be described; however, the display element is not limited to such element.

For example, organic electroluminescent elements that emit light of different colors may be included in different sub-pixels so that the light of different colors can be emitted from different sub-pixels.

Other than organic electroluminescent elements, any of various display elements such as display elements (electronic ink) that perform display by an electrophoretic method, an electrowetting method, or the like; MEMS shutter display elements; optical interference type MEMS display elements; and liquid crystal elements can be used.

Furthermore, the liquid crystal element can be used in a transmissive liquid crystal display, a transflective liquid crystal display, a reflective liquid crystal display, a direct-view liquid crystal display, or the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. A structure suitable for employed display elements can be selected from among a variety of structures of pixel circuits.

In the display portion, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, a metal insulator metal (MIM), a thin film diode (TFD), or the like can also be used. Since such an element requires the smaller number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Furthermore, since an active element (a non-linear element) is not used, the aperture ratio can be improved, so that power consumption can be reduced or higher luminance can be achieved, for example.

<Base Material 510>

For the base material 510, a flexible material can be used. For example, the material that can be used for the base material 16 can be used for the base material 510.

For example, a stack in which a flexible base material 510b, a barrier film 510a that prevents diffusion of impurities, and a resin film 510c attaching the barrier film 510a to the flexible base material 510b are stacked can be preferably used for the base material 510 (see FIG. 34A).

<Sealant 560>

A sealant 560 bonds the base material 16 to the base material 510. The sealant 560 has a refractive index higher than that of air. In the case where light is extracted to the sealant 560 side, the sealant 560 can reduce the refractive index difference between the sealant 560 and a layer in contact with the sealant 560.

The pixel circuits and the light-emitting elements (e.g., a light-emitting element 550R) are provided between the base material 510 and the base material 16.

<Configuration of Pixel>

The sub-pixel 502R includes a light-emitting module 580R.

The sub-pixel 502R includes the light-emitting element 550R and the pixel circuit that can supply electric power to the light-emitting element 550R and includes a transistor 502t. Furthermore, the light-emitting module 580R includes the light-emitting element 550R and an optical element (e.g., a coloring film CFR).

The light-emitting element 550R includes a lower electrode, an upper electrode, and a layer containing a light-emitting organic compound between the lower electrode and the upper electrode.

The light-emitting module 580R includes the coloring film CFR on the light extraction side. The coloring film transmits light of a particular wavelength and is, for example, a layer that selectively transmits light of red, green, or blue color. Other sub-pixels may be placed to overlap with the window portion in which the coloring film is not provided, whereby light from the light-emitting element will be emitted not through the coloring film.

In the case where the sealant 560 is provided on the light extraction side, the sealant 560 is in contact with the light-emitting element 550R and the coloring film CFR.

The coloring film CFR is positioned in a region overlapping with the light-emitting element 550R. Accordingly, part of light emitted from the light-emitting element 550R passes through the coloring film CFR and is emitted to the outside of the light-emitting module 580R as indicated by an arrow in FIG. 34A.

The light-blocking layer BM is provided to surround the coloring film (e.g., the coloring film CFR).

<Configuration of Pixel Circuit>

An insulating film 521 covering the transistor 502t included in the pixel circuit is provided. The insulating film 521 can be used as a film for planarizing unevenness caused by the pixel circuits. A stacked film including a layer that can prevent diffusion of impurities can be used as the insulating film 521. This can prevent the reliability of the transistor 502t or the like from being lowered by diffusion of impurities.

The lower electrode is placed over the insulating film 521, and a partition wall 528 is provided over the insulating film 521 to cover an end portion of the lower electrode.

A layer containing a light-emitting organic compound is sandwiched between the lower electrode and the upper electrode, whereby a light-emitting element (e.g., the light-emitting element 550R) is formed. The pixel circuit supplies power to the light-emitting element.

Over the partition wall 528, a spacer that controls the gap between the base material 16 and the base material 510 is provided.

<Structure of Scan Line Driver Circuit>

A scan line driver circuit 503g(1) includes a transistor 503t and a capacitor 503c. Note that transistors that can be formed in the same process and over the same substrate as those of the pixel circuit can be used in the driver circuit.

<Converter CONV>

Various circuits that can convert the sensor signal DATA supplied from the sensor unit 10U and supply the converted signal to the flexible substrate FPC 1 can be used as a converter CONV (see FIG. 33A and FIG. 34A).

For example, a transistor M4 shown can be used for the converter CONV.

<Other Structure>

The display portion 501 is provided with an anti-reflective film 567p positioned in a region overlapping with pixels. As the anti-reflective film 567p, for example, a circular polarizing plate can be used.

The display portion 501 includes the wirings 511 through which signals can be supplied. The wirings 511 are provided with the terminal 519. Note that the flexible substrate FPC 2 through which a signal such as an image signal or a synchronization signal is supplied is electrically connected to the terminal 519.

Note that a printed wiring board (PWB) may be attached to the flexible substrate FPC 2.

The display portion 501 includes wirings such as scan lines, signal lines, and power supply lines. Any of various conductive films can be used as the wirings.

Specifically, a metal element selected from aluminum, chromium, copper, tantalum, titanium, molybdenum, tungsten, nickel, yttrium, zirconium, silver, and manganese; an alloy including any of the above-described metal elements; an alloy including any of the above-described metal elements in combination; or the like can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Alternatively, a stacked structure in which an alloy film or a nitride film which contains one or more elements selected from titanium, tantalum, tungsten, molybdenum, chromium, neodymium, and scandium is stacked over an aluminum film can be used.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Alternatively, a light-transmitting conductive material including indium oxide, tin oxide, or zinc oxide may be used.

<Modification Example of Display Portion>

Any of various kinds of transistors can be used in the display portion 501.

FIGS. 34A and 34B illustrate a structure of the case where bottom-gate transistors are used in the display portion 501.

For example, a semiconductor film containing an oxide semiconductor, amorphous silicon, or the like can be used in the transistor 502*t* and the transistor 503*t* shown in FIG. 34A.

A structure in the case of using top-gate transistors in the display portion 501 is illustrated in FIG. 34C.

For example, a semiconductor film containing polycrystalline silicon, a single crystal silicon film that is transferred from a single crystal silicon substrate, or the like can be used in the transistor 502*t* and the transistor 503*t* shown in FIG. 34C. Alternatively, any of the transistors described in the above embodiments can be used as the transistor 502*t* and the transistor 503*t*.

This embodiment can be combined with any of the other embodiments in this specification as appropriate.

Embodiment 9

In this embodiment, a configuration and a driving method of the sensor circuit that can be used in the sensor unit of the input/output device of one embodiment of the present invention will be described with reference to FIGS. 35A, 35B1, and 35B2.

FIGS. 35A, 35B1, and 35B2 illustrate a configuration and a driving method of the sensor circuit 19 and the converter CONV of one embodiment of the present invention.

FIG. 35A is a circuit diagram illustrating configurations of the sensor circuit 19 and the converter CONV of one embodiment of the present invention, and FIGS. 35B1 and 35B2 are timing charts illustrating driving methods.

The sensor circuit 19 of one embodiment of the present invention includes the first transistor M1 whose gate is electrically connected to the first electrode 11 of the sensor element C and whose first electrode is electrically connected to the wiring VPI that can supply, for example, a ground potential (see FIG. 35A).

Furthermore, the second transistor M2 whose gate is electrically connected to the scan line G1 that can supply a selection signal, whose first electrode is electrically connected to a second electrode of the first transistor M1, and whose second electrode is electrically connected to the signal line DL that can supply, for example, the sensor signal DATA may be included.

Furthermore, the third transistor M3 whose gate is electrically connected to the wiring RES that can supply a reset signal, whose first electrode is electrically connected to the first electrode 11 of the sensor element C, and whose second electrode is electrically connected to the wiring VRES that can supply, for example, a ground potential may be included.

The capacitance of the sensor element C is changed when an object gets closer to the first electrode 11 or the second electrode 12 or when a gap between the first electrode 11 and the second electrode 12 is changed, for example. Thus, the sensor circuit 19 can supply the sensor signal DATA based on the change in the capacitance of the sensor element C.

Note that a node at which the first electrode 11 of the sensor element C, the gate of the first transistor M1, and the first electrode of the third transistor are electrically connected to each other is referred to as a node A.

The wiring VRES and the wiring VPI each can supply a ground potential, for example, and the wiring VPO and the wiring BR each can supply a high power supply potential, for example.

Furthermore, the wiring RES can supply a reset signal, the scan line G1 can supply a selection signal, and the wiring CS can supply a control signal for controlling the potential of the second electrode 12 of the sensor element.

Furthermore, the signal line DL can supply the sensor signal DATA, and a terminal OUT can supply a signal converted based on the sensor signal DATA.

Any of various circuits that can convert the sensor signal DATA and supply the converted signal to the terminal OUT can be used as the converter CONV. For example, a source follower circuit, a current mirror circuit, or the like may be formed by the electrical connection between the converter CONV and the sensor circuit 19.

Specifically, by using the converter CONV including the transistor M4, a source follower circuit can be formed (see FIG. 35A). Note that a transistor that can be formed in the same process as those of the first transistor M1 to the third transistor M3 may be used as the transistor M4.

The transistors M1 to M3 each include a semiconductor film. For example, for the semiconductor film, an element belonging to group 4, a compound semiconductor, or an oxide semiconductor can be used. Specifically, a semiconductor containing silicon, a semiconductor containing gallium arsenide, an oxide semiconductor containing indium, or the like can be used. In addition, any of the transistors described in the above embodiments can be used as the transistors M1 to M3.

<Driving Method of Sensor Circuit 19>

A driving method of the sensor circuit 19 will be described.

<First Step>

In a first step, a reset signal that turns on and then turns off the third transistor is supplied to the gate, and the potential of the first electrode of the sensor element C is set to a predetermined potential (see a period T1 in FIG. 35B1).

Specifically, the reset signal is supplied from the wiring RES. The third transistor to which the reset signal is supplied sets the potential of the node A to a ground potential, for example (see FIG. 35A).

<Second Step>

In a second step, a selection signal that turns on the second transistor M2 is supplied to the gate of the second transistor M2, and the second electrode of the first transistor is electrically connected to the signal line DL.

Specifically, the selection signal is supplied from the scan line G1. Through the second transistor M2 to which the selection signal is supplied, the second electrode of the first transistor is electrically connected to the signal line DL (see a period T2 in FIG. 35B1).

<Third Step>

In a third step, a control signal is supplied to the second electrode of the sensor element, and a potential changed based on the control signal and the capacitance of the sensor element C is supplied to the gate of the first transistor M1.

Specifically, a rectangular control signal is supplied from the wiring CS. The sensor element C in which the rectangular control signal is supplied to the second electrode 12 increases the potential of the node A based on the capacitance of the sensor element C (see the latter half in the period T2 in FIG. 35B1).

For example, in the case where the sensor element is put in the air, when an object whose dielectric constant is higher than that of the air is placed closer to the second electrode 12 of the sensor element C, the capacitance of the sensor element C is apparently increased.

Thus, the change in the potential of the node A caused by the rectangular control signal becomes smaller than that in the case where an object whose dielectric constant is higher than that of the air is not placed close to the second electrode 12 of the sensor element C (see a solid line in FIG. 35B2).
<Fourth Step>

In a fourth step, a signal obtained by the change in the potential of the gate of the first transistor M1 is supplied to the signal line DL.

For example, a change in current due to the change in the potential of the gate of the first transistor M1 is supplied to the signal line DL.

The converter CONV converts the change in the current flowing through the signal line DL into a change in voltage and supplies the voltage.
<Fifth Step>

In a fifth step, a selection signal for turning off the second transistor is supplied to the gate of the second transistor.

This embodiment can be combined with any of the other embodiments in this specification as appropriate.

Embodiment 10

In this embodiment, electronic devices that can be formed using a semiconductor device of one embodiment of the present invention will be described with reference to FIGS. 36A to 36G.

FIGS. 36A to 36D show electronic devices. These electronic devices can include a housing 600, a display portion 601, a speaker 603, an LED lamp 604, operation keys 605 (including a power switch or an operation switch), a connection terminal 606, a sensor 607 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 608, and the like.

Figure 36A:
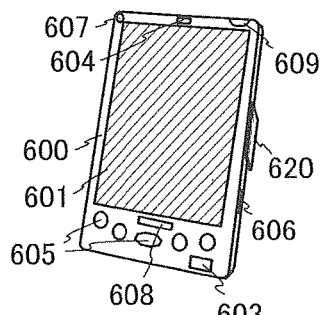
FIGS. 36A to 36G illustrate electronic devices.
Figure 36B:
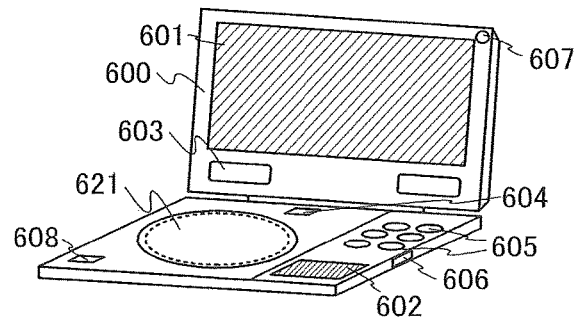
Figure 36C:
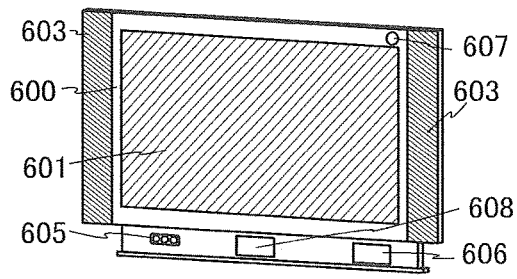
Figure 36D:
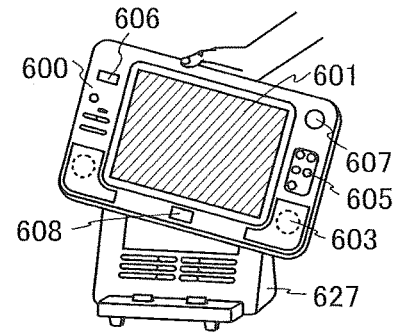

FIG. 36A shows a mobile computer that can include a switch 609, an infrared port 620, and the like in addition to the above components. FIG. 36B shows a portable image reproducing device (e.g., a DVD player) that is provided with a memory medium and can include a second display portion 602, a memory medium reading portion 621, and the like in addition to the above components. FIG. 36C shows a television receiver, which can include a tuner, an image processing portion, and the like in addition to the above components. FIG. 36D shows a portable television receiver that can include a charger 627 capable of transmitting and receiving signals, and the like in addition to the above components.

Figure 36E:
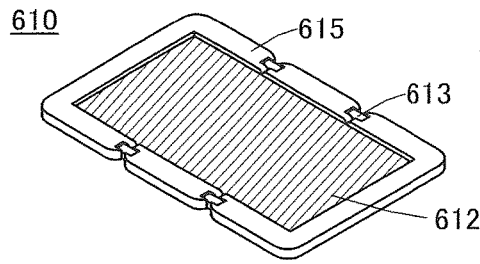
Figure 36F:
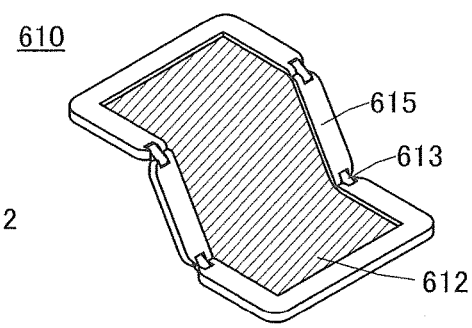
Figure 36G:
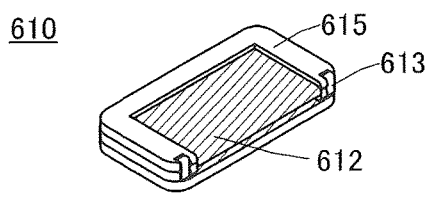

FIGS. 36E to 36G show a foldable portable information terminal 610. FIG. 36E shows the portable information terminal 610 that is opened. FIG. 36F shows the portable information terminal 610 that is being opened or being folded. FIG. 36G shows the portable information terminal 610 that is folded. The portable information terminal 610 is highly portable when folded. When the portable information terminal 610 is opened, a seamless large display region is highly browsable.

A display portion 612 is supported by three housings 615 joined together by hinges 613. By folding the portable information terminal 610 at a connection portion between two housings 615 with the hinges 613, the portable information terminal 610 can be reversibly changed in shape from an opened state to a folded state. A display device according to one embodiment of the present invention can be used for the display portion 612. For example, a display device that can be bent with a radius of curvature of greater than or equal to 1 mm and less than or equal to 150 mm can be used.

The electronic devices shown in FIGS. 36A to 36G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that the electronic devices shown in FIGS. 36A to 36G can have a variety of functions, not limited to the above functions.

Electronic devices described in this embodiment are characterized by having a display portion for displaying some sort of information. Note that the semiconductor device of one embodiment of the present invention can also be used for an electronic device that does not have a display portion.

The structure described in this embodiment can be used in appropriate combination with the structure described in any of the other embodiments.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive films, insulating films, semiconductor films, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<IV). As another example, it is possible to constitute one embodiment of the invention by taking out M layers (M is an integer, where M<IV) from a cross-sectional view in which N layers (N is an integer) are provided. As another example, it is possible to constitute one embodiment of the invention by taking out M elements (M is an integer, where M<N) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-045365 filed with Japan Patent Office on Mar. 7, 2014, the entire contents of which are hereby incorporated by reference.

What is claimed is:

1. A semiconductor device comprising:
   an oxide semiconductor film;
   a gate electrode; and
   a gate insulating film between the oxide semiconductor film and the gate electrode,
   wherein the gate insulating film has a side region that is more on the inside than at least part of a side of the gate electrode.

2. The semiconductor device according to claim 1,
   wherein the oxide semiconductor film comprises a first region, a second region, and a third region,
   wherein the first region is between the second region and the third region, and
   wherein each of the second region and the third region contains an impurity element.

3. The semiconductor device according to claim 2,
   wherein each of the second region and the third region has a region in contact with an insulating film containing hydrogen.

4. The semiconductor device according to claim 3,
   wherein the insulating film containing hydrogen further contains nitrogen.

5. The semiconductor device according to claim 3,
   wherein the insulating film containing hydrogen is a silicon nitride film.

6. The semiconductor device according to claim 2,
   wherein the second region and the third region each have a region with a higher impurity concentration than that in the first region in the oxide semiconductor film.

7. The semiconductor device according to claim 2,
   wherein each of the second region and the third region contains, as the impurity element, one or more of a rare gas, hydrogen, boron, nitrogen, fluorine, aluminum, and phosphorus.

8. The semiconductor device according to claim 2,
   wherein each of the second region and the third region contains, as the impurity element, hydrogen and one or more of a rare gas, boron, nitrogen, fluorine, aluminum, and phosphorus.

9. The semiconductor device according to claim 2,
   wherein the gate electrode contains the same metal element as that in the oxide semiconductor film.

10. The semiconductor device according to claim 9,
    wherein the gate electrode comprises a conductive oxide semiconductor film.

11. The semiconductor device according to claim 1,
    wherein the gate insulating film comprises a first insulating film and a second insulating film,
    wherein the first insulating film is in contact with the oxide semiconductor film,
    wherein the first insulating film contains oxygen,
    wherein the second insulating film is in contact with the first insulating film and the gate electrode,
    wherein the second insulating film contains nitrogen, and
    wherein the second insulating film has a side region that is more on the inside than at least part of a side of the gate electrode.

12. The semiconductor device according to claim 2, further comprising an insulating film over the gate electrode,
    wherein the gate electrode has regions overlapping with the second region and the third region in the oxide semiconductor film, with part of the gate insulating film sandwiched therebetween.

13. A semiconductor device comprising:
    an oxide semiconductor film;
    a gate electrode comprising a first conductive film and a second conductive film over the first conductive film; and
    a gate insulating film between the oxide semiconductor film and the gate electrode,
    wherein the gate insulating film has a side region that is more on the inside than at least part of a side of the first conductive film.

14. The semiconductor device according to claim 13,
wherein the oxide semiconductor film comprises a first region, a second region, and a third region,
wherein the first region is between the second region and the third region, and
wherein each of the second region and the third region contains an impurity element.

15. The semiconductor device according to claim 14,
wherein each of the second region and the third region has a region in contact with an insulating film containing hydrogen.

16. The semiconductor device according to claim 15,
wherein the insulating film containing hydrogen further contains nitrogen.

17. The semiconductor device according to claim 15,
wherein the insulating film containing hydrogen is a silicon nitride film.

18. The semiconductor device according to claim 14,
wherein the second region and the third region each have a region with a higher impurity concentration than that in the first region in the oxide semiconductor film.

19. The semiconductor device according to claim 14,
wherein each of the second region and the third region contains, as the impurity element, one or more of a rare gas, hydrogen, boron, nitrogen, fluorine, aluminum, and phosphorus.

20. The semiconductor device according to claim 14,
wherein each of the second region and the third region contains, as the impurity element, hydrogen and one or more of a rare gas, boron, nitrogen, fluorine, aluminum, and phosphorus.

21. The semiconductor device according to claim 14,
wherein the gate electrode contains the same metal element as that in the oxide semiconductor film.

22. The semiconductor device according to claim 21,
wherein the gate electrode comprises a conductive oxide semiconductor film.

23. The semiconductor device according to claim 14,
further comprising an insulating film over the gate electrode,
wherein the gate electrode has regions overlapping with the second region and the third region in the oxide semiconductor film, with part of the gate insulating film sandwiched therebetween.

24. A display device comprising:
the semiconductor device according to claim 1; and
a pixel electrode electrically connected to the semiconductor device.

25. An input/output device comprising:
the semiconductor device according to claim 1; and
an input device electrically connected to the semiconductor device.

26. An electronic device comprising:
the semiconductor device according to claim 1; and
a speaker or an operation key.

27. A display device comprising:
the semiconductor device according to claim 13; and
a pixel electrode electrically connected to the semiconductor device.

28. An input/output device comprising:
the semiconductor device according to claim 13; and
an input device electrically connected to the semiconductor device.

29. An electronic device comprising:
the semiconductor device according to claim 13; and
a speaker or an operation key.

* * * * *